US012677573B2

(12) United States Patent
Jinbo et al.

(10) Patent No.: US 12,677,573 B2
(45) Date of Patent: Jul. 7, 2026

(54) DISPLAY APPARATUS, DISPLAY MODULE, ELECTRONIC DEVICE, AND METHOD FOR FABRICATING DISPLAY APPARATUS

(71) Applicant: SEMICONDUCTOR ENERGY LABORATORY CO., LTD., Atsugi (JP)

(72) Inventors: Yasuhiro Jinbo, Isehara (JP); Toshikazu Ohno, Atsugi (JP); Shiyuu Numata, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 433 days.

(21) Appl. No.: 18/555,903

(22) PCT Filed: Apr. 12, 2022

(86) PCT No.: PCT/IB2022/053400
§ 371 (c)(1),
(2) Date: Oct. 18, 2023

(87) PCT Pub. No.: WO2022/224080
PCT Pub. Date: Oct. 27, 2022

(65) Prior Publication Data
US 2024/0224734 A1    Jul. 4, 2024

(30) Foreign Application Priority Data
Apr. 23, 2021    (JP) .................................. 2021-073149

(51) Int. Cl.
*H10K 59/80* (2023.01)
*H10K 50/00* (2023.01)
(Continued)

(52) U.S. Cl.
CPC ........... *H10K 59/874* (2023.02); *H10K 50/00* (2023.02); *H10K 50/19* (2023.02); *H10K 59/00* (2023.02);
(Continued)

(58) Field of Classification Search
CPC ...... H10K 59/874; H10K 50/00; H10K 50/19; H10K 59/00; H10K 71/60; H10K 50/10;
(Continued)

(56) References Cited

U.S. PATENT DOCUMENTS

| | | | |
|---|---|---|---|
| 5,953,985 A | 9/1999 | Kobayashi | |
| 6,120,338 A | 9/2000 | Hirano et al. | |

(Continued)

FOREIGN PATENT DOCUMENTS

| | | | |
|---|---|---|---|
| CN | 001653855 A | 8/2005 | |
| CN | 102293052 A | 12/2011 | |

(Continued)

OTHER PUBLICATIONS

International Search Report (Application No. PCT/IB2022/053400) Dated Jul. 19, 2022.

(Continued)

*Primary Examiner* — Fernando L Toledo
*Assistant Examiner* — Shawn Shaw Muslim
(74) *Attorney, Agent, or Firm* — Fish & Richardson P.C.

(57) ABSTRACT

A highly reliable display apparatus is provided. The display apparatus includes a first light-emitting device, a second light-emitting device, and an inorganic insulating layer. The first light-emitting device includes a first pixel electrode, a first light-emitting layer over the first pixel electrode, and a common electrode over the first light-emitting layer. The second light-emitting device includes a second pixel elec-trode, a second light-emitting layer over the second pixel electrode, and the common electrode over the second light- (Continued)

emitting layer. The inorganic insulating layer covers side surfaces of the first pixel electrode, the second pixel electrode, the first light-emitting layer, and the second light-emitting layer. The hydrogen concentration and the carbon concentration in the inorganic insulating layer are each preferably sufficiently low.

13 Claims, 33 Drawing Sheets

(51) Int. Cl.
| | | |
|---|---|---|
| *H10K 50/19* | (2023.01) | |
| *H10K 59/00* | (2023.01) | |
| *H10K 71/60* | (2023.01) | |
| *H10K 50/10* | (2023.01) | |

(52) U.S. Cl.
CPC ............. *H10K 71/60* (2023.02); *H10K 50/10* (2023.02); *H10K 59/871* (2023.02); *H10K 59/873* (2023.02)

(58) Field of Classification Search
CPC .. H10K 59/871; H10K 59/873; H10K 59/122; H10K 50/15; H10K 50/16; H10K 50/17; H10K 50/18; H10K 59/1201; H10K 59/35; H10K 59/38; H10K 59/8051; H10K 59/8052; H10K 71/40; G02B 5/20; G09F 9/00; G09F 9/30; H05B 33/04; H05B 33/10; H05B 33/12; H05B 33/22; H05B 33/26; H05B 33/28
See application file for complete search history.

(56) References Cited

U.S. PATENT DOCUMENTS

| | | | |
|---|---|---|---|
| 7,399,991 | B2 | 7/2008 | Seo et al. |
| 7,534,557 | B2 | 5/2009 | Tachikawa et al. |
| 7,914,976 | B2 | 3/2011 | Tachikawa et al. |
| 8,823,254 | B2 | 9/2014 | Ohta et al. |
| 8,829,509 | B2 | 9/2014 | Nakatani |
| 8,890,127 | B2 | 11/2014 | Yamazaki et al. |
| 8,963,170 | B2 | 2/2015 | Yokoyama et al. |
| 9,029,848 | B2 | 5/2015 | Hatakeyama et al. |
| 9,478,593 | B2 | 10/2016 | Yamazaki et al. |
| 11,302,898 | B2 | 4/2022 | Nakamura et al. |
| 11,678,550 | B2 | 6/2023 | Kato |
| 11,805,674 | B2 | 10/2023 | Nakamura et al. |
| 12,096,671 | B2 | 9/2024 | Kato |
| 2002/0072139 | A1 | 6/2002 | Kashiwabara |
| 2005/0153058 | A1 | 7/2005 | Tachikawa et al. |
| 2011/0148290 | A1 | 6/2011 | Oota |
| 2012/0218173 | A1 | 8/2012 | Ohta et al. |
| 2012/0256204 | A1 | 10/2012 | Yoshizumi et al. |
| 2012/0273804 | A1 | 11/2012 | Hatano |
| 2012/0276484 | A1 | 11/2012 | Izumi et al. |
| 2013/0084531 | A1 | 4/2013 | Hamaguchi et al. |
| 2013/0084664 | A1 | 4/2013 | Yoshitoku et al. |
| 2013/0084666 | A1 | 4/2013 | Oshige |
| 2013/0112955 | A1 | 5/2013 | Yamazaki et al. |
| 2013/0280839 | A1 | 10/2013 | Sonoda et al. |
| 2013/0295705 | A1 | 11/2013 | Sonoda et al. |
| 2014/0004640 | A1 | 1/2014 | Hamaguchi et al. |
| 2014/0004642 | A1 | 1/2014 | Otsuka et al. |
| 2015/0060826 | A1 | 3/2015 | Matsumoto et al. |
| 2015/0069360 | A1 | 3/2015 | Sato |
| 2015/0076476 | A1 | 3/2015 | Odaka et al. |
| 2016/0172595 | A1 | 6/2016 | Malinowski et al. |
| 2016/0315133 | A1 | 10/2016 | Sato |
| 2017/0141167 | A1 | 5/2017 | Naganuma |
| 2017/0148860 | A1 | 5/2017 | Park et al. |
| 2017/0256754 | A1 | 9/2017 | Defranco et al. |
| 2018/0006259 | A1 | 1/2018 | Paek et al. |
| 2018/0190908 | A1 | 7/2018 | Ke et al. |
| 2018/0261798 | A1 | 9/2018 | Choi et al. |
| 2019/0181368 | A1 | 6/2019 | Kim et al. |
| 2019/0245021 | A1 | 8/2019 | Kim et al. |
| 2019/0288226 | A1 | 9/2019 | Li et al. |
| 2020/0057330 | A1 | 2/2020 | Yamazaki et al. |
| 2020/0203662 | A1 | 6/2020 | Mollard et al. |
| 2020/0212336 | A1 | 7/2020 | Heo et al. |
| 2021/0159461 | A1 | 5/2021 | Nakamura et al. |
| 2024/0065021 | A1* | 2/2024 | Ueda .................... H10K 59/351 |
| 2025/0008802 | A1 | 1/2025 | Kato |

FOREIGN PATENT DOCUMENTS

| | | |
|---|---|---|
| CN | 103094487 A | 5/2013 |
| CN | 103311449 A | 9/2013 |
| CN | 109967763 A | 7/2019 |
| CN | 111033602 A | 4/2020 |
| JP | 2000-036385 A | 2/2000 |
| JP | 2001-249627 A | 9/2001 |
| JP | 2003-059663 A | 2/2003 |
| JP | 2003-332051 A | 11/2003 |
| JP | 2006-252988 A | 9/2006 |
| JP | 2008-098106 A | 4/2008 |
| JP | 2008-147072 A | 6/2008 |
| JP | 2008-251270 A | 10/2008 |
| JP | 2010-033936 A | 2/2010 |
| JP | 2012-174356 A | 9/2012 |
| JP | 2013-118179 A | 6/2013 |
| JP | 2014-120218 A | 6/2014 |
| JP | 2014-135251 A | 7/2014 |
| JP | 2014-232568 A | 12/2014 |
| JP | 2015-115178 A | 6/2015 |
| JP | 2016-197494 A | 11/2016 |
| JP | 2019-083086 A | 5/2019 |
| JP | 2019-179696 A | 10/2019 |
| JP | 2020-160305 A | 10/2020 |
| KR | 10-0931279 | 12/2009 |
| KR | 2013-0008660 A | 1/2013 |
| KR | 2013-0049728 A | 5/2013 |
| KR | 2020-0046035 A | 5/2020 |
| TW | 201324896 | 6/2013 |
| TW | 201924107 | 6/2019 |
| WO | WO-2003/096754 | 11/2003 |
| WO | WO-2011/121662 | 10/2011 |
| WO | WO-2018/087625 | 5/2018 |
| WO | WO-2019/038619 | 2/2019 |
| WO | WO-2020/004086 | 1/2020 |

OTHER PUBLICATIONS

Written Opinion (Application No. PCT/IB2022/053400) Dated Jul. 19, 2022.
Zakhidov.A et al., "Orthogonal processing: A new strategy for organic electronics", Chem. Sci. (Chemical Science), Apr. 7, 2011, vol. 2, No. 6, pp. 1178-1182.
Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.
Malinowski.P et al., "Photolithographic patterning of organic photodetectors with a non-fluorinated photoresist system", Organic Electronics, Jul. 12, 2014, vol. 15, No. 10, pp. 2355-2359.
Malinowski.P et al., "Multicolor 1250 ppi OLED Arrays Patterned by Photolithography", SID Digest '16 : SID International Symposium Digest of Technical Papers, May 22, 2016, vol. 47, No. 1, pp. 1009-1012.
Papadopoulos.N et al., "AMOLED Displays with In-Pixel Photodetector", Liquid Crystals and Display Technology, Jul. 9, 2020, pp. 1-19.
Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.
Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

(56) References Cited

OTHER PUBLICATIONS

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

* cited by examiner

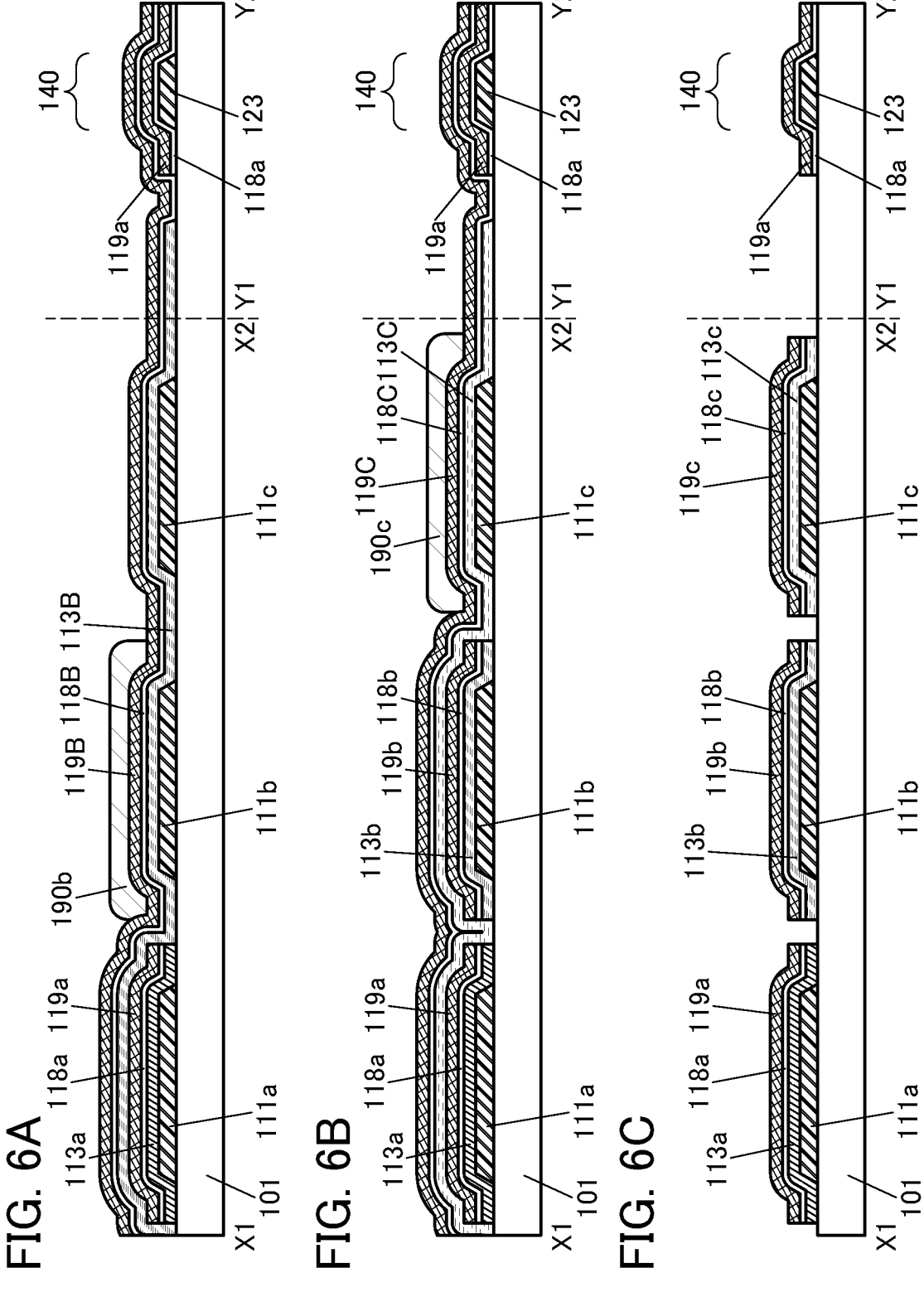

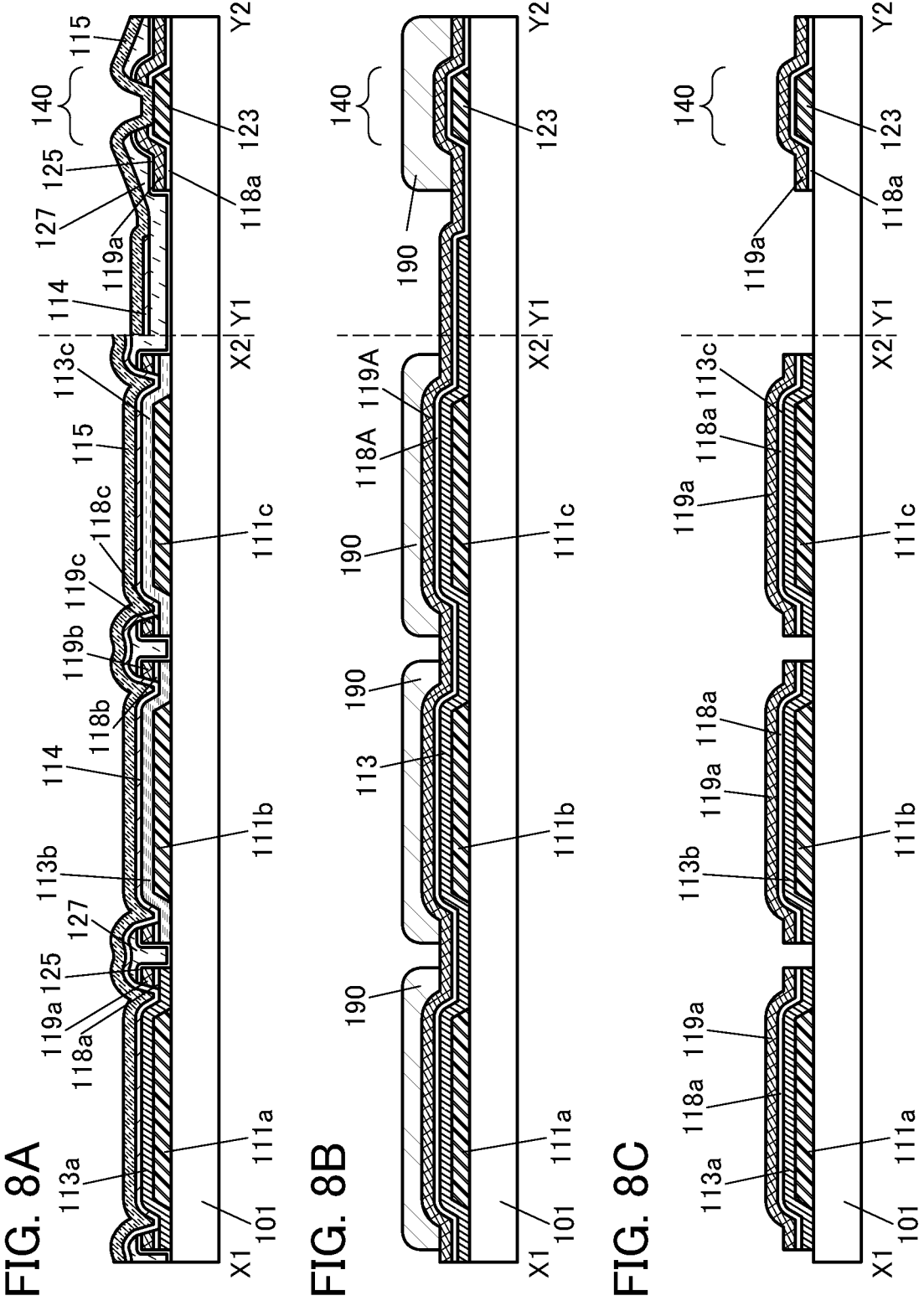

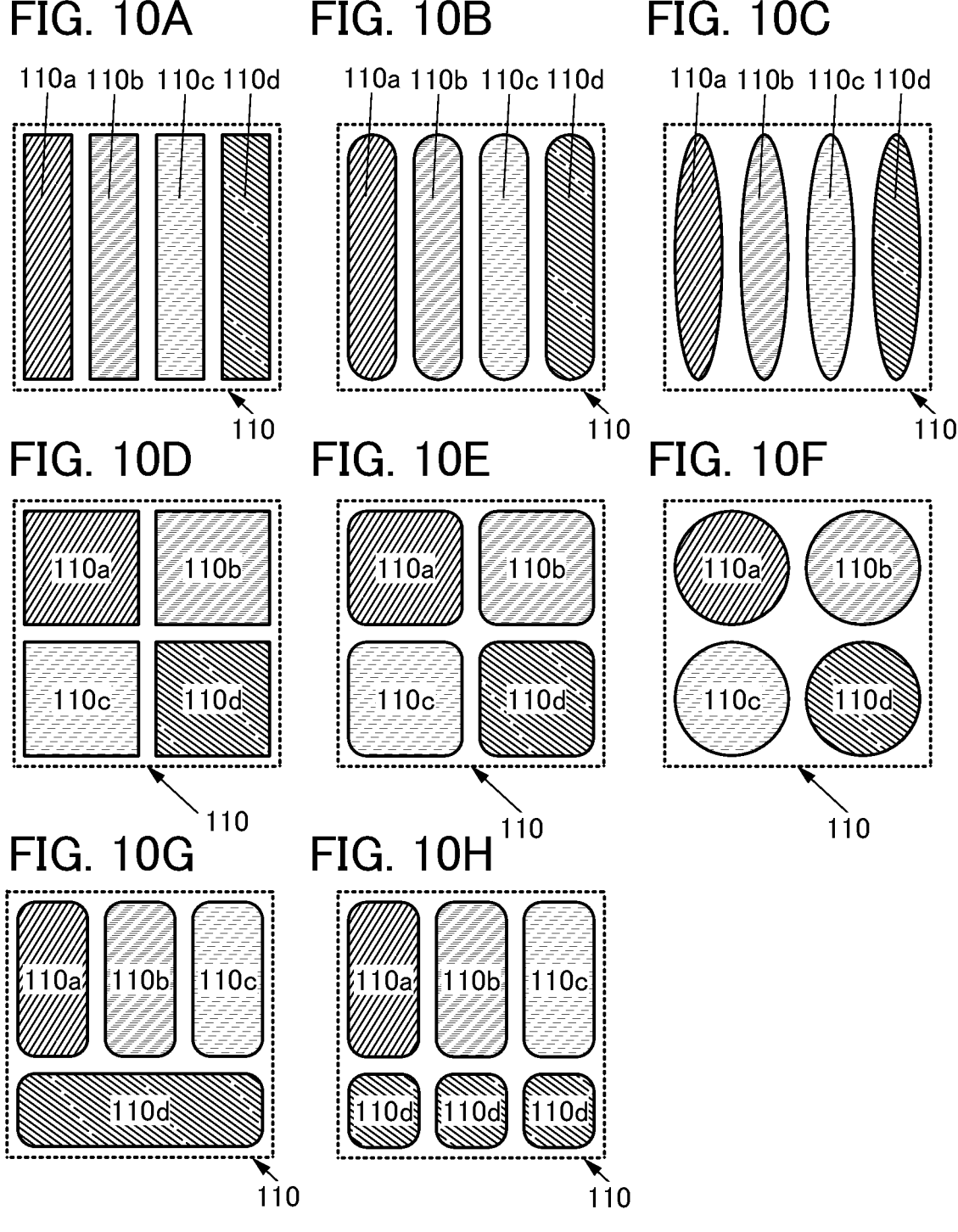

FIG. 27A
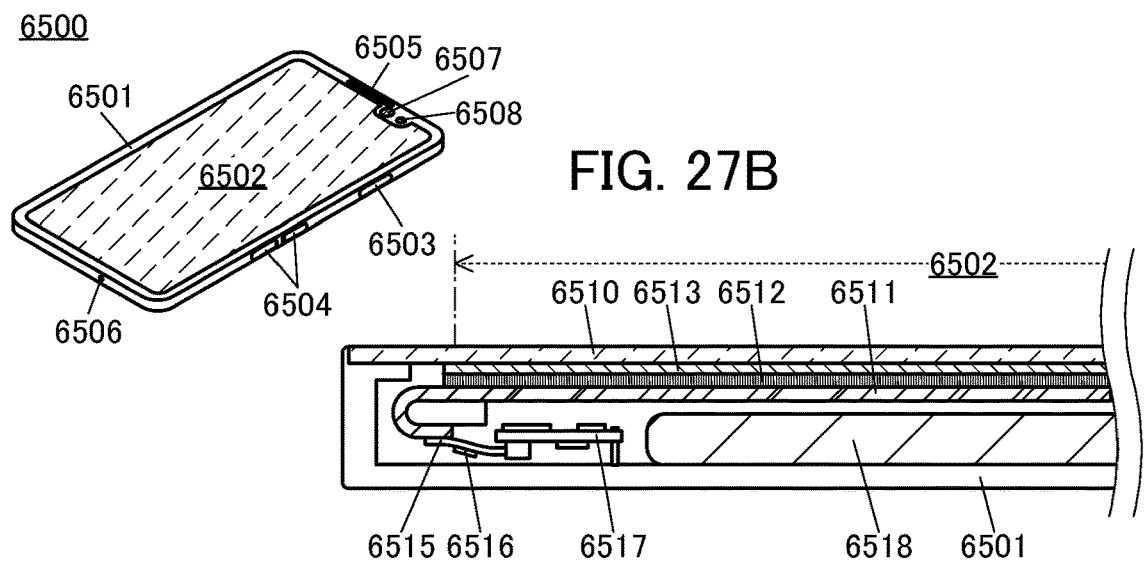
FIG. 27B
FIG. 27C
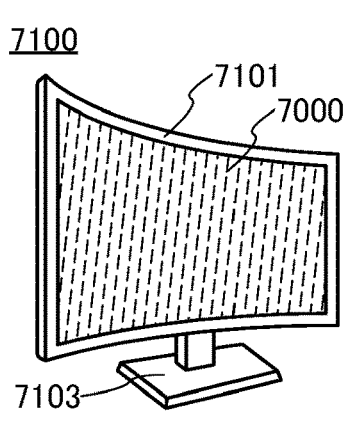
FIG. 27D
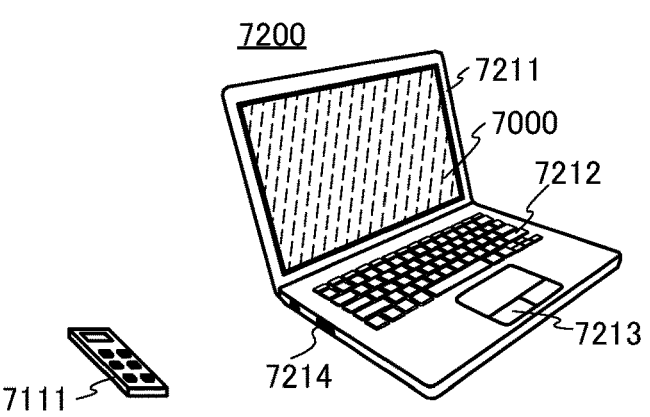
FIG. 27E
FIG. 27F
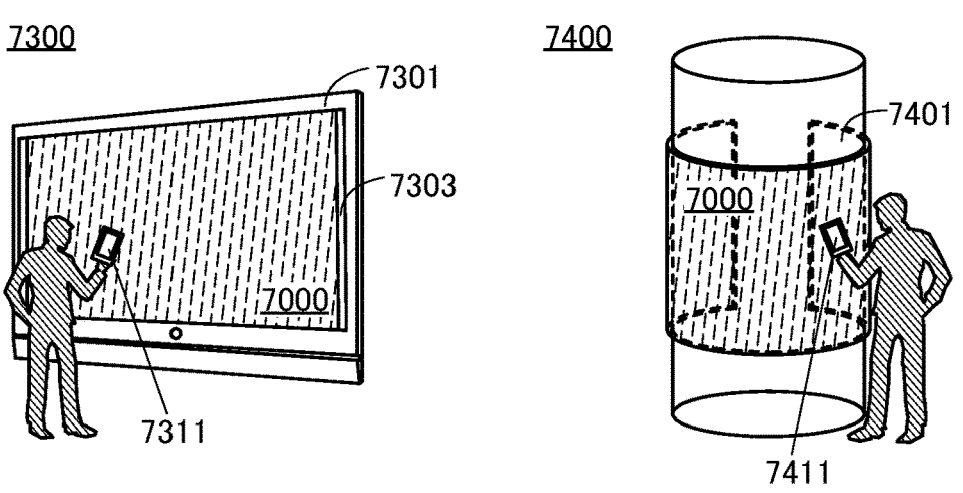

FIG. 28A
9101
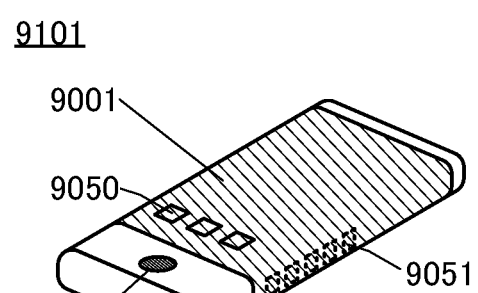
FIG. 28B
9102
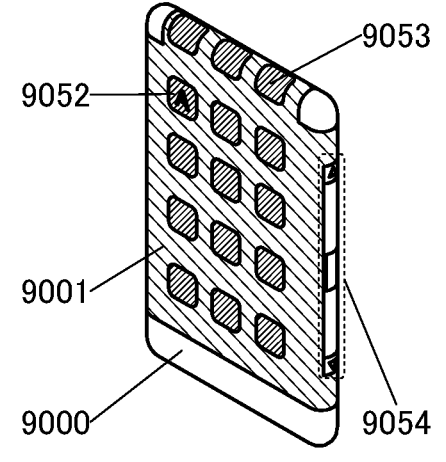
FIG. 28C
9103
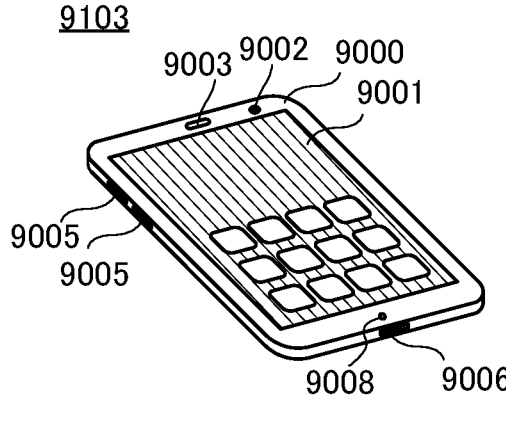
FIG. 28D
9200
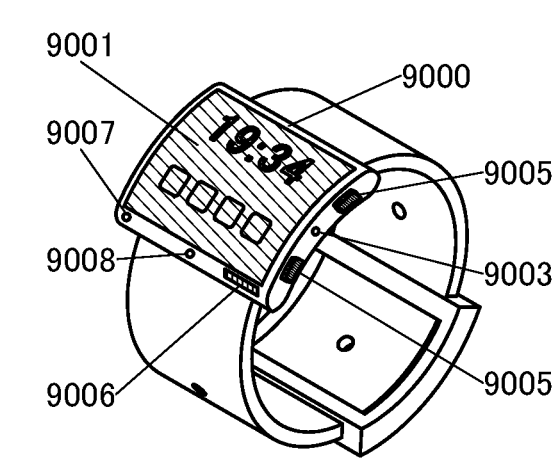
FIG. 28E
9201
FIG. 28F
9201
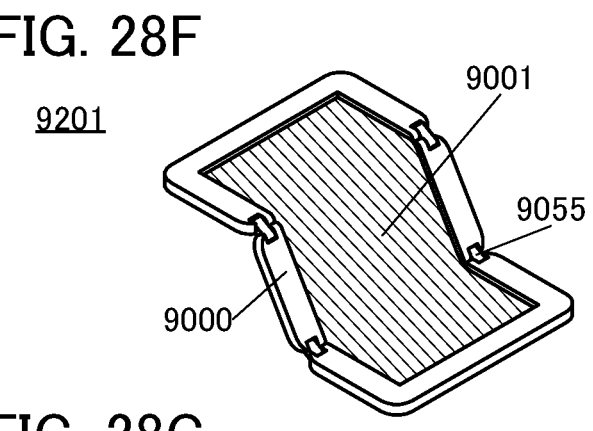
FIG. 28G
9201
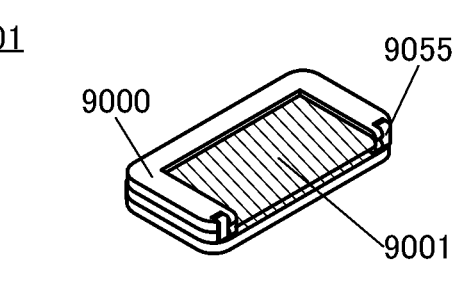

DISPLAY APPARATUS, DISPLAY MODULE, ELECTRONIC DEVICE, AND METHOD FOR FABRICATING DISPLAY APPARATUS

CROSS REFERENCE TO RELATED APPLICATIONS

This application is a U.S. National Phase Application under 35 U.S.C. § 371 of International Application PCT/IB2022/053400, filed on Apr. 12, 2022, which is incorporated by reference and claims the benefit of a foreign priority application filed in Japan on Apr. 23, 2021, as Application No. 2021-073149.

TECHNICAL FIELD

One embodiment of the present invention relates to a display apparatus, a display module, and an electronic device. One embodiment of the present invention relates to a method for fabricating a display apparatus.

Note that one embodiment of the present invention is not limited to the above technical field. Examples of the technical field of one embodiment of the present invention include a semiconductor device, a display apparatus, a light-emitting apparatus, a power storage device, a memory device, an electronic device, a lighting device, an input device (e.g., a touch sensor), an input/output device (e.g., a touch panel), a method for driving any of them, and a method for manufacturing any of them.

BACKGROUND ART

In recent years, display apparatuses have been expected to be applied to a variety of uses. Examples of uses for a large display apparatus include a television device for home use (also referred to as a TV or a television receiver), digital signage, and a PID (Public Information Display). In addition, a smartphone, a tablet terminal, and the like including a touch panel are being developed as portable information terminals.

Furthermore, display apparatuses have been required to have higher resolution. For example, devices for virtual reality (VR), augmented reality (AR), substitutional reality (SR), or mixed reality (MR) are given as devices requiring high-resolution display apparatuses and have been actively developed.

Light-emitting apparatuses including light-emitting devices (also referred to as light-emitting elements) have been developed as display apparatuses, for example. Light-emitting devices (also referred to as EL devices or EL elements) utilizing electroluminescence (hereinafter referred to as EL) have features such as ease of reduction in thickness and weight, high-speed response to input signals, and driving with a constant DC voltage power source, and have been used in display apparatuses.

Patent Document 1 discloses a display apparatus using an organic EL device (also referred to as an organic EL element) for VR.

REFERENCE

Patent Document

[Patent Document 1] PCT International Publication No. 2018/087625

SUMMARY OF THE INVENTION

Problems to be Solved by the Invention

In the case of fabricating a display apparatus including a plurality of organic EL devices emitting light of different colors, light-emitting layers emitting light of different colors each need to be formed into an island shape.

For example, an island-shaped light-emitting layer can be formed by a vacuum evaporation method using a metal mask (also referred to as a shadow mask). However, this method causes a deviation from the designed shape and position of an island-shaped light-emitting layer due to various influences such as the low accuracy of the metal mask, the positional deviation between the metal mask and a substrate, a warp of the metal mask, and the vapor-scattering-induced expansion of outline of the formed film: accordingly, it is difficult to achieve high resolution and a high aperture ratio of the display apparatus. In addition, the outline of the layer may blur during vapor deposition, whereby the thickness of an end portion might be small. That is, the thickness of the island-shaped light-emitting layer might vary from area to area. In the case of fabricating a display apparatus with a large size, high definition, or high resolution, the yield might be reduced because of low dimensional accuracy of the metal mask and deformation due to heat or the like.

An object of one embodiment of the present invention is to provide a high-resolution display apparatus. An object of one embodiment of the present invention is to provide a high-definition display apparatus. An object of one embodiment of the present invention is to provide a highly reliable display apparatus.

An object of one embodiment of the present invention is to provide a method for fabricating a high-resolution display apparatus. An object of one embodiment of the present invention is to provide a method for fabricating a high-definition display apparatus. An object of one embodiment of the present invention is to provide a method for fabricating a highly reliable display apparatus. An object of one embodiment of the present invention is to provide a method for fabricating a display apparatus with a high yield.

Note that the description of these objects does not preclude the existence of other objects. One embodiment of the present invention does not need to achieve all of these objects. Other objects can be derived from the description of the specification, the drawings, and the claims.

Means for Solving the Problems

One embodiment of the present invention is a display apparatus including a first light-emitting device, a second light-emitting device, and an inorganic insulating layer. The first light-emitting device includes a first pixel electrode, a first light-emitting layer over the first pixel electrode, and a common electrode over the first light-emitting layer. The second light-emitting device includes a second pixel electrode, a second light-emitting layer over the second pixel electrode, and the common electrode over the second light-emitting layer. The inorganic insulating layer covers side surfaces of the first pixel electrode, the second pixel electrode, the first light-emitting layer, and the second light-emitting layer. A hydrogen concentration in the inorganic insulating layer is lower than or equal to $1.0 \times 10^{22}$ atoms/$cm^3$.

The hydrogen concentration in the inorganic insulating layer is preferably lower than or equal to $9.0 \times 10^{21}$ atoms/$cm^3$.

3 4

One embodiment of the present invention is a display apparatus including a first light-emitting device, a second light-emitting device, and an inorganic insulating layer. The first light-emitting device includes a first pixel electrode, a first light-emitting layer over the first pixel electrode, and a common electrode over the first light-emitting layer. The second light-emitting device includes a second pixel electrode, a second light-emitting layer over the second pixel electrode, and the common electrode over the second light-emitting layer. The inorganic insulating layer covers side surfaces of the first pixel electrode, the second pixel electrode, the first light-emitting layer, and the second light-emitting layer. A carbon concentration in the inorganic insulating layer is lower than or equal to $2.5 \times 10^{21}$ atoms/cm$^3$.

The carbon concentration in the inorganic insulating layer is preferably lower than or equal to $2.0 \times 10^{21}$ atoms/cm$^3$.

Any of the above display apparatuses preferably further includes an organic insulating layer. The organic insulating layer preferably overlaps with the side surfaces of the first pixel electrode, the second pixel electrode, the first light-emitting layer, and the second light-emitting layer with the inorganic insulating layer therebetween. The common electrode preferably includes a region positioned over the organic insulating layer.

It is preferable that the first light-emitting device include a common layer between the first light-emitting layer and the common electrode, the second light-emitting device include the common layer between the second light-emitting layer and the common electrode, and the common layer include at least one of a hole-injection layer, a hole-transport layer, a hole-blocking layer, an electron-blocking layer, an electron-transport layer, and an electron-injection layer. The first light-emitting device and the second light-emitting device preferably emit light of different colors.

Any of the above display apparatuses preferably further includes a first coloring layer and a second coloring layer transmitting light of different colors. It is preferable that the first light-emitting device and the second light-emitting device emit white light, light emission of the first light-emitting device be extracted to the outside of the display apparatus through the first coloring layer, and light emission of the second light-emitting device be extracted to the outside of the display apparatus through the second coloring layer.

One embodiment of the present invention is a display module including the display apparatus having any of the above structures. For example, the display module is provided with a connector such as a flexible printed circuit (FPC) or a TCP (Tape Carrier Package), or an integrated circuit (IC) is mounted on the display module by a COG (Chip On Glass) method, a COF (Chip On Film) method, or the like.

One embodiment of the present invention is an electronic device including the display module and at least one of a housing, a battery, a camera, a speaker, and a microphone.

One embodiment of the present invention is a method for fabricating a display apparatus, including the steps of: forming a conductive film over an insulating surface: forming a first layer over the conductive film; forming a first sacrificial layer over the first layer: processing the first layer and the first sacrificial layer to expose part of the conductive film: forming a second layer over the first sacrificial layer and the conductive film: forming a second sacrificial layer over the second layer: processing the second layer and the second sacrificial layer to expose part of the conductive film: processing the conductive film to form a first pixel electrode overlapping with the first sacrificial layer and a second pixel electrode overlapping with the second sacrificial layer; forming an inorganic insulating film covering at least a side surface of the first pixel electrode, a side surface of the second pixel electrode, a side surface of the first layer, a side surface of the second layer, a side surface and a top surface of the first sacrificial layer, and a side surface and a top surface of the second sacrificial layer by an atomic layer deposition method under a condition of a substrate temperature higher than or equal to 60° C., and lower than or equal to 140° C.; processing the inorganic insulating film to form an inorganic insulating layer covering at least the side surface of the first pixel electrode, the side surface of the second pixel electrode, the side surface of the first layer, and the side surface of the second layer: removing the first sacrificial layer and the second sacrificial layer: and forming a common electrode over the first layer and the second layer.

In the above method for fabricating a display apparatus, it is preferable that an organic insulating film be formed over the inorganic insulating film: the inorganic insulating film and the organic insulating film be processed to form the inorganic insulating layer and an organic insulating layer over the inorganic insulating layer, which cover at least the side surface of the first pixel electrode, the side surface of the second pixel electrode, the side surface of the first layer, and the side surface of the second layer: the first sacrificial layer and the second sacrificial layer be removed: and the common electrode be formed over the first layer, the second layer, and the organic insulating layer.

In the above method for fabricating a display apparatus, it is preferable that a third layer be formed over the first layer and the second layer after the first sacrificial layer and the second sacrificial layer are removed, and the common electrode be formed over the third layer.

Effect of the Invention

One embodiment of the present invention can provide a high-resolution display apparatus. One embodiment of the present invention can provide a high-definition display apparatus. One embodiment of the present invention can provide a highly reliable display apparatus.

One embodiment of the present invention can provide a method for fabricating a high-resolution display apparatus. One embodiment of the present invention can provide a method for fabricating a high-definition display apparatus. One embodiment of the present invention can provide a method for fabricating a highly reliable display apparatus. One embodiment of the present invention can provide a method for fabricating a display apparatus with a high yield.

Note that the description of these effects does not preclude the existence of other effects. One embodiment of the present invention does not necessarily have all of these effects. Other effects can be derived from the description of the specification, the drawings, and the claims.

BRIEF DESCRIPTION OF THE DRAWINGS

FIG. 6A to FIG. 6C are cross-sectional views illustrating the example of a method for fabricating a display apparatus.

FIG. 8A to FIG. 8C are cross-sectional views illustrating the example of a method for fabricating a display apparatus.

FIG. 10A to FIG. 10H are top views illustrating examples of a pixel.

FIG. 23 is a cross-sectional view illustrating an example of a display apparatus.

FIG. 24 is a cross-sectional view illustrating an example of a display apparatus.

FIG. 27A to FIG. 27F are diagrams illustrating examples of an electronic device.

FIG. 28A to FIG. 28G are diagrams illustrating examples of an electronic device.

MODE FOR CARRYING OUT THE INVENTION

Figure 1A:
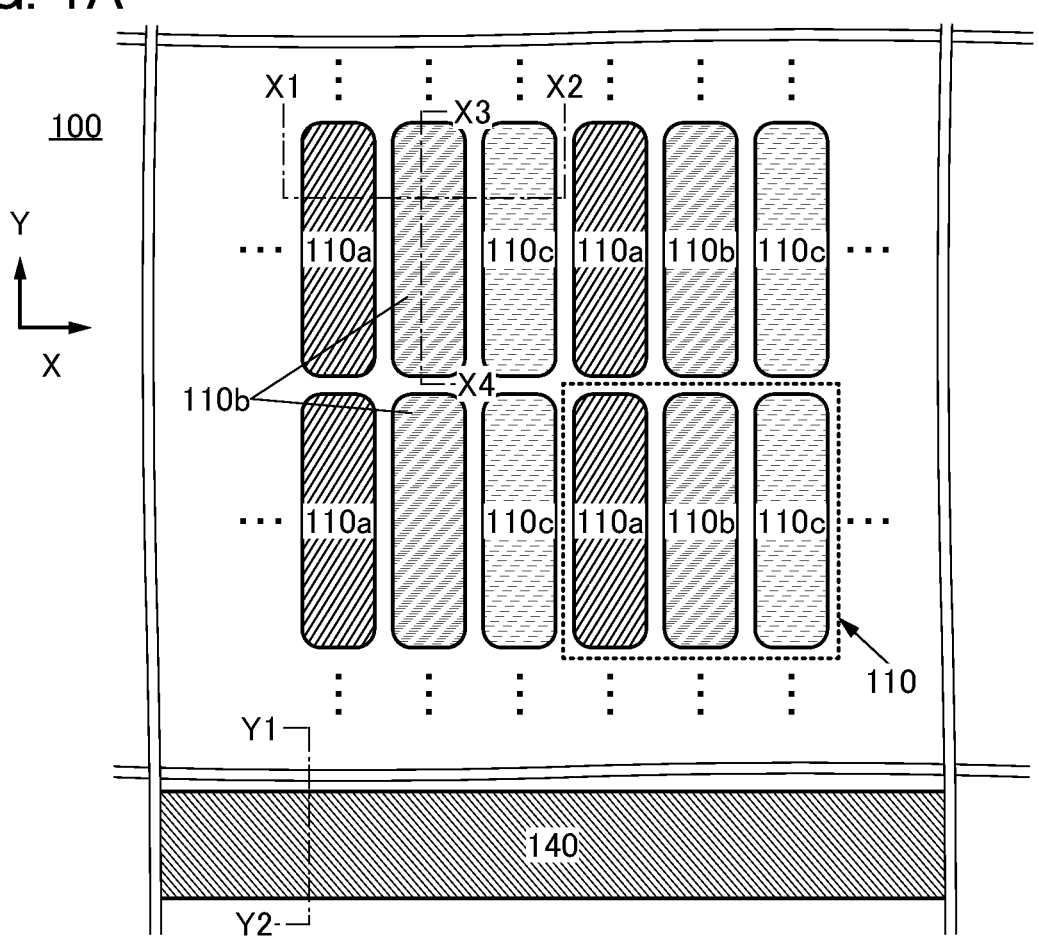
FIG. 1A is a top view illustrating an example of a display apparatus.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments.

Note that in structures of the invention described below, the same portions or portions having similar functions are denoted by the same reference numerals in different drawings, and the description thereof is not repeated. The same hatching pattern is used for portions having similar functions, and the portions are not especially denoted by reference numerals in some cases.

The position, size, range, and the like of each component illustrated in drawings do not represent the actual position, size, range, and the like in some cases for easy understanding. Therefore, the disclosed invention is not necessarily limited to the position, size, range, and the like disclosed in the drawings.

Note that the term "film" and the term "layer" can be interchanged with each other depending on the case or circumstances. For example, the term "conductive layer" can be replaced with the term "conductive film". As another example, the term "insulating film" can be replaced with the term "insulating layer".

Embodiment 1

In this embodiment, a display apparatus of one embodiment of the present invention and a fabrication method thereof are described with reference to FIG. 1 to FIG. 8.

In a method for fabricating a display apparatus of one embodiment of the present invention, a first layer (also referred to as an EL layer or part of an EL layer) including a light-emitting layer emitting light of a first color is formed over the entire surface, and then a first sacrificial layer is formed over the first layer. Then, a first resist mask is formed over the first sacrificial layer and the first layer and the first sacrificial layer are processed using the first resist mask, so that the first layer is formed into an island shape. Next, in a manner similar to that for the first layer, a second layer (also referred to as an EL layer or part of an EL layer) including a light-emitting layer emitting light of a second color is formed into an island shape using a second sacrificial layer and a second resist mask.

As described above, in the method for fabricating a display apparatus of one embodiment of the present invention, the island-shaped EL layers are formed not by using a metal mask having a fine pattern but by processing an EL layer formed over the entire surface. Accordingly, a high-resolution display apparatus or a display apparatus with a high aperture ratio, each of which has been difficult to achieve, can be achieved. Moreover, EL layers can be formed separately for the respective colors, enabling the display apparatus to perform extremely clear display with high contrast and high display quality. In addition, the sacrificial layers (which may be also referred to as mask layers) provided over the EL layers can reduce damage to the EL layers during the fabrication process of the display apparatus, increasing the reliability of light-emitting devices.

It is difficult to set the interval between adjacent light-emitting devices to less than 10 µm with a formation method using a metal mask, for example; however, with the above method, the distance can be decreased to less than 10 µm, less than or equal to 5 µm, less than or equal to 3 µm, less than or equal to 2 µm, or less than or equal to 1 µm.

Furthermore, for example, with the use of a light exposure apparatus for LSI, the interval can be reduced to less than or equal to 500 nm, less than or equal to 200 nm, less than or equal to 100 nm, or even less than or equal to 50 nm. Accordingly, the area of a non-light-emitting region that may exist between two light-emitting devices can be significantly reduced, and the aperture ratio can be close to 100%. For example, the aperture ratio is higher than or equal to 50%, higher than or equal to 60%, higher than or equal to 70%, higher than or equal to 80%, or higher than or equal to 90% and lower than 100% can be achieved.

Furthermore, a pattern of the EL layer itself (also referred to as a processing size) can be made much smaller than that in the case of using a metal mask. For example, in the case of using a metal mask for forming EL layers separately, a variation in the thickness occurs between the center and the edge of the EL layer, which causes a reduction in an effective area that can be used as a light-emitting region with respect to the area of the EL layer. In contrast, in the above fabrication method, a film formed to have a uniform thickness is processed, so that island-shaped EL layers can be formed to have a uniform thickness. Accordingly, even in a fine pattern, almost the whole area can be used as a light-emitting region. Consequently, a display apparatus having both high resolution and a high aperture ratio can be fabricated.

Here, each of the first layer and the second layer includes at least a light-emitting layer and preferably is composed of a plurality of layers. Specifically, each of the first layer and the second layer preferably includes one or more layers over the light-emitting layer. A layer between the light-emitting layer and the sacrificial layer can inhibit the light-emitting layer from being exposed on the outermost surface during the fabrication process of the display apparatus and can reduce damage to the light-emitting layer. Thus, the reliability of the light-emitting device can be increased. Thus, each of the first layer and the second layer preferably includes the light-emitting layer and a carrier-transport layer (an electron-transport layer or a hole-transport layer) over the light-emitting layer.

Note that it is not necessary to form all layers included in the EL layers separately for the respective light-emitting devices emitting light of different colors, and some layers of the EL layers can be formed in the same step. Examples of the layers included in the EL layer include a light-emitting layer, carrier-injection layers (a hole-injection layer and an electron-injection layer), carrier-transport layers (a hole-transport layer and an electron-transport layer), and carrier-blocking layers (a hole-blocking layer and an electron-blocking layer). In the method for fabricating a display apparatus of one embodiment of the present invention, after some layers included in the EL layer are formed into an island shape separately for each color, the sacrificial layer is removed at least partly: then, the other layers included in the EL layers and a common electrode (also referred to as an upper electrode) are formed (as a single film) to be shared by the light-emitting devices of different colors. For example, a carrier-injection layer and a common electrode, which are formed after the light-emitting layer, can be formed to be shared by the light-emitting devices of different colors. Meanwhile, the carrier-injection layer often has relatively high conductivity in the EL layer. Therefore, when the carrier-injection layer is in contact with a side surface of any layer of the EL layer formed into an island shape or a side surface of the pixel electrode, the light-emitting device might be short-circuited. Note that also in the case where the carrier-injection layer is provided in an island shape and the common electrode is formed to be shared by the light-emitting devices of different colors, the light-emitting device might be short-circuited when the common electrode is in contact with the side surface of the EL layer or the side surface of the pixel electrode.

In view of the above, the display apparatus of one embodiment of the present invention includes an insulating layer covering at least a side surface of an island-shaped light-emitting layer.

This can inhibit at least some layers of the island-shaped EL layers and the pixel electrodes from being in contact with the carrier-injection layer or the common electrode. Hence, a short circuit of the light-emitting device is inhibited, and the reliability of the light-emitting device can be increased.

Moreover, providing the insulating layer can fill the space between adjacent island-shaped EL layers; hence, the formation surface of a layer (e.g., the carrier-injection layer or the common electrode) provided over the island-shaped EL layer has less unevenness and can be flatter. This can increase the coverage with the carrier-injection layer or the common electrode. As a result, disconnection of the common electrode can be prevented.

Note that in this specification and the like, disconnection refers to a phenomenon in which a layer, a film, or an electrode is split because of the shape of the formation surface (e.g., a level difference).

The insulating layer can be provided in contact with the island-shaped EL layer. Thus, peeling of the EL layer can be prevented. Close contact between the insulating layer and the island-shaped EL layer has an effect of fixing or bonding adjacent island-shaped EL layers to each other. Furthermore, the insulating layer inhibits entry of moisture from the interface between the pixel electrode and the EL layer, thereby preventing peeling of the EL layer. Thus, the reliability of the light-emitting device can be increased. In addition, the yield of the light-emitting device can be increased.

The insulating layer preferably has a function of a barrier insulating layer against at least one of water and oxygen. Alternatively, the insulating layer preferably has a function of inhibiting diffusion of at least one of water and oxygen. Alternatively, the insulating layer preferably has a function of capturing or fixing (also referred to as gettering) at least one of water and oxygen.

Note that in this specification and the like, a barrier insulating layer refers to an insulating layer having a barrier property. A barrier property in this specification and the like refers to a function of inhibiting diffusion of a particular substance (also referred to as having low permeability). Alternatively, a barrier property refers to a function of capturing or fixing (also referred to as gettering) a particular substance.

With the use of an insulating layer having a function of the barrier insulating layer or a gettering function, entry of impurities (typically, at least one of water and oxygen) that might diffuse into the light-emitting devices from the outside can be inhibited. With this structure, a highly reliable light-emitting device and a highly reliable display apparatus can be provided.

The display apparatus of one embodiment of the present invention includes a pixel electrode functioning as an anode: an island-shaped hole-injection layer, an island-shaped hole-transport layer, an island-shaped light-emitting layer, and an island-shaped electron-transport layer that are provided in this order over the pixel electrode: an insulating layer provided to cover side surfaces of the hole-injection layer, the hole-transport layer, the light-emitting layer, and the electron-transport layer: an electron-injection layer provided over the electron-transport layer: and a common electrode that is provided over the electron-injection layer and functions as a cathode.

Alternatively, the display apparatus of one embodiment of the present invention includes a pixel electrode functioning as a cathode: an island-shaped electron-injection layer, an island-shaped electron-transport layer, an island-shaped light-emitting layer, and an island-shaped hole-transport layer that are provided in this order over the pixel electrode: an insulating layer provided to cover side surfaces of the electron-injection layer, the electron-transport layer, the light-emitting layer, and the hole-transport layer: a hole-injection layer provided over the hole-transport layer; and a common electrode that is provided over the hole-injection layer and functions as an anode.

Alternatively, the display apparatus of one embodiment of the present invention includes a pixel electrode, a first light-emitting unit over the pixel electrode, a charge-generation layer (also referred to as an intermediate layer) over the first light-emitting unit, a second light-emitting unit over the charge-generation layer, an insulating layer provided to cover side surfaces of the first light-emitting unit, the charge-generation layer, and the second light-emitting unit, and a common electrode provided over the second light-emitting unit. Note that the light-emitting devices of different colors may include a common layer between the second light-emitting unit and the common electrode.

The hole-injection layer, the electron-injection layer, the charge-generation layer, and the like often have relatively high conductivity in the EL layer. Since the side surfaces of these layers are covered with the insulating layer in the display apparatus of one embodiment of the present invention, these layers can be inhibited from being in contact with the common electrode or the like. Hence, a short circuit of the light-emitting device is inhibited, and the reliability of the light-emitting device can be increased.

With such a structure, a highly reliable display apparatus with high resolution or high definition can be fabricated. It is not necessary to increase the resolution in a pseudo manner by using a special pixel arrangement method such as a pentile method, for example: even an arrangement method where one pixel is composed of three or more subpixels enables a display apparatus with ultra-high resolution. For example, it is possible to achieve a display apparatus that employs what is called stripe arrangement in which R, G, and B pixels are arranged in one direction and has a resolution higher than or equal to 500 ppi, higher than or equal to 1000 ppi, higher than or equal to 2000 ppi, higher than or equal to 3000 ppi, or higher than or equal to 5000 ppi.

The insulating layer covering the side surface of the island-shaped EL layer or the like may have a single-layer structure or a stacked-layer structure.

When an insulating layer is formed to have a single-layer structure using an inorganic material, for example, the insulating layer can be used as a protective insulating layer for the EL layer. This can increase the reliability of the display apparatus.

In the case where an insulating layer having a stacked-layer structure is used, a first layer of the insulating layer is preferably formed using an inorganic insulating material because it is formed in contact with the EL layer. In particular, the first layer is preferably formed by an atomic layer deposition (ALD) method, which causes less deposition damage. Alternatively, an inorganic insulating layer is preferably formed by a sputtering method, a chemical vapor deposition (CVD) method, or a plasma-enhanced chemical vapor deposition (PECVD) method, which have higher deposition speed than an ALD method. In this case, a highly reliable display apparatus can be fabricated with high productivity. A second layer of the insulating layer is preferably formed using an organic material to fill a depressed portion formed by the first layer of the insulating layer.

For example, an aluminum oxide film formed by an ALD method can be used as the first layer of the insulating layer, and an organic resin film can be used as the second layer of the insulating layer.

In the case where the side surface of the EL layer and the organic resin film are in direct contact with each other, the EL layer might be damaged by an organic solvent or the like that might be contained in the organic resin film. The use of an inorganic insulating film such as an aluminum oxide film formed by an ALD method as the first layer of the insulating layer enables a structure where the organic resin film and the side surface of the EL layer are not in direct contact with each other. Thus, the EL layer can be inhibited from being dissolved by the organic solvent, for example.

The insulating layer in contact with the island-shaped EL layer preferably has a low impurity concentration. In this case, deterioration of the EL layer due to entry of impurities from the insulating layer into the EL layer can be inhibited. In addition, when having a low impurity concentration, the insulating layer can have a high barrier property against at least one of water and oxygen. For example, the insulating layer preferably has one of a sufficiently low hydrogen concentration and a sufficiently low carbon concentration, desirably has both of them.

For example, the hydrogen concentration in the insulating layer having a single-layer structure or the first layer of the insulating layer (a layer in contact with the EL layer) is preferably lower than or equal to $1.0 \times 10^{22}$ atoms/cm$^3$, more preferably lower than or equal to $9.0 \times 10^{21}$ atoms/cm$^3$, further preferably lower than or equal to $8.0 \times 10^{21}$ atoms/cm$^3$, still further preferably lower than or equal to $6.0 \times 10^{21}$ atoms/cm$^3$. For example, the hydrogen concentration in an aluminum oxide film formed by the above-described ALD method is preferably within the above range.

For example, the carbon concentration in the insulating layer having a single-layer structure or the first layer of the insulating layer (the layer in contact with the EL layer) is preferably lower than or equal to $2.5 \times 10^{21}$ atoms/cm$^3$, more preferably lower than or equal to $2.0 \times 10^{21}$ atoms/cm$^3$, further preferably lower than or equal to $1.0 \times 10^{21}$ atoms/cm$^3$, still further preferably lower than or equal to $6.0 \times 10^{20}$ atoms/cm$^3$. For example, the carbon concentration in an aluminum oxide film formed by the above-described ALD method is preferably within the above range.

In the display apparatus of this embodiment, an insulating layer covering an end portion of the pixel electrode does not need to be provided between the pixel electrode and the EL layer, so that the interval between adjacent light-emitting devices can be extremely short. As a result, higher resolution or higher definition of the display apparatus can be achieved. In addition, a mask for forming the insulating layer is not needed, reducing the manufacturing cost of the display apparatus.

Furthermore, light emitted from the EL layer can be extracted efficiently with a structure where an insulating layer covering the end portion of the pixel electrode is not provided between the pixel electrode and the EL layer, i.e., a structure where an insulating layer is not provided between the pixel electrode and the EL layer. Therefore, the display apparatus of one embodiment of the present invention can significantly reduce the viewing angle dependence. A reduction in the viewing angle dependence leads to an increase in visibility of an image on the display apparatus. For example, in the display apparatus of one embodiment of the present invention, the viewing angle (the maximum angle with a certain contrast ratio maintained when the screen is seen from an oblique direction) can be greater than or equal to 100° and less than 180°, preferably greater than or equal to 150° and less than or equal to 170°. Note that the viewing angle refers to that in both the vertical direction and the horizontal direction.

[Structure Example of Display Apparatus]

Figure 1B:
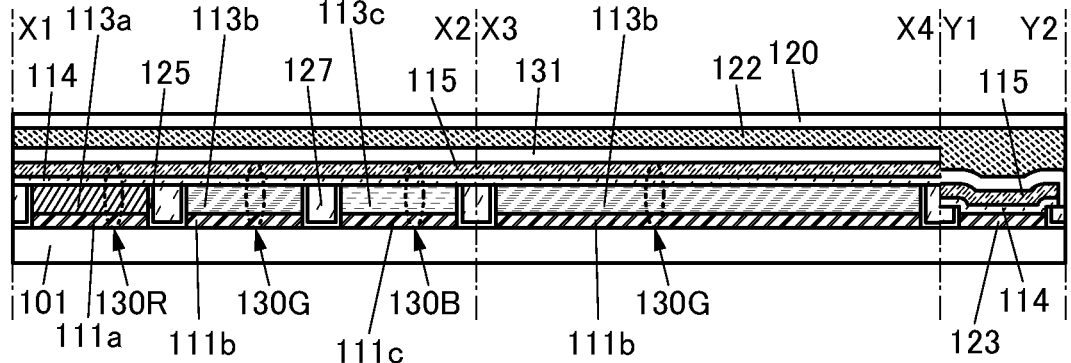
FIG. 1B is a cross-sectional view illustrating the example of a display apparatus.

FIG. 1A and FIG. 1B illustrate a display apparatus of one embodiment of the present invention.

FIG. 1A is a top view of a display apparatus 100. The display apparatus 100 includes a display portion in which a plurality of pixels 110 are arranged in a matrix, and a connection portion 140 outside the display portion. The connection portion 140 can also be referred to as a cathode contact portion.

The pixel 110 illustrated in FIG. 1A employs stripe arrangement. The pixel 110 illustrated in FIG. 1A is composed of three subpixels 110a, 110b, and 110c. The subpixels 110a, 110b, and 110c include light-emitting devices that emit light of different colors. The subpixels 110a, 110b, and 110c can be subpixels of three colors of red (R), green (G), and blue (B) or subpixels of three colors of yellow (Y), cyan (C), and magenta (M), for example.

The top surface shapes of the subpixels illustrated in FIG. 1A correspond to the top surface shapes of light-emitting regions.

The range of the circuit layout for forming the subpixels is not limited to the range of the subpixels illustrated in FIG. 1A and may be placed outside the subpixels. For example, some or all of transistors included in the subpixel 110a may be positioned outside the range of the subpixel 110a illustrated in FIG. 1A. For example, transistors included in the subpixel 110a may include a portion positioned within the range of the subpixel 110b, or may include a portion positioned within the range of the subpixel 110c.

Although the subpixels 110a, 110b, and 110c have the same or substantially the same aperture ratio (also referred to as size or size of a light-emitting region) in FIG. 1A, one embodiment of the present invention is not limited thereto. The aperture ratio of each of the subpixels 110a, 110b, and 110c can be determined as appropriate. The subpixels 110a, 110b, and 110c may have different aperture ratios, or two or more of the subpixels 110a, 110b, and 110c may have the same or substantially the same aperture ratio.

FIG. 1A illustrates an example where subpixels of different colors are arranged in the X direction and subpixels of the same color are arranged in the Y direction. Note that subpixels of different colors may be arranged in the Y direction, and subpixels of the same color may be arranged in the X direction.

Although FIG. 1A illustrates an example where the connection portion 140 is positioned on the lower side of the display portion in the top view; one embodiment of the present invention is not particularly limited. The connection portion 140 only needs to be provided on at least one of the upper side, the right side, the left side, and the lower side of the display portion in the top view, and may be provided to surround the four sides of the display portion. The top surface shape of the connection portion 140 can be a belt-like shape, an L shape, a U shape, a frame-like shape, or the like. Moreover, one connection portion 140 or a plurality of connection portions 140 can be provided.

FIG. 1B shows a cross-sectional view taken along dashed-dotted lines X1-X2, X3-X4, and Y1-Y2 in FIG. 1A. Moreover, FIG. 2A and FIG. 2B and FIG. 3A to FIG. 3C show cross-sectional views taken along dashed-dotted lines X1-X2 and Y1-Y2 in FIG. 1A as modification examples.

As illustrated in FIG. 1B, in the display apparatus 100, light-emitting devices 130R, 130G, and 130B are provided over a layer 101 including transistors and a protective layer 131 is provided to cover these light-emitting devices. A substrate 120 is bonded to the protective layer 131 with a resin layer 122. In a region between adjacent light-emitting devices, an insulating layer 125 and an insulating layer 127 over the insulating layer 125 are provided.

The display apparatus of one embodiment of the present invention can have any of the following structures: a top-emission structure in which light is emitted in a direction opposite to the substrate where the light-emitting devices are formed, a bottom-emission structure in which light is emitted toward the substrate where the light-emitting devices are formed, and a dual-emission structure in which light is emitted toward both surfaces.

The layer 101 including transistors can have a stacked-layer structure in which a plurality of transistors are provided over a substrate and an insulating layer is provided to cover these transistors, for example. The layer 101 including transistors may have a depressed portion between adjacent light-emitting devices. For example, an insulating layer positioned as the outermost surface of the layer 101 including transistors may have a depressed portion. Structure examples of the layer 101 including transistors will be described later in Embodiment 3.

The light-emitting device 130R emits red (R) light. The light-emitting device 130G emits green (G) light. The light-emitting device 130B emits blue (B) light.

As the light-emitting devices 130R, 130G, and 130B, an OLED (Organic Light Emitting Diode) or a QLED (Quantum-dot Light Emitting Diode) is preferably used. Examples of a light-emitting substance (also referred to as a light-emitting material) contained in the light-emitting device include a substance that emits fluorescent light (a fluorescent material), a substance that emits phosphorescent light (a phosphorescent material), and a substance that exhibits thermally activated delayed fluorescence (a thermally activated delayed fluorescent (TADF) material). As a TADF material, a material that is in thermal equilibrium between a singlet excited state and a triplet excited state may be used. Such a TADF material has a shorter light emission lifetime (excitation lifetime) and thus can inhibit a reduction in efficiency of the light-emitting device in a high-luminance region. An inorganic compound (e.g., a quantum dot material) may also be used as the light-emitting substance included in the light-emitting device.

The light-emitting device includes an EL layer between a pair of electrodes. In this specification and the like, one of the pair of electrodes is referred to as a pixel electrode and the other is referred to as a common electrode in some cases.

One of the pair of electrodes of the light-emitting device functions as an anode, and the other electrode functions as a cathode. The case where the pixel electrode functions as an anode and the common electrode functions as a cathode will be described below as an example.

The light-emitting device 130R includes a pixel electrode 111a over the layer 101 including transistors, an island-shaped first layer 113a over the pixel electrode 111a, a fourth layer 114 over the island-shaped first layer 113a, and a common electrode 115 over the fourth layer 114. The pixel electrode 111a functions as a pixel electrode. In the light-emitting device 130R, the first layer 113a and the fourth layer 114 can be collectively referred to as an EL layer.

There is no particular limitation on the structure of the light-emitting device in this embodiment, and the light-emitting device can have a single structure or a tandem structure. Note that structure examples of the light-emitting device will be described later in Embodiment 4.

The first layer 113a includes a hole-injection layer, a hole-transport layer, a light-emitting layer, and an electron-transport layer, for example. Alternatively, the first layer 113a includes a first light-emitting unit, a charge-generation layer, and a second light-emitting unit, for example.

The fourth layer 114 can be referred to as a common layer that is one film shared by the light-emitting devices of different colors. The fourth layer 114 includes an electron-injection layer, for example. Alternatively, the fourth layer 114 may include a stack of an electron-transport layer and an electron-injection layer.

The light-emitting device 130G includes a pixel electrode 111b over the layer 101 including transistors, an island-shaped second layer 113b over the pixel electrode 111b, the fourth layer 114 over the island-shaped second layer 113b, and the common electrode 115 over the fourth layer 114. The pixel electrode 111b functions as a pixel electrode. In the light-emitting device 130G, the second layer 113b and the fourth layer 114 can be collectively referred to as an EL layer.

The light-emitting device 130B includes a pixel electrode 111c over the layer 101 including transistors, an island-shaped third layer 113c over the pixel electrode 111c, the fourth layer 114 over the island-shaped third layer 113c, and the common electrode 115 over the fourth layer 114. The pixel electrode 111c functions as a pixel electrode. In the light-emitting device 130B, the third layer 113c and the fourth layer 114 can be collectively referred to as an EL layer.

The light-emitting devices of different colors share one film serving as the common electrode. The common electrode 115 shared by the light-emitting devices of different colors is electrically connected to a conductive layer 123 provided in the connection portion 140 (see FIG. 1B). As the conductive layer 123, a conductive layer formed using the same material in the same step as the pixel electrodes 111a, 111b, and 111c can be used.

Figure 2A:
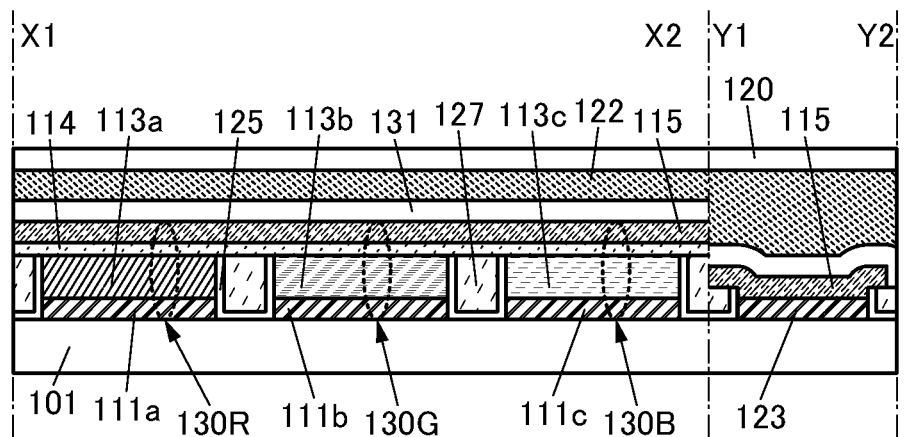
FIG. 2A and FIG. 2B are cross-sectional views illustrating examples of a display apparatus.

Note that FIG. 1B illustrates an example where the fourth layer 114 is provided over the conductive layer 123 and the conductive layer 123 and the common electrode 115 are electrically connected to each other through the fourth layer 114. The fourth layer 114 is not necessarily provided in the connection portion 140. For example, FIG. 2A illustrates an example where the fourth layer 114 is not provided over the conductive layer 123 and the conductive layer 123 and the common electrode 115 are directly connected to each other. For example, by using a mask for specifying a film formation area (also referred to as an area mask, a rough metal mask, or the like), the fourth layer 114 and the common electrode 115 can be formed in different regions.

Side surfaces of the pixel electrode 111a to the pixel electrode 111c, the first layer 113a, the second layer 113b, and the third layer 113c are covered with the insulating layer 125 and the insulating layer 127. Thus, the fourth layer 114 (or the common electrode 115) can be inhibited from being in contact with the side surface of any of the pixel electrode 111a to the pixel electrode 111c, the first layer 113a, the second layer 113b, and the third layer 113c, whereby a short circuit of the light-emitting device can be inhibited. Thus, the reliability of the light-emitting device can be increased.

The insulating layer 125 preferably covers at least the side surfaces of the pixel electrode 111a to the pixel electrode 111c. Moreover, the insulating layer 125 preferably covers the side surfaces of the first layer 113a, the second layer 113b, and the third layer 113c. The insulating layer 125 can be in contact with the side surfaces of the pixel electrode 111a to the pixel electrode 111c, the first layer 113a, the second layer 113b, and the third layer 113c.

The insulating layer 127 is provided over the insulating layer 125 to fill a depressed portion of the insulating layer 125. The insulating layer 127 can overlap with the side surfaces of the pixel electrode 111a to the pixel electrode 111c, the first layer 113a, the second layer 113b, and the third layer 113c (also can be referred to as covering the side surfaces) with the insulating layer 125 therebetween.

Moreover, providing the insulating layer 125 and the insulating layer 127 can fill a space between adjacent island-shaped layers, whereby the formation surface of a layer (e.g., the common electrode) provided over the island-shaped layers can be less uneven and flatter. Thus, the coverage with the common electrode can be increased and disconnection of the common electrode can be prevented.

The fourth layer 114 and the common electrode 115 are provided over the first layer 113a, the second layer 113b, the third layer 113c, the insulating layer 125, and the insulating layer 127. At the stage before the insulating layer 125 and the insulating layer 127 are provided, a level difference due to a region where the pixel electrode and the EL layer are provided and a region where the pixel electrode and the EL layer are not provided (a region between the light-emitting devices) is caused. The display apparatus of one embodiment of the present invention can eliminate the level difference by including the insulating layer 125 and the insulating layer 127, whereby the coverage with the fourth layer 114 and the common electrode 115 can be improved. Consequently, it is possible to inhibit a connection defect due to disconnection of the common electrode 115. Alternatively, it is possible to inhibit an increase in electric resistance due to local thinning of the common electrode 115 by the level difference.

In order to improve the planarity of the formation surfaces of the fourth layer 114 and the common electrode 115, the level of the top surface of the insulating layer 125 and the level of the top surface of the insulating layer 127 are each preferably equal to or substantially equal to the level of the top surface of at least one of the first layer 113a, the second layer 113b, and the third layer 113c. The top surface of the insulating layer 127 preferably has a flat shape and may have a protruding portion, a convex curved surface, a concave curved surface, or a depressed portion.

The insulating layer 125 or the insulating layer 127 can be provided in contact with the island-shaped layers. Thus, peeling of the island-shaped layers can be prevented. Close contact between the insulating layer and the island-shaped layers has an effect of fixing or bonding adjacent island-shaped layers to each other. Thus, the reliability of the light-emitting device can be increased. In addition, the yield of the light-emitting device can be increased.

Figure 2B:
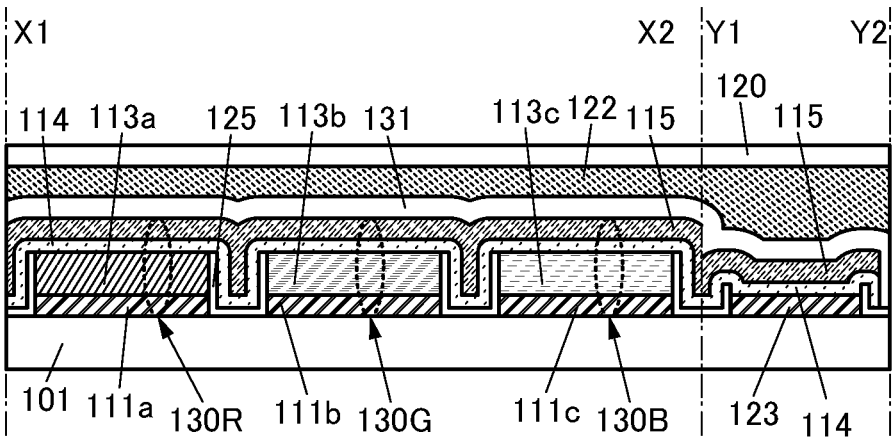

Note that one of the insulating layer 125 and the insulating layer 127 is not necessarily provided. FIG. 2B illustrates an example where the insulating layer 127 is not provided. When the insulating layer 125 having a single-layer structure using an inorganic material is formed, for example, the insulating layer 125 can be used as a protective insulating layer for the EL layer. This can increase the reliability of the display apparatus.

The insulating layer 125 includes regions in contact with the side surfaces of the first layer 113a, the second layer 113b, and the third layer 113c, and functions as a protective insulating layer for the first layer 113a, the second layer 113b, and the third layer 113c. Providing the insulating layer 125 can inhibit impurities (e.g., oxygen and moisture) from entering the first layer 113a, the second layer 113b, and the third layer 113c through their side surfaces, resulting in a highly reliable display apparatus.

When the width (thickness) of the insulating layer 125 in the regions in contact with the side surfaces of the first layer 113a, the second layer 113b, and the third layer 113c is large in a cross-sectional view; the intervals between the first layer 113a, the second layer 113b, and the third layer 113c increase, so that the aperture ratio might be reduced. When the width (thickness) of the insulating layer 125 is small, the effect of inhibiting impurities from entering the first layer 113a, the second layer 113b, and the third layer 113c through their side surfaces might be weakened. The width (thickness) of the insulating layer 125 in the regions in contact with the side surfaces of the first layer 113a, the second layer 113b, and the third layer 113c is preferably greater than or equal to 3 nm, greater than or equal to 5 nm, or greater than or equal to 10 nm and less than or equal to 200 nm, less than or equal to 150 nm, less than or equal to 100 nm, or less than or equal to 50 nm. When the width (thickness) of the insulating layer 125 is within the above range, the display apparatus can have both a high aperture ratio and high reliability.

The insulating layer 125 can be an insulating layer containing an inorganic material. As the insulating layer 125, an inorganic insulating film such as an oxide insulating film, a nitride insulating film, an oxynitride insulating film, or a nitride oxide insulating film can be used, for example. The insulating layer 125 may have a single-layer structure or a stacked-layer structure. Examples of the oxide insulating film include a silicon oxide film, an aluminum oxide film, a magnesium oxide film, an indium gallium zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. Aluminum oxide is particularly preferable because it has high selectivity with the EL layer in etching and has a function of protecting the EL layer in forming the insulating layer 127 which is to be described later. In particular, when an inorganic insulating film such as an aluminum oxide film, a hafnium oxide film, or a silicon oxide film formed by an ALD method is used as the insulating layer 125, the insulating layer 125 having few pinholes and an excellent function of protecting the EL layer can be formed. The insulating layer 125 may have a stacked-layer structure of a film formed by an ALD method and a film formed by a sputtering method. For example, the insulating layer 125 may have a stacked-layer structure of an aluminum oxide film formed by an ALD method and a silicon nitride film formed by a sputtering method.

Note that in this specification and the like, oxynitride refers to a material that contains more oxygen than nitrogen in its composition, and nitride oxide refers to a material that contains more nitrogen than oxygen in its composition. For example, silicon oxynitride refers to a material that contains more oxygen than nitrogen in its composition, and silicon nitride oxide refers to a material that contains more nitrogen than oxygen in its composition.

The insulating layer 125 preferably has a function of a barrier insulating layer against at least one of water and oxygen. Alternatively, the insulating layer 125 preferably has a function of inhibiting diffusion of at least one of water and oxygen. Alternatively, the insulating layer 125 preferably has a function of capturing or fixing (also referred to as gettering) at least one of water and oxygen.

When the insulating layer 125 has a function of a barrier insulating layer or a gettering function, entry of impurities (typically, at least one of water and oxygen) that might diffuse into the light-emitting devices from the outside can be inhibited. With this structure, a highly reliable light-emitting device and a highly reliable display apparatus can be provided.

The insulating layer 125 preferably has a low impurity concentration. In this case, deterioration of the EL layer due to entry of impurities from the insulating layer 125 into the EL layer can be inhibited. In addition, when having a low impurity concentration, the insulating layer 125 can have a high barrier property against at least one of water and oxygen. For example, the insulating layer 125 preferably has one of a sufficiently low hydrogen concentration and a sufficiently low carbon concentration, desirably has both of them.

For example, the hydrogen concentration in the insulating layer 125 is preferably lower than or equal to $1.0 \times 10^{22}$ atoms/cm$^3$, more preferably lower than or equal to $9.0 \times 10^{21}$ atoms/cm$^3$, further preferably lower than or equal to $8.0 \times 10^{21}$ atoms/cm$^3$, still further preferably lower than or equal to $6.0 \times 10^{21}$ atoms/cm$^3$. For example, as the insulating layer 125, an aluminum oxide film whose hydrogen concentration is within the above range is preferably used.

For example, the carbon concentration in the insulating layer 125 is preferably lower than or equal to $2.5 \times 10^{21}$ atoms/cm$^3$, more preferably lower than or equal to $2.0 \times 10^{21}$ atoms/cm$^3$, further preferably lower than or equal to $1.0 \times 10^{21}$ atoms/cm$^3$, still further preferably lower than or equal to $6.0 \times 10^{20}$ atoms/cm$^3$. For example, as the insulating layer 125, an aluminum oxide film whose carbon concentration is within the above range is preferably used.

Examples of the formation method of the insulating layer 125 include a sputtering method, a CVD method, a pulsed laser deposition (PLD) method, and an ALD method. The insulating layer 125 is preferably formed by an ALD method achieving good coverage.

When the substrate temperature in forming the insulating layer 125 is increased, the formed insulating layer 125, even with a small thickness, can have a low impurity concentration and a high barrier property against at least one of water and oxygen. Therefore, the substrate temperature is preferably higher than or equal to 60° C., more preferably higher than or equal to 80° C., further preferably higher than or equal to 100° C., still further preferably higher than or equal to 120° C. Meanwhile, the insulating layer 125 is formed after formation of an island-shaped EL layer, and thus is preferably formed at a temperature lower than the upper temperature limit of the EL layer. Therefore, the substrate temperature is preferably lower than or equal to 200° C., more preferably lower than or equal to 180° C., further preferably lower than or equal to 160° C., still further preferably lower than or equal to 150° C., yet still further preferably lower than or equal to 140° C.

Examples of indicators of the upper temperature limit include the glass transition point, the softening point, the melting point, the thermal decomposition temperature, and the 5% weight loss temperature. The upper temperature limit of the EL layer can be, for example, any of the above temperatures, preferably the lowest temperature thereof. In the case where the EL layer is formed of a plurality of layers, the lowest temperature in the upper temperature limits of the layers can be regarded as the upper temperature limit of the EL layer. In the case of a mixed layer that is one layer formed of a plurality of materials, for example, the upper temperature limit of the most contained material or the lowest temperature in the upper temperature limits of the materials can be regarded as the upper temperature limit of the layer.

The insulating layer 127 provided over the insulating layer 125 has a planarization function for the depressed portion of the insulating layer 125, which is formed between adjacent light-emitting devices. In other words, the insulating layer 127 has an effect of improving the planarity of the formation surface of the common electrode 115. As the insulating layer 127, an insulating layer containing an organic material can be suitably used. For example, the insulating layer 127 can be formed using an acrylic resin, a polyimide resin, an epoxy resin, an imide resin, a polyamide resin, a polyimide-amide resin, a silicone resin, a siloxane resin, a benzocyclobutene-based resin, a phenol resin, precursors of these resins, or the like. The insulating layer 127 may be formed using an organic material such as polyvinyl alcohol (PVA), polyvinyl butyral, polyvinylpyrrolidone, polyethylene glycol, polyglycerin, pullulan, water-soluble cellulose, or an alcohol-soluble polyamide resin. Moreover, the insulating layer 127 can be formed using a photosensitive resin. A photoresist may be used as the photosensitive resin. As the photosensitive resin, a positive photosensitive material or a negative photosensitive material can be used.

The insulating layer 127 may be formed using a material absorbing visible light. When the insulating layer 127 absorbs light emitted from the light-emitting device, leakage of light (stray light) from the light-emitting device to an adjacent light-emitting device through the insulating layer 127 can be inhibited. Thus, the display quality of the display apparatus can be improved.

The difference between the level of the top surface of the insulating layer 127 and the level of the top surface of any of the first layer 113a, the second layer 113b, and the third layer 113c is preferably less than or equal to 0.5 times, further preferably less than or equal to 0.3 times the thickness of the insulating layer 127, for example. As another example, the insulating layer 127 may be provided such that the top surface of any of the first layer 113a, the second layer 113b, and the third layer 113c is at a higher level than the top surface of the insulating layer 127. As another example, the insulating layer 127 may be provided such that the top surface of the insulating layer 127 is at a higher level than the top surface of the light-emitting layer included in the first layer 113a, the second layer 113b, or the third layer 113c.

The protective layer 131 is preferably provided over the light-emitting devices 130R, 130G, and 130B. Providing protective layer 131 can improve the reliability of the light-emitting devices. The protective layer 131 may have a single-layer structure or a stacked-layer structure of two or more layers.

There is no limitation on the conductivity of the protective layer 131. For the protective layer 131, at least one of an insulating film, a semiconductor film, and a conductive film can be used.

The protective layer 131 including an inorganic film can inhibit deterioration of the light-emitting devices by preventing oxidation of the common electrode 115 and inhibiting entry of impurities (e.g., moisture and oxygen) into the light-emitting devices 130R, 130G, and 130B, for example: thus, the reliability of the display apparatus can be improved.

For the protective layer 131, an inorganic insulating film such as an oxide insulating film, a nitride insulating film, an oxynitride insulating film, or a nitride oxide insulating film can be used, for example. Examples of the oxide insulating film include a silicon oxide film, an aluminum oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film.

The protective layer 131 preferably includes a nitride insulating film or a nitride oxide insulating film, and further preferably includes a nitride insulating film.

For the protective layer 131, an inorganic film containing an In—Sn oxide (also referred to as ITO), an In—Zn oxide, a Ga—Zn oxide, an Al—Zn oxide, an indium gallium zinc oxide (In—Ga—Zn oxide, also referred to as IGZO), or the like can also be used. The inorganic film preferably has high resistance, specifically, higher resistance than the common electrode 115. The inorganic film may further contain nitrogen.

When light emitted from the light-emitting device is extracted through the protective layer 131, the protective layer 131 preferably has a high property of transmitting visible light. For example, ITO, IGZO, and aluminum oxide are preferable because they are inorganic materials having a high property of transmitting visible light.

The protective layer 131 can have, for example, a stacked-layer structure of an aluminum oxide film and a silicon nitride film over the aluminum oxide film, or a stacked-layer structure of an aluminum oxide film and an IGZO film over the aluminum oxide film. Such a stacked-layer structure can inhibit entry of impurities (such as water and oxygen) into the EL layer.

Furthermore, the protective layer 131 may include an organic film. For example, the protective layer 131 may include both an organic film and an inorganic film.

The protective layer 131 may have a stacked-layer structure of two layers which are formed by different deposition methods. Specifically, the first layer of the protective layer 131 may be formed by an ALD method and the second layer of the protective layer 131 may be formed by a sputtering method.

In the display apparatus of this embodiment, top end portions of the pixel electrode are not covered with an insulating layer. This allows the interval between adjacent light-emitting devices to be extremely short. As a result, the display apparatus can have high resolution or high definition.

Figure 3A:
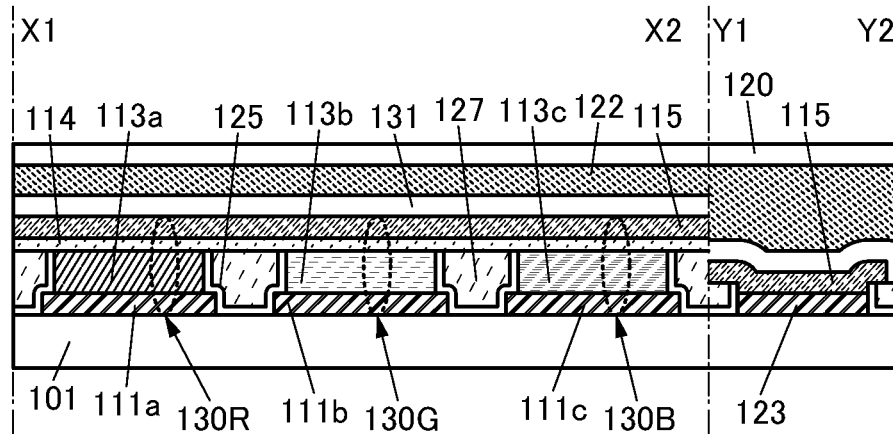
FIG. 3A to FIG. 3C are cross-sectional views illustrating examples of a display apparatus.
Figure 3B:
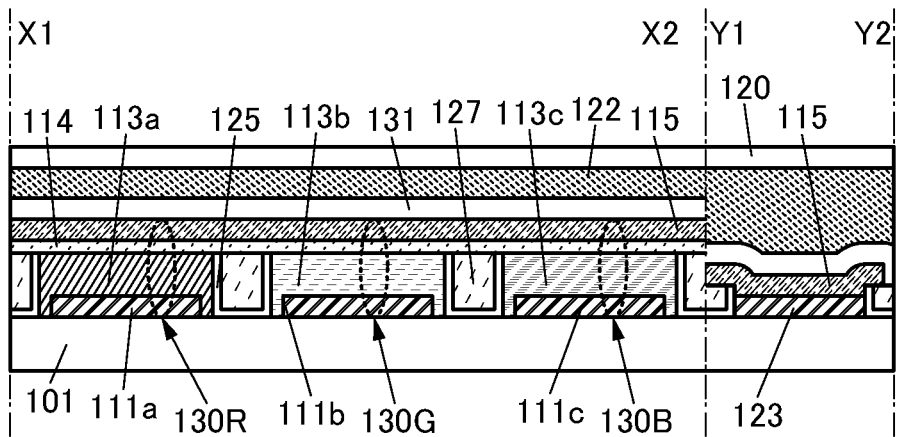

The size relationships between the pixel electrode 111a and the first layer 113a, between the pixel electrode 111b and the second layer 113b, between the pixel electrode 111c and the third layer 113c, and the like are not particularly limited. FIG. 1B illustrates an example where the end portion of the pixel electrode 111a and the end portion of the first layer 113a are aligned or substantially aligned with each other. FIG. 3A illustrates an example where the end portion of the first layer 113a is positioned on the inner side of the end portion of the pixel electrode 111a. In FIG. 3A, the end portion of the first layer 113a is positioned over the pixel electrode 111a. FIG. 3B illustrates an example where the end portion of the first layer 113a is positioned on the outer side of the end portion of the pixel electrode 111a. In FIG. 3B, the first layer 113a is provided to cover the end portion of the pixel electrode 111a.

In the case where end portions are aligned or substantially aligned with each other and the case where top surface shapes are the same or substantially the same, it can be said that outlines of stacked layers at least partly overlap with each other in a top view. For example, the case of processing an upper layer and a lower layer with the use of the same mask pattern or mask patterns that are partly the same is included. However, in some cases, the outlines do not completely overlap with each other and the upper layer is positioned on the inner side of the lower layer or the upper layer is positioned on the outer side of the lower layer; such a case is also represented as "end portions are substantially aligned with each other" or "top surface shapes are substantially the same".

Figure 3C:
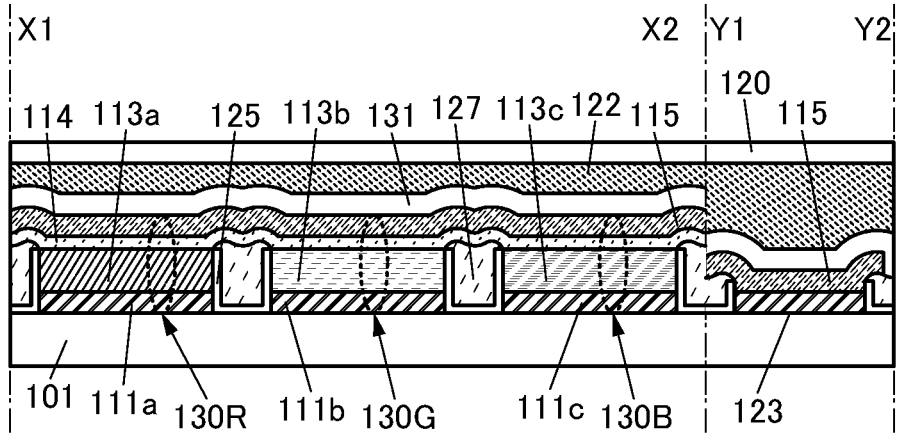

FIG. 3C illustrates a variation example of the insulating layer 127. In the cross-sectional view of FIG. 3C, the top surface of the insulating layer 127 has a shape that is gently bulged toward the center, i.e., has a convex curved surface, and has a shape that is recessed in the center and its vicinity, i.e., has a concave curved surface.

FIG. 4A to FIG. 4F each illustrate a cross-sectional structure of a region 139 including the insulating layer 127 and its surroundings.

Figure 4A:
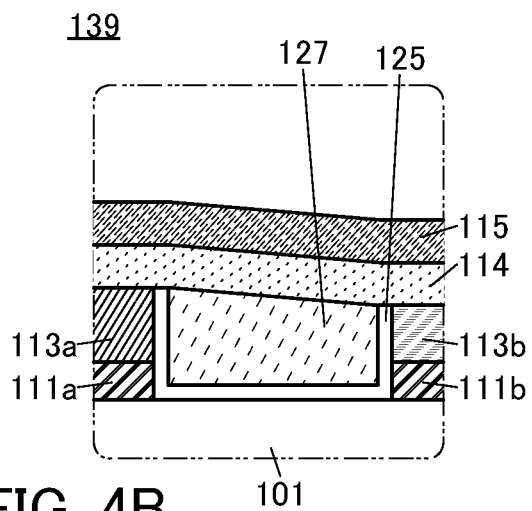
FIG. 4A to FIG. 4F are cross-sectional views illustrating examples of a display apparatus.

FIG. 4A illustrates an example where the first layer 113a and the second layer 113b have different thicknesses. The level of the top surface of the insulating layer 125 is equal to or substantially equal to the level of the top surface of the first layer 113a on the first layer 113a side, and is equal to or substantially equal to the level of the top surface of the second layer 113b on the second layer 113b side. The top surface of the insulating layer 127 has a gentle slope such that the side closer to the first layer 113a is higher and the side closer to the second layer 113b is lower. In this manner, the levels of the insulating layer 125 and the insulating layer 127 are preferably equal to the level of the top surface of the adjacent EL layer. Alternatively, the top surface of the insulating layer 125 or the insulating layer 127 may have a flat portion that is level with the top surface of any adjacent EL layer.

Figure 4B:
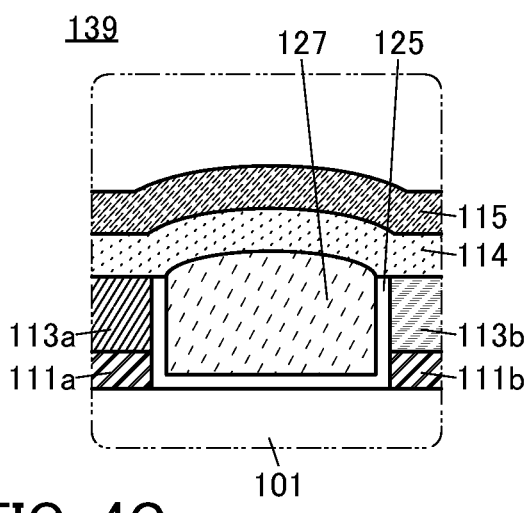

In FIG. 4B, the top surface of the insulating layer 127 includes a region that is at a higher level than the top surface of the first layer 113a and the top surface of the second layer 113b. As illustrated in FIG. 4B, it can be said that the top surface of the insulating layer 127 has a shape that is bulged in the center and its vicinity, i.e., has a convex curved surface, in the cross-sectional view.

Figure 4C:
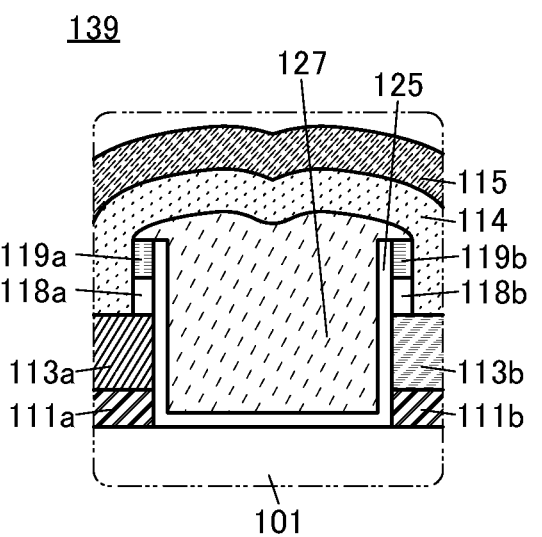

In the cross-sectional view of FIG. 4C, the top surface of the insulating layer 127 has a shape that is gently bulged toward the center, i.e., has a convex curved surface, and has a shape that is recessed in the center and its vicinity, i.e., has a concave curved surface. The insulating layer 127 includes a region that is at a higher level than the top surface of the first layer 113a and the top surface of the second layer 113b. In the region 139, the display apparatus includes at least one of a sacrificial layer 118a and a sacrificial layer 119a, the insulating layer 127 includes a first region that is at a higher level than the top surface of the first layer 113a and the top surface of the second layer 113b and positioned on the outer side of the insulating layer 125, and the first region is positioned over at least one of the sacrificial layer 118a and the sacrificial layer 119a. In addition, in the region 139, the display apparatus includes at least one of a sacrificial layer 118b and a sacrificial layer 119b, the insulating layer 127 includes a second region that is at a higher level than the top surface of the first layer 113a and the top surface of the second layer 113b and positioned on the outer side of the insulating layer 125, and the second region is positioned over at least one of the sacrificial layer 118b and the sacrificial layer 119b.

Figure 4D:
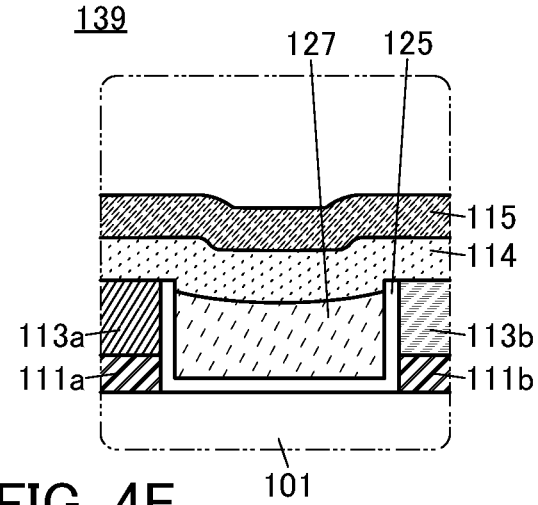

In FIG. 4D, the top surface of the insulating layer 127 includes a region that is at a lower level than the top surface of the first layer 113a and the top surface of the second layer 113b. Moreover, in the cross-sectional view, the top surface of the insulating layer 127 has a shape that is recessed in the center and its vicinity, i.e., has a concave curved surface.

Figure 4E:
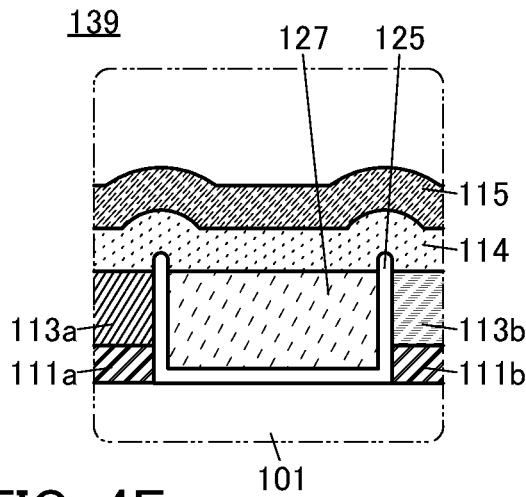

In FIG. 4E, the top surface of the insulating layer 125 includes a region that is at a higher level than the top surface of the first layer 113a and the top surface of the second layer 113b. That is, the insulating layer 125 protrudes from formation surface of the fourth layer 114 and forms a projecting portion.

In formation of the insulating layer 125, for example, when the insulating layer 125 is formed such that its level is equal to or substantially equal to the level of the sacrificial layer, a protruding portion of the insulating layer 125 may be formed as illustrated in FIG. 4E.

Figure 4F:
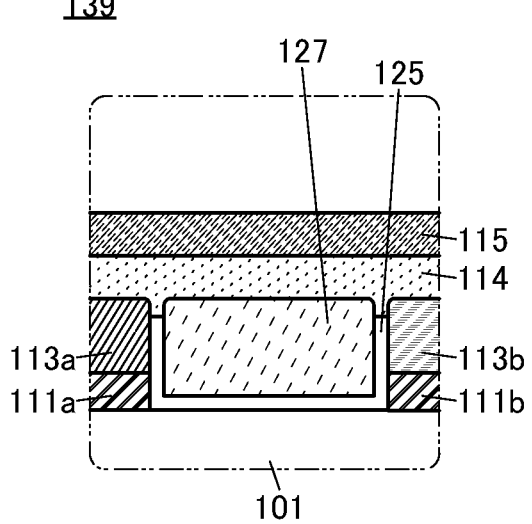

In FIG. 4F, the top surface of the insulating layer 125 includes a region that is at a lower level than the top surface of the first layer 113a and the top surface of the second layer 113b. That is, the insulating layer 125 forms a depressed portion on the formation surface of the fourth layer 114.

As described above, the insulating layer 125 and the insulating layer 127 can have a variety of shapes.

As the sacrificial layer, one or more kinds of inorganic films such as a metal film, an alloy film, a metal oxide film, a semiconductor film, and an inorganic insulating film can be used, for example.

For the sacrificial layer, a metal material such as gold, silver, platinum, magnesium, nickel, tungsten, chromium, molybdenum, iron, cobalt, copper, palladium, titanium, aluminum, yttrium, zirconium, or tantalum or an alloy material containing the metal material can be used, for example.

For the sacrificial layer, a metal oxide such as an In—Ga—Zn oxide can be used. As the sacrificial layer, an In—Ga—Zn oxide film can be formed by a sputtering method, for example. Furthermore, an indium oxide, an In—Zn oxide, an In—Sn oxide, an indium titanium oxide (In—Ti oxide), an indium tin zinc oxide (In—Sn—Zn oxide), an indium titanium zinc oxide (In—Ti—Zn oxide), an indium gallium tin zinc oxide (In—Ga—Sn—Zn oxide), or the like can be used. Alternatively, an indium tin oxide containing silicon or the like can also be used.

In addition, in place of gallium described above, an element M (M is one or more kinds selected from aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like) may be used.

As the sacrificial layer, any of a variety of inorganic insulating films that can be used as the protective layer 131 can be used. In particular, an oxide insulating film is preferable because its adhesion to the EL layer is higher than that of a nitride insulating film. For example, an inorganic insulating material such as aluminum oxide, hafnium oxide, or silicon oxide can be used for the sacrificial layer. As the sacrificial layer, an aluminum oxide film can be formed by an ALD method, for example. The use of an ALD method is preferable, in which case damage to a base (in particular, the EL layer or the like) can be reduced. As the sacrificial layer, a silicon nitride film can be formed by a sputtering method, for example.

For example, the sacrificial layer can employ a stacked-layer structure of an inorganic insulating film (e.g., an aluminum oxide film) formed by an ALD method and an In—Ga—Zn oxide film formed by a sputtering method. Alternatively, the sacrificial layer can employ a stacked-layer structure of an inorganic insulating film (e.g., an aluminum oxide film) formed by an ALD method and an aluminum film, a tungsten film, or an inorganic insulating film (e.g., a silicon nitride film) formed by a sputtering method.

In this specification and the like, a device fabricated using a metal mask or an FMM (fine metal mask or a high-resolution metal mask) is sometimes referred to as a device having an FMM structure or a device having an MM (metal mask) structure. In this specification and the like, a device fabricated without using a metal mask or an FMM is sometimes referred to as a device having an MML (metal maskless) structure.

In the case where a display apparatus with the FMM structure is formed, there might be limitation on the pixel arrangement structure or the like. Here, the FMM structure will be described below.

In the case where a display apparatus with the FMM structure is fabricated, a metal mask (also referred to as an FMM) provided with an opening portion so that an EL layer is formed in a desired region in formation of the EL layer is set to be opposed to a substrate. Then, the EL layer is formed in the desired region by evaporation through the FMM. When the size of the substrate is larger, the size of the FMM is also increased and accordingly the weight thereof is also increased. In addition, heat or the like is applied to the FMM at the time of evaporation and might change the shape of the FMM. Furthermore, there is a method in which evaporation is performed while a certain level of tension is applied to the FMM: therefore, the weight and strength of the FMM are important parameters.

Therefore, a pixel arrangement structure in a display apparatus with the FMM structure needs to be designed under certain restrictions: for example, the above-described parameters and the like need to be considered. In contrast, the display apparatus of one embodiment of the present invention is fabricated using the MML structure, and thus offers an excellent effect such as higher flexibility in the pixel arrangement structure or the like than the FMM structure. This structure has extremely high compatibility with a flexible device or the like, for example, and thus one or both of a pixel and a driver circuit can have a variety of circuit arrangements.

In this specification and the like, a structure in which light-emitting layers in light-emitting devices of different colors (here, blue (B), green (G), and red (R)) are separately formed or separately patterned is sometimes referred to as an SBS (Side By Side) structure. The SBS structure allows optimization of materials and structures of light-emitting devices and thus can extend freedom of choice of the materials and the structures, which makes it easy to improve the luminance and the reliability.

In this specification and the like, a light-emitting device capable of emitting white light is sometimes referred to as a white-light-emitting device. Note that a combination of white-light-emitting devices with coloring layers (e.g., color filters) enables a full-color display apparatus.

Light-emitting devices can be classified roughly into a single structure and a tandem structure. A device having a single structure includes one light-emitting unit between a pair of electrodes, and the light-emitting unit preferably includes one or more light-emitting layers. When white light emission is obtained using two light-emitting layers, the two light-emitting layers are selected such that emission colors of the light-emitting layers are complementary colors. For example, when the emission color of a first light-emitting layer and the emission color of a second light-emitting layer are complementary colors, the light-emitting device can be configured to emit white light as a whole. In the case where white light emission is obtained using three or more light-emitting layers, the light-emitting device is configured to emit white light as a whole by combining emission colors of the three or more light-emitting layers.

A device having a tandem structure includes two or more light-emitting units between a pair of electrodes, and each light-emitting unit preferably includes one or more light-emitting layers. To obtain white light emission, the structure is made so that light from light-emitting layers of the plurality of light-emitting units can be combined to be white light. Note that a structure for obtaining white light emission is similar to that in the case of a single structure. In the device having the tandem structure, a charge-generation layer is suitably provided between the plurality of light-emitting units.

When the white-light-emitting device (having a single structure or a tandem structure) and a light-emitting device having the SBS structure are compared to each other, the light-emitting device having the SBS structure can have lower power consumption than the white-light-emitting device. To reduce power consumption, a light-emitting device having the SBS structure is preferably used. Meanwhile, the white-light-emitting device is preferable in terms of lower manufacturing cost or higher yield because the manufacturing process of the white-light-emitting device is simpler than that of a light-emitting device having the SBS structure.

In the display apparatus of this embodiment, the distance between the light-emitting devices can be short. Specifically, the distance between the light-emitting devices, the distance between the EL layers, or the distance between the pixel electrodes can be less than 10 μm, less than or equal to 5 μm, less than or equal to 3 μm, less than or equal to 2 μm, less than or equal to 1 μm, less than or equal to 500 nm, less than or equal to 200 nm, less than or equal to 100 nm, less than or equal to 90 nm, less than or equal to 70 nm, less than or equal to 50 nm, less than or equal to 30 nm, less than or equal to 20 nm, less than or equal to 15 nm, or less than or equal to 10 nm. In other words, the display apparatus includes a region where the interval between the side surface of the first layer 113a and the side surface of the second layer 113b or the interval between the side surface of the second layer 113b and the side surface of the third layer 113c is less than or equal to 1 μm, preferably less than or equal to 0.5 μm (500 nm), further preferably less than or equal to 100 nm.

A light-blocking layer may be provided on the surface of the substrate 120 on the resin layer 122 side. Any of a variety of optical members can be arranged on the outer surface of the substrate 120. Examples of the optical members include a polarizing plate, a retardation plate, a light diffusion layer (e.g., a diffusion film), an anti-reflective layer, and a light-condensing film. Furthermore, an antistatic film inhibiting the attachment of dust, a water repellent film inhibiting the attachment of stain, a hard coat film inhibiting generation of a scratch caused by the use, an impact-absorbing layer, or the like may be placed on the outer surface of the substrate 120.

For the substrate 120, glass, quartz, ceramic, sapphire, a resin, a metal, an alloy, a semiconductor, or the like can be used. The substrate on the side from which light from the light-emitting device is extracted is formed using a material that transmits the light. When the substrate 120 is formed using a flexible material, the flexibility of the display apparatus can be increased and a flexible display can be achieved. Furthermore, a polarizing plate may be used as the substrate 120.

For the substrate 120, any of the following can be used, for example: polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. Glass that is thin enough to have flexibility may be used as the substrate 120.

In the case where a circularly polarizing plate overlaps with the display apparatus, a highly optically isotropic substrate is preferably used as the substrate included in the display apparatus. A highly optically isotropic substrate has a low birefringence (in other words, a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of the films having high optical isotropy include a triacetyl cellulose (TAC, also referred to as cellulose triacetate) film, a cycloolefin polymer (COP) film, a cycloolefin copolymer (COC) film, and an acrylic film.

In the case where a film is used for the substrate and the film absorbs water, the shape of a display panel might be changed, e.g., creases are generated. Thus, for the substrate, a film with a low water absorption rate is preferably used. For example, the water absorption rate of the film is preferably lower than or equal to 1%, further preferably lower than or equal to 0.1%, still further preferably lower than or equal to 0.01%.

For the resin layer 122, a variety of curable adhesives such as a photocurable adhesive like an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferable. A two-component-mixture-type resin may be used. An adhesive sheet or the like may be used.

Examples of materials that can be used for a gate, a source, and a drain of a transistor and conductive layers such as a variety of wirings and electrodes included in a display apparatus include metals such as aluminum, titanium, chromium, nickel, copper, yttrium, zirconium, molybdenum, silver, tantalum, or tungsten, and an alloy containing any of these metals as its main component. A single layer or a stacked-layer structure of a film containing any of these materials can be used.

For a conductive material having a light-transmitting property, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, or an alloy material containing the metal material can be used. Further alternatively, a nitride of the metal material (e.g., titanium nitride) or the like may be used. Note that in the case of using the metal material or the alloy material (or the nitride thereof), the thickness is preferably set small enough to have a light-transmitting property. A stacked film of any of the above materials can be used as a conductive layer. For example, a stacked film of indium tin oxide and an alloy of silver and magnesium, or the like is preferably used for increased conductivity. These materials can also be used for conductive layers such as a variety of wirings and electrodes included in the display apparatus, and conductive layers (e.g., a conductive layer functioning as the pixel electrode or the common electrode) included in the light-emitting device.

For an insulating material that can be used for each insulating layer, for example, a resin such as an acrylic resin or an epoxy resin, and an inorganic insulating material such as silicon oxide, silicon oxynitride, silicon nitride oxide, silicon nitride, or aluminum oxide can be given.

Next, materials that can be used for the light-emitting device will be described.

A conductive film that transmits visible light is used as the electrode through which light is extracted among the pixel electrode and the common electrode. A conductive film that reflects visible light is preferably used as the electrode through which light is not extracted.

As a material that forms the pair of electrodes (the pixel electrode and the common electrode) of the light-emitting device, a metal, an alloy, an electrically conductive compound, a mixture thereof, and the like can be used as appropriate. Specific examples include an indium tin oxide (In—Sn oxide, also referred to as ITO), an In—Si—Sn oxide (also referred to as ITSO), an indium zinc oxide (In—Zn oxide), an In—W—Zn oxide, an alloy containing aluminum (an aluminum alloy) such as an alloy of aluminum, nickel, and lanthanum (Al—Ni—La), and an alloy containing silver such as an alloy of silver and magnesium and an alloy of silver, palladium, and copper (Ag—Pd—Cu, also referred to as APC). In addition, it is possible to use a metal such as aluminum (Al), magnesium (Mg), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use a Group 1 element or a Group 2 element in the periodic table, which is not described above (e.g., lithium (Li), cesium (Cs), calcium (Ca), or strontium (Sr)), a rare earth metal such as europium (Eu) or ytterbium (Yb), an alloy containing an appropriate combination of any of these elements, graphene, or the like.

The light-emitting device preferably employs a microcavity structure. Therefore, one of the pair of electrodes of the light-emitting device is preferably an electrode having properties of transmitting and reflecting visible light (a semi-transmissive and semi-reflective electrode), and the other is preferably an electrode having a property of reflecting visible light (a reflective electrode). When the light-emitting device has a microcavity structure, light obtained from the light-emitting layer can be resonated between the electrodes, whereby light emitted from the light-emitting device can be intensified.

The semi-transmissive and semi-reflective electrode can have a stacked-layer structure of a reflective electrode and an electrode having a property of transmitting visible light (also referred to as a transparent electrode).

The transparent electrode has a light transmittance higher than or equal to 40%. For example, an electrode having a visible light (light at wavelengths greater than or equal to 400 nm and less than 750 nm) transmittance higher than or equal to 40% is preferably used in the light-emitting device. The visible light reflectance of the semi-transmissive and semi-reflective electrode is higher than or equal to 10% and lower than or equal to 95%, preferably higher than or equal to 30% and lower than or equal to 80%. The visible light reflectance of the reflective electrode is higher than or equal to 40% and lower than or equal to 100%, preferably higher than or equal to 70% and lower than or equal to 100%. These electrodes preferably have a resistivity of $1\times10^{-2}$ Ωcm or lower.

The first layer 113$a$, the second layer 113$b$, and the third layer 113$c$ are each provided in an island shape. The first layer 113$a$, the second layer 113$b$, and the third layer 113$c$ each include a light-emitting layer. The first layer 113$a$, the second layer 113$b$, and the third layer 113$c$ preferably include the light-emitting layers that emit light of different colors.

The light-emitting layer is a layer containing a light-emitting substance. The light-emitting layer can include one or more kinds of light-emitting substances. As the light-emitting substance, a substance that exhibits an emission color of blue, violet, bluish violet, green, yellowish green, yellow, orange, red, or the like is used as appropriate. Alternatively, as the light-emitting substance, a substance that emits near-infrared light can be used.

Examples of the light-emitting substance include a fluorescent material, a phosphorescent material, a TADF material, and a quantum dot material.

Examples of the fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (in particular, an iridium complex) having a 4H-triazole skeleton, a 1H-triazole skeleton, an imidazole skeleton, a pyrimidine skeleton, a pyrazine skeleton, or a pyridine skeleton: an organometallic complex (in particular, an iridium complex) having a phenylpyridine derivative including an electron-withdrawing group as a ligand: a platinum complex: and a rare earth metal complex.

The light-emitting layer may contain one or more kinds of organic compounds (e.g., a host material and an assist material) in addition to the light-emitting substance (a guest material). As one or more kinds of organic compounds, one or both of the hole-transport material and the electron-transport material can be used. Alternatively, as one or more kinds of organic compounds, a bipolar material or a TADF material may be used.

The light-emitting layer preferably includes, for example, a phosphorescent material and a combination of a hole-transport material and an electron-transport material that easily forms an exciplex. With such a structure, light emission can be efficiently obtained by ExTET (Exciplex-Triplet Energy Transfer), which is energy transfer from an exciplex to a light-emitting substance (a phosphorescent material). When a combination of materials is selected to form an exciplex that exhibits light emission whose wavelength overlaps with the wavelength of the lowest-energy-side absorption band of the light-emitting substance, energy can be transferred smoothly and light emission can be obtained efficiently. With the above structure, high efficiency, low-voltage driving, and a long lifetime of a light-emitting device can be achieved at the same time.

In addition to the light-emitting layer, the first layer 113$a$, the second layer 113$b$, and the third layer 113$c$ may further include layers containing a substance with a high hole-injection property, a substance with a high hole-transport property (also referred to as a hole-transport material), a hole-blocking material, a substance with a high electron-transport property (also referred to as an electron-transport material), a substance with a high electron-injection property, an electron-blocking material, a substance with a bipolar property (also referred to as a substance with a high electron-transport property and a high hole-transport property or a bipolar material), and the like.

For example, the first layer 113$a$, the second layer 113$b$, and the third layer 113$c$ may each include one or more of a hole-injection layer, a hole-transport layer, a hole-blocking layer, an electron-blocking layer, an electron-transport layer, and an electron-injection layer.

In the EL layer, one or more of a hole-injection layer, a hole-transport layer, a hole-blocking layer, an electron-blocking layer, an electron-transport layer, and an electron-injection layer can be formed as a layer shared by the light-emitting devices. For example, a carrier-injection layer (a hole-injection layer or an electron-injection layer) may be formed as the fourth layer 114. Note that all the layers in the EL layer may be separately formed for the respective colors. That is, the EL layer does not necessarily include a layer formed to be shared by the light-emitting devices of different colors.

The first layer 113$a$, the second layer 113$b$, and the third layer 113$c$ each preferably include a light-emitting layer and a carrier-transport layer over the light-emitting layer. Accordingly, the light-emitting layer is inhibited from being exposed on the outermost surface in the fabrication process of the display apparatus 100, so that damage to the light-emitting layer can be reduced. Thus, the reliability of the light-emitting device can be increased.

A hole-injection layer is a layer injecting holes from an anode to a hole-transport layer, and a layer containing a substance with a high hole-injection property. Examples of the substance with a high hole-injection property include an aromatic amine compound and a composite material containing a hole-transport material and an acceptor material (electron-accepting material).

A hole-transport layer is a layer transporting holes, which are injected from an anode by a hole-injection layer, to a light-emitting layer. The hole-transport layer is a layer containing a hole-transport material. As the hole-transport material, a substance having a hole mobility greater than or equal to $1\times10^{-6}$ cm²/Vs is preferable. Note that other substances can also be used as long as the substances have a hole-transport property higher than an electron-transport property. As the hole-transport material, a substance having a high hole-transport property, such as a π-electron rich heteroaromatic compound (e.g., a carbazole derivative, a thiophene derivative, or a furan derivative) or an aromatic amine (a compound having an aromatic amine skeleton), is preferable.

An electron-transport layer is a layer transporting electrons, which are injected from a cathode by an electron-injection layer, to a light-emitting layer. The electron-transport layer is a layer containing an electron-transport material. As the electron-transport material, a substance having an electron mobility greater than or equal to $1 \times 10^{-6}$ cm$^2$/Vs is preferable. Note that other substances can also be used as long as the substances have an electron-transport property higher than a hole-transport property. As the electron-transport material, it is possible to use a substance having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound.

An electron-injection layer is a layer injecting electrons from a cathode to an electron-transport layer, and a layer containing a substance with a high electron-injection property. As the substance with a high electron-injection property, an alkali metal, an alkaline earth metal, or a compound thereof can be used. As the substance with a high electron-injection property, a composite material containing an electron-transport material and a donor material (electron-donating material) can also be used.

The electron-injection layer can be formed using an alkali metal, an alkaline earth metal, or a compound thereof, such as lithium, cesium, ytterbium, lithium fluoride (LiF), cesium fluoride (CsF), calcium fluoride (CaF$_x$, where X is a given number), 8-(quinolinolato)lithium (abbreviation: Liq), 2-(2-pyridyl)phenolatolithium (abbreviation: LiPP), 2-(2-pyridyl)-3-pyridinolato lithium (abbreviation: LiPPy), 4-phenyl-2-(2-pyridyl)phenolatolithium (abbreviation: LiPPP), lithium oxide (LiO$_x$), or cesium carbonate, for example. In addition, the electron-injection layer may have a stacked-layer structure of two or more layers. In the stacked-layer structure, for example, lithium fluoride can be used for the first layer and ytterbium can be used for the second layer.

Alternatively, the electron-injection layer may be formed using an electron-transport material. For example, a compound having an unshared electron pair and an electron deficient heteroaromatic ring can be used as the electron-transport material. Specifically, a compound having at least one of a pyridine ring, a diazine ring (a pyrimidine ring, a pyrazine ring, and a pyridazine ring), and a triazine ring can be used.

Note that the lowest unoccupied molecular orbital (LUMO) of the organic compound having an unshared electron pair is preferably greater than or equal to −3.6 eV and less than or equal to −2.3 eV. In general, the highest occupied molecular orbital (HOMO) level and the LUMO level of an organic compound can be estimated by cyclic voltammetry (CV), photoelectron spectroscopy, optical absorption spectroscopy, inverse photoelectron spectroscopy, or the like.

For example, 4,7-diphenyl-1,10-phenanthroline (abbreviation: BPhen), 2,9-di(naphthalen-2-yl)-4,7-diphenyl-1,10-phenanthroline (abbreviation: NBPhen), diquinoxalino[2,3-a:2',3'-c]phenazine (abbreviation: HATNA), 2,4,6-tris[3'-

(pyridin-3-yl)biphenyl-3-yl]-1,3,5-triazine (abbreviation: TmPPPyTz), or the like can be used as the organic compound having an unshared electron pair. Note that NBPhen has a higher glass transition point (Tg) than BPhen and thus has high heat resistance.

In the case of fabricating a tandem light-emitting device, a charge-generation layer is provided between two light-emitting units. The charge-generation layer has a function of injecting electrons into one of the two light-emitting units and injecting holes into the other when voltage is applied between the pair of electrodes.

For the charge-generation layer, for example, a material that can be used for the electron-injection layer, such as lithium, can be suitably used. For the charge-generation layer, for example, a material that can be used for the hole-injection layer can be suitably used. For the charge-generation layer, a layer containing a hole-transport material and an acceptor material (electron-accepting material) can be used. For the charge-generation layer, a layer containing an electron-transport material and a donor material can be used. Forming such a charge-generation layer can inhibit an increase in the driving voltage in the case of stacking light-emitting units.

Either a low molecular compound or a high molecular compound can be used in the light-emitting device, and an inorganic compound may also be included. Each layer included in the light-emitting device can be formed by a method such as an evaporation method (including a vacuum evaporation method), a transfer method, a printing method, an inkjet method, or a coating method.

Fabrication Method Example 1 of Display Apparatus

Next, an example of a method for fabricating a display apparatus is described with reference to FIG. 5 and FIG. 6. FIG. 5A to FIG. 5C and FIG. 6A to FIG. 6C each illustrate a cross-sectional view along the dashed-dotted line X1-X2 and a cross-sectional view along the dashed-dotted line Y1-Y2 in FIG. 1A side by side.

Thin films included in the display apparatus (e.g., insulating films, semiconductor films, and conductive films) can be formed by a sputtering method, a CVD method, a vacuum evaporation method, a PLD method, an ALD method, or the like. Examples of a CVD method include a PECVD method and a thermal CVD method. As an example of the thermal CVD method, a metal organic chemical vapor deposition (MOCVD: Metal Organic CVD) method can be given.

Alternatively, the thin films that form the display apparatus (insulating films, semiconductor films, conductive films, and the like) can be formed by a method such as spin coating, dipping, spray coating, ink-jetting, dispensing, screen printing, offset printing, doctor blade coating, slit coating, roll coating, curtain coating, or knife coating.

Specifically, for fabrication of the light-emitting device, a vacuum process such as an evaporation method and a solution process such as a spin coating method or an inkjet method can be used. Examples of an evaporation method include physical vapor deposition methods (PVD methods) such as a sputtering method, an ion plating method, an ion beam evaporation method, a molecular beam evaporation method, and a vacuum evaporation method, and a chemical vapor deposition method (CVD method). Specifically, the functional layers (e.g., the hole-injection layer, the hole-transport layer, the light-emitting layer, the electron-transport layer, and the electron-injection layer) included in the EL layers can be formed by an evaporation method (e.g., a vacuum evaporation method), a coating method (e.g., a dip coating method, a die coating method, a bar coating method, a spin coating method, or a spray coating method), a printing method (e.g., an ink-jet method, a screen printing (stencil) method, an offset printing (planography) method, a flexography (relief printing) method, a gravure printing method, or a micro-contact printing method), or the like.

Thin films that constitute the display apparatus can be processed by a photolithography method or the like. Alternatively, thin films may be processed by a nanoimprinting method, a sandblasting method, a lift-off method, or the like. Alternatively, island-shaped thin films may be directly formed by a deposition method using a shielding mask such as a metal mask.

There are the following two typical examples of a photolithography method. In one of the methods, a resist mask is formed over a thin film that is to be processed, the thin film is processed by etching or the like, and then the resist mask is removed. In the other method, a photosensitive thin film is formed and then processed into a desired shape by light exposure and development.

As the light used for light exposure in the photolithography method, for example, an i-line (with a wavelength of 365 nm), a g-line (with a wavelength of 436 nm), an h-line (with a wavelength of 405 nm), or combined light of any of them can be used. Alternatively, ultraviolet light, KrF laser light, ArF laser light, or the like can be used. In addition, light exposure may be performed by liquid immersion exposure technique. As the light used for the light exposure, extreme ultraviolet (EUV) light or X-rays may be used. Furthermore, instead of the light used for the light exposure, an electron beam can also be used. It is preferable to use extreme ultraviolet light, X-rays, or an electron beam because they can perform extremely fine processing. Note that a photomask is not needed when light exposure is performed by scanning with a beam such as an electron beam.

For etching of thin films, a dry etching method, a wet etching method, a sandblasting method, or the like can be used.

Figures 5A, 5B, 5C:
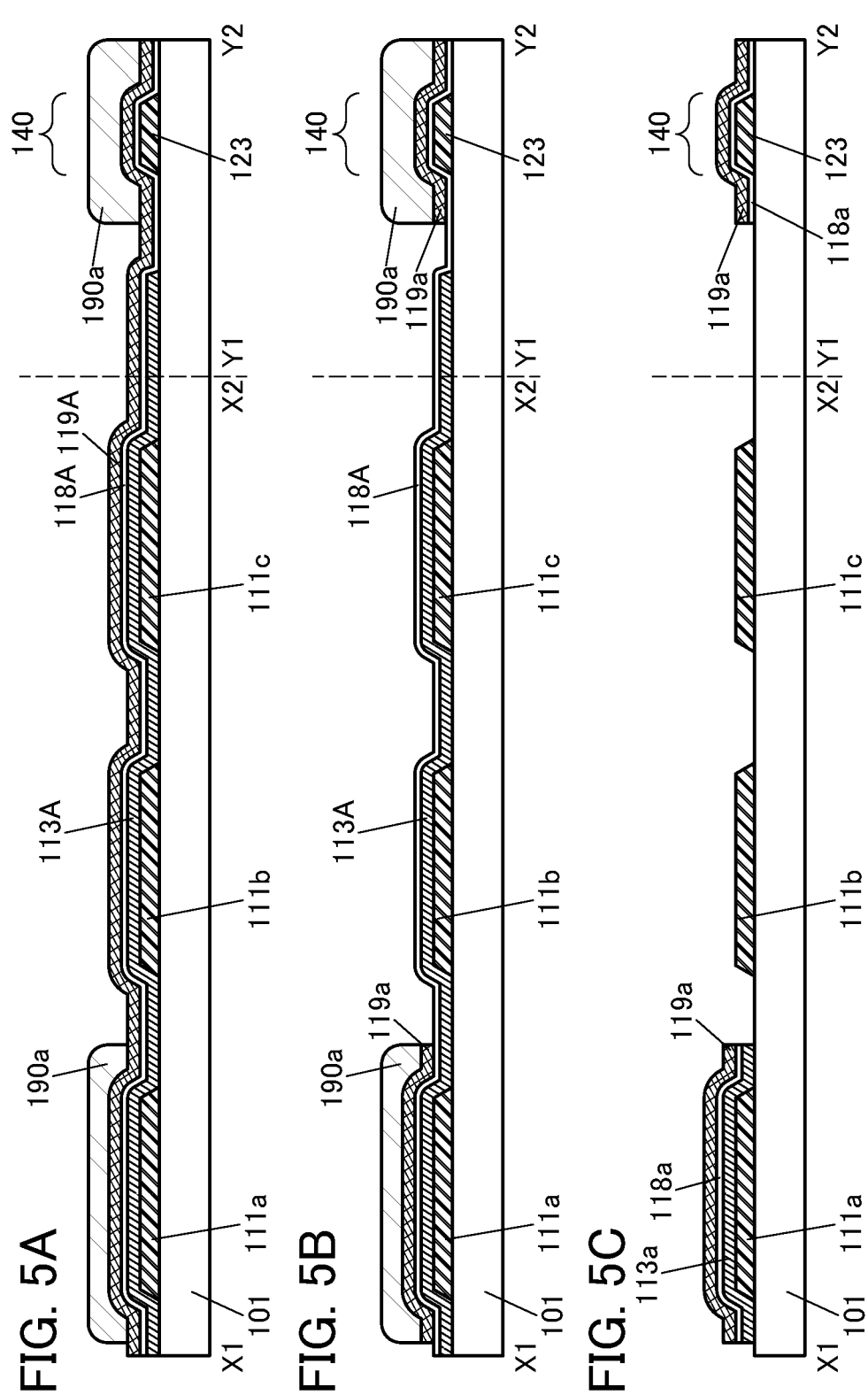
FIG. 5A to FIG. 5C are cross-sectional views illustrating an example of a method for fabricating a display apparatus.

First, as illustrated in FIG. 5A, the pixel electrodes 111a, 111b, and 111c and the conductive layer 123 are formed over the layer 101 including transistors, a first layer 113A is formed over the pixel electrodes 111a, 111b, and 111c, a first sacrificial layer 118A is formed over the first layer 113A, and a second sacrificial layer 119A is formed over the first sacrificial layer 118A.

As illustrated in FIG. 5A, in the cross-sectional view along Y1-Y2, an end portion of the first layer 113A on the connection portion 140 side is positioned on the inner side (closer to the display portion) than an end portion of the first sacrificial layer 118A. For example, by using a mask for specifying a film formation area (also referred to as an area mask or a rough metal mask to be distinguished from a fine metal mask), the first layer 113A can be formed in a region different from a region where the first sacrificial layer 118A and the second sacrificial layer 119A are formed. In one embodiment of the present invention, the light-emitting device is formed using a resist mask: by using a combination of a resist mask and an area mask as described above, the light-emitting device can be fabricated in a relatively simple process.

The above-described structure that can be used for the pixel electrode can be used for the pixel electrodes 111a, 111b, and 111c. The pixel electrodes 111a, 111b, and 111c can be formed by a sputtering method or a vacuum evaporation method, for example.

The pixel electrodes 111a, 111b, and 111c each preferably have a tapered shape. This can improve the coverage with the layers formed over the pixel electrodes 111a, 111b, and 111c and improve the yield of the light-emitting devices.

Note that in this specification and the like, a tapered shape refers to a shape in which at least part of a side surface of a structure is inclined to a substrate surface or a formation surface. For example, a tapered shape preferably includes a region where the angle between the inclined side surface and the substrate surface or the formation surface (such an angle is also referred to as a taper angle) is less than 90°.

The first layer 113A is a layer to be the first layer 113a later. Therefore, the first layer 113A can have the above-described structure that can be employed for the first layer 113a. The first layer 113A can be formed by an evaporation method (including a vacuum evaporation method), a transfer method, a printing method, an inkjet method, a coating method, or the like. The first layer 113A is preferably formed by an evaporation method. A premix material may be used in the deposition by an evaporation method. Note that in this specification and the like, a premix material is a composite material in which a plurality of materials are combined or mixed in advance.

As the first sacrificial layer 118A and the second sacrificial layer 119A, a film that is highly resistant to the process conditions for the first layer 113A, a second layer 113B and a third layer 113C to be formed later, and the like, specifically, a film having high etching selectivity with EL layers is used.

The first sacrificial layer 118A and the second sacrificial layer 119A can be formed by a sputtering method, an ALD method (including a thermal ALD method and a PEALD method), a CVD method, or a vacuum evaporation method, for example. The first sacrificial layer 118A, which is formed over and in contact with the EL layer, is preferably formed by a formation method that causes less damage to the EL layer than a formation method for the second sacrificial layer 119A. For example, the first sacrificial layer 118A is preferably formed by an ALD method or a vacuum evaporation method rather than a sputtering method. The first sacrificial layer 118A and the second sacrificial layer 119A are formed at a temperature lower than the upper temperature limit of the EL layer. The typical substrate temperatures in formation of the first sacrificial layer 118A and the second sacrificial layer 119A are each lower than or equal to 200° C., preferably lower than or equal to 150° C., further preferably lower than or equal to 120° C., still further preferably lower than or equal to 100° C., yet still further preferably lower than or equal to 80° C.

The first sacrificial layer 118A and the second sacrificial layer 119A are preferably films that can be removed by a wet etching method. Using a wet etching method can reduce damage to the first layer 113A in processing of the first sacrificial layer 118A and the second sacrificial layer 119A, compared to the case of using a dry etching method.

The first sacrificial layer 118A is preferably a film having high etching selectivity with the second sacrificial layer 119A.

In the method for fabricating a display apparatus of this embodiment, it is desirable that the layers (e.g., the hole-injection layer, the hole-transport layer, the light-emitting layer, and the electron-transport layer) included in the EL layer not be easily processed in the step of processing the sacrificial layers, and that the sacrificial layers not be easily processed in the steps of processing the layers included in the EL layer. In consideration of the above, the materials and a processing method for the sacrificial layers and processing methods for the EL layer are desirably selected.

Although this embodiment describes an example where the sacrificial layer is formed to have a two-layer structure of the first sacrificial layer and the second sacrificial layer, the sacrificial layer may have a single-layer structure or a stacked-layer structure of three or more layers.

As the first sacrificial layer 118A and the second sacrificial layer 119A, it is preferable to use an inorganic film such as a metal film, an alloy film, a metal oxide film, a semiconductor film, or an inorganic insulating film, for example.

For each of the first sacrificial layer 118A and the second sacrificial layer 119A, it is possible to use a metal material such as gold, silver, platinum, magnesium, nickel, tungsten, chromium, molybdenum, iron, cobalt, copper, palladium, titanium, aluminum, yttrium, zirconium, or tantalum or an alloy material containing any of the metal materials, for example. It is particularly preferable to use a low-melting-point material such as aluminum or silver. The use of a metal material capable of blocking ultraviolet light for one or both of the first sacrificial layer 118A and the second sacrificial layer 119A is preferable, in which case the EL layer can be inhibited from being irradiated with ultraviolet light and deteriorating.

For each of the first sacrificial layer 118A and the second sacrificial layer 119A, a metal oxide such as In—Ga—Zn oxide can be used. As the first sacrificial layer 118A or the second sacrificial layer 119A, an In—Ga—Zn oxide film can be formed by a sputtering method, for example. Furthermore, indium oxide, In—Zn oxide, In—Sn oxide, indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like can be used. Alternatively, indium tin oxide containing silicon or the like can also be used.

In addition, in place of gallium described above, the element M (M is one or more kinds selected from aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like) may be used.

As each of the first sacrificial layer 118A and the second sacrificial layer 119A, any of a variety of inorganic insulating films that can be used as the protective layer 131 can be used. In particular, an oxide insulating film is preferable because its adhesion to the EL layer is higher than that of a nitride insulating film. For example, an inorganic insulating material such as aluminum oxide, hafnium oxide, or silicon oxide can be used for each of the first sacrificial layer 118A and the second sacrificial layer 119A. As the first sacrificial layer 118A or the second sacrificial layer 119A, an aluminum oxide film can be formed by an ALD method, for example. The use of an ALD method is preferable, in which case damage to a base (in particular, the EL layer or the like) can be reduced.

For example, an inorganic insulating film (e.g., an aluminum oxide film) formed by an ALD method can be used as the first sacrificial layer 118A, and an inorganic film (e.g., an In—Ga—Zn oxide film, an aluminum film, or a tungsten film) formed by a sputtering method can be used as the second sacrificial layer 119A.

Note that the same inorganic insulating film can be used for both the first sacrificial layer 118A and the insulating layer 125 that is to be formed later. For example, an aluminum oxide film formed by an ALD method can be used for both the first sacrificial layer 118A and the insulating layer 125. For the first sacrificial layer 118A and the insulating layer 125, the same deposition condition may be used or different deposition conditions may be used. For example, when the first sacrificial layer 118A is formed under conditions similar to those of the insulating layer 125, the first sacrificial layer 118A can be an insulating layer having a high barrier property against at least one of water and oxygen. Meanwhile, the first sacrificial layer 118A is a layer almost or all of which is to be removed in a later step, and thus is preferably easy to process. Therefore, the first sacrificial layer 118A is preferably formed under a condition where the substrate temperature in formation is lower than that for the insulating layer 125.

A material dissolvable in a solvent that is chemically stable with respect to at least a film on the outermost side of the first layer 113A may be used for one or both of the first sacrificial layer 118A and the second sacrificial layer 119A. Specifically, a material that can be dissolved in water or alcohol can be suitably used. In forming a film of such a material, it is preferable to apply the material dissolved in a solvent such as water or alcohol by a wet film formation method and then perform heat treatment for evaporating the solvent. At this time, the heat treatment is preferably performed in a reduced-pressure atmosphere, in which case the solvent can be removed at a low temperature in a short time and thermal damage to the EL layer can be reduced accordingly.

The first sacrificial layer 118A and the second sacrificial layer 119A may each be formed by a wet film formation method such as spin coating, dipping, spray coating, ink-jetting, dispensing, screen printing, offset printing, a doctor knife method, slit coating, roll coating, curtain coating, or knife coating.

The first sacrificial layer 118A and the second sacrificial layer 119A may each be formed using an organic material such as polyvinyl alcohol (PVA), polyvinyl butyral, polyvinylpyrrolidone, polyethylene glycol, polyglycerin, pullulan, water-soluble cellulose, or an alcohol-soluble polyamide resin.

Next, a resist mask 190a is formed over the second sacrificial layer 119A as illustrated in FIG. 5A. The resist mask can be formed by application of a photosensitive resin (photoresist), light exposure, and development.

The resist mask may be formed using either a positive resist material or a negative resist material.

The resist mask 190a is provided at a position overlapping with the pixel electrode 111a. One island-shaped pattern is preferably provided for one subpixel 110a as the resist mask 190a. Alternatively, one band-like pattern for a plurality of subpixels 110a aligned in one column (aligned in the Y direction in FIG. 1A) may be formed as the resist mask 190a.

Here, when a resist mask 190 is formed such that an end portion of the resist mask 190 is positioned on the outer side of an end portion of the pixel electrode 111a, an end portion of the first layer 113a to be formed later can be provided on the outer side of the end portion of the pixel electrode 111a.

Meanwhile, when the resist mask 190 is formed such that the end portion of the resist mask 190 is positioned on the inner side of the end portion of the pixel electrode 111a, the end portion of the first layer 113a to be formed later can be provided on the inner side of the end portion of the pixel electrode 111a.

Note that the resist mask 190a is preferably provided also at a position overlapping with the connection portion 140. This can inhibit the conductive layer 123 from being damaged during the fabrication process of the display apparatus.

Then, as illustrated in FIG. 5B, part of the second sacrificial layer 119A is removed using the resist mask 190a, so that the sacrificial layer 119a is formed. The sacrificial layer 119a partly remains over the pixel electrode 111a and the conductive layer 123.

In etching the second sacrificial layer 119A, an etching condition with high selectivity is preferably employed so that the first sacrificial layer 118A is not removed by the etching. Since the EL layer is not exposed in processing the second sacrificial layer 119A, the range of choices of the processing method is wider than that for processing the first sacrificial layer 118A. Specifically, deterioration of the EL layer can be further inhibited even when a gas containing oxygen is used as an etching gas in processing the second sacrificial layer 119A.

After that, the resist mask 190a is removed. The resist mask 190a can be removed by ashing using oxygen plasma, for example. Alternatively, an oxygen gas and any of $CF_4$, $C_4F_8$, $SF_6$, $CHF_3$, $Cl_2$, $H_2O$, $BCl_3$, and a noble gas (also referred to as rare gas) such as He may be used. Alternatively, the resist mask 190a may be removed by wet etching. At this time, the first sacrificial layer 118A is positioned on the outermost surface and the first layer 113A is not exposed; thus, the first layer 113A can be inhibited from being damaged in the step of removing the resist mask 190a. In addition, the range of choices of the method for removing the resist mask 190a can be widened.

Next, as illustrated in FIG. 5C, part of the first sacrificial layer 118A is removed using the sacrificial layer 119a as a mask (also referred to as a hard mask), so that the sacrificial layer 118a is formed.

The first sacrificial layer 118A and the second sacrificial layer 119A can be processed by a wet etching method or a dry etching method. The first sacrificial layer 118A and the second sacrificial layer 119A are preferably processed by anisotropic etching.

Using a wet etching method can reduce damage to the first layer 113A in processing the first sacrificial layer 118A and the second sacrificial layer 119A, as compared to the case of using a dry etching method. In the case of using a wet etching method, it is preferable to use a developer, a tetramethylammonium hydroxide (TMAH) aqueous solution, dilute hydrofluoric acid, oxalic acid, phosphoric acid, acetic acid, nitric acid, or a mixed solution containing two or more of these acids, for example.

In the case of using a dry etching method, deterioration of the first layer 113A can be inhibited by not using a gas containing oxygen as the etching gas. In the case of using a dry etching method, it is preferable to use a gas containing $CF_4$, $C_4F_8$, $SF_6$, $CHF_3$, $Cl_2$, $H_2O$, or $BCl_3$ or a noble gas (also referred to as a rare gas) such as He as the etching gas, for example.

For example, when an aluminum oxide film formed by an ALD method is used as the first sacrificial layer 118A, the first sacrificial layer 118A can be processed by a dry etching method using $CHF_3$ and He. In the case where an In—Ga—Zn oxide film formed by a sputtering method is used as the second sacrificial layer 119A, the second sacrificial layer 119A can be processed by a wet etching method using diluted phosphoric acid. Alternatively, the second sacrificial layer 119A may be processed by a dry etching method using $CH_4$ and Ar. Alternatively, the second sacrificial layer 119A can be processed by a wet etching method using diluted phosphoric acid. In the case where a tungsten film formed by a sputtering method is used as the second sacrificial layer 119A, the second sacrificial layer 119A can be processed by a dry etching method using a combination of $CF_4$ and $O_2$, using a combination of $SF_6$ and $O_2$, a combination of $CF_4$, $Cl_2$, and $O_2$, or a combination of $SF_6$, $Cl_2$, and $O_2$.

Next, as illustrated in FIG. 5C, part of the first layer 113A is removed using the sacrificial layer 119a and the sacrificial layer 118a as hard masks, so that the first layer 113a is formed.

Thus, as illustrated in FIG. 5C, a stacked-layer structure of the first layer 113a, the sacrificial layer 118a, and the sacrificial layer 119a remains over the pixel electrode 111a. In the region corresponding to the connection portion 140, a stacked-layer structure of the sacrificial layer 118a and the sacrificial layer 119a remains over the conductive layer 123.

FIG. 5C illustrates an example where the end portion of the first layer 113a is positioned on the outer side of the end portion of the pixel electrode 111a. Such a structure can increase the aperture ratio of the pixel.

The first layer 113a covers the top surface and the side surface of the pixel electrode 111a and thus, the subsequent steps can be performed without exposure of the pixel electrode 111a. When the end portion of the pixel electrode 111a is exposed, corrosion might occur in the etching step or the like. A product generated by corrosion of the pixel electrode 111a might be unstable; for example, the product might be dissolved in a solution in wet etching and might be diffused in an atmosphere in dry etching. The product dissolved in a solution or scattered in an atmosphere might be attached to a surface to be processed, the side surface of the first layer 113a, and the like, which adversely affects the characteristics of the light-emitting device or forms a leakage path between the light-emitting devices in some cases. In a region where the end portion of the pixel electrode 111a is exposed, adhesion between layers in contact with each other might be lowered, which might be likely to cause peeling of the first layer 113a or the pixel electrode 111a.

With the structure in which the first layer 113a covers the top surface and the side surface of the pixel electrode 111a, for example, the yield of the light-emitting device can be improved and display quality of the light-emitting device can be improved.

Note that as illustrated in FIG. 1B, the end portion of the pixel electrode 111a and the end portion of the first layer 113a may be aligned or substantially aligned with each other. As illustrated in FIG. 3A, the end portion of the first layer 113a may be positioned on the inner side of the pixel electrode 111a.

Note that part of the first layer 113A may be removed using the resist mask 190a. Then, the resist mask 190a may be removed.

The first layer 113A is preferably processed by anisotropic etching. Anisotropic dry etching is particularly preferable. Alternatively, wet etching may be used.

In the case of using a dry etching method, deterioration of the first layer 113A can be inhibited by not using a gas containing oxygen as the etching gas.

Alternatively, a gas containing oxygen may be used as the etching gas. When the etching gas contains oxygen, the etching rate can be increased. Therefore, the etching can be performed under a low-power condition while an adequately high etching rate is maintained. Thus, damage to the first layer 113A can be inhibited. Furthermore, a defect such as attachment of a reaction product generated in the etching can be inhibited.

In the case of using a dry etching method, it is preferable to use a gas containing at least one kind of $H_2$, $CF_4$, $C_4F_8$, $SF_6$, $CHF_3$, $Cl_2$, $H_2O$, $BCl_3$, and a noble gas (also referred to as a rare gas) such as He and Ar as the etching gas, for example. Alternatively, a gas containing oxygen and at least one kind of the above is preferably used as the etching gas. Alternatively, an oxygen gas may be used as the etching gas. Specifically, for example, a gas containing $H_2$ and Ar or a gas containing $CF_4$ and He can be used as the etching gas. As another example, a gas containing $CF_4$, He, and oxygen can be used as the etching gas.

Through the above steps, regions of the first layer 113A, the first sacrificial layer 118A, and the second sacrificial layer 119A that do not overlap with the resist mask 190a can be removed. Then, as illustrated in FIG. 6A, the second layer 113B is formed over the sacrificial layer 119a, the pixel electrode 111b, and the pixel electrode 111c, a first sacrificial layer 118B is formed over the second layer 113B, and a second sacrificial layer 119B is formed over the first sacrificial layer 118B.

As illustrated in FIG. 6A, in the cross-sectional view along Y1-Y2, the end portion of the second layer 113B on the connection portion 140 side is positioned on the inner side (closer to the display portion) than an end portion of the first sacrificial layer 118B.

The second layer 113B is a layer to be the second layer 113b later. The second layer 113b emits light of a color different from that of light emitted by the first layer 113a. Structures, materials, and the like that can be used for the second layer 113b are similar to those for the first layer 113a. The second layer 113B can be formed by a method similar to that for the first layer 113A.

The first sacrificial layer 118B can be formed using a material that can be used for the first sacrificial layer 118A. The second sacrificial layer 119B can be formed using a material that can be used for the second sacrificial layer 119A.

Next, a resist mask 190b is formed over the second sacrificial layer 119B as illustrated in FIG. 6A.

The resist mask 190b is provided at a position overlapping with the pixel electrode 111b. The resist mask 190b may be provided also at a position overlapping with the region to be the connection portion 140.

Next, steps similar to those described with reference to FIG. 5B and FIG. 5C are performed to remove regions of the second layer 113B, the first sacrificial layer 118B, and the second sacrificial layer 119B which do not overlap with the resist mask 190b.

Accordingly, as illustrated in FIG. 6B, a stacked-layer structure of the second layer 113b, the sacrificial layer 118b, and the sacrificial layer 119b remains over the pixel electrode 111b. In the region corresponding to the connection portion 140, a stacked-layer structure of the sacrificial layer 118a and the sacrificial layer 119a remains over the conductive layer 123.

Next, as illustrated in FIG. 6B, the third layer 113C is formed over the sacrificial layer 119a, the sacrificial layer 119b, and the pixel electrode 111c, a first sacrificial layer 118C is formed over the third layer 113C, and a second sacrificial layer 119C is formed over the first sacrificial layer 118C.

As illustrated in FIG. 6B, in the cross-sectional view along Y1-Y2, the end portion of the third layer 113C on the connection portion 140 side is positioned on the inner side (closer to the display portion) than an end portion of the first sacrificial layer 118C.

The third layer 113C is a layer to be the third layer 113c later. The third layer 113c emits light of a color different from those of light emitted by the first layer 113a and the second layer 113b. Structures, materials, and the like that can be used for the third layer 113c are similar to those for the first layer 113a. The third layer 113C can be formed by a method similar to that for the first layer 113A.

The first sacrificial layer 118C can be formed using a material that can be used for the first sacrificial layer 118A. The second sacrificial layer 119C can be formed using a material that can be used for the second sacrificial layer 119A.

Next, a resist mask 190c is formed over the second sacrificial layer 119C as illustrated in FIG. 6B.

The resist mask 190c is provided at a position overlapping with the pixel electrode 111c. The resist mask 190c may be provided also at a position overlapping with the region to be the connection portion 140 later.

Next, steps similar to those described with reference to FIG. 5B and FIG. 5C are performed to remove regions of the third layer 113C, the first sacrificial layer 118C, and the second sacrificial layer 119C which do not overlap with the resist mask 190c.

Accordingly, as illustrated in FIG. 6C, a stacked-layer structure of the third layer 113c, the sacrificial layer 118c, and the sacrificial layer 119c remains over the pixel electrode 111c. In the region corresponding to the connection portion 140, a stacked-layer structure of the sacrificial layer 118a and the sacrificial layer 119a remains over the conductive layer 123.

Note that the side surfaces of the first layer 113a, the second layer 113b, and the third layer 113c are preferably perpendicular or substantially perpendicular to their formation surfaces. For example, the angle between the formation surfaces and these side surfaces is preferably greater than or equal to 60° and less than or equal to 90°.

Figures 7A, 7B, 7C:
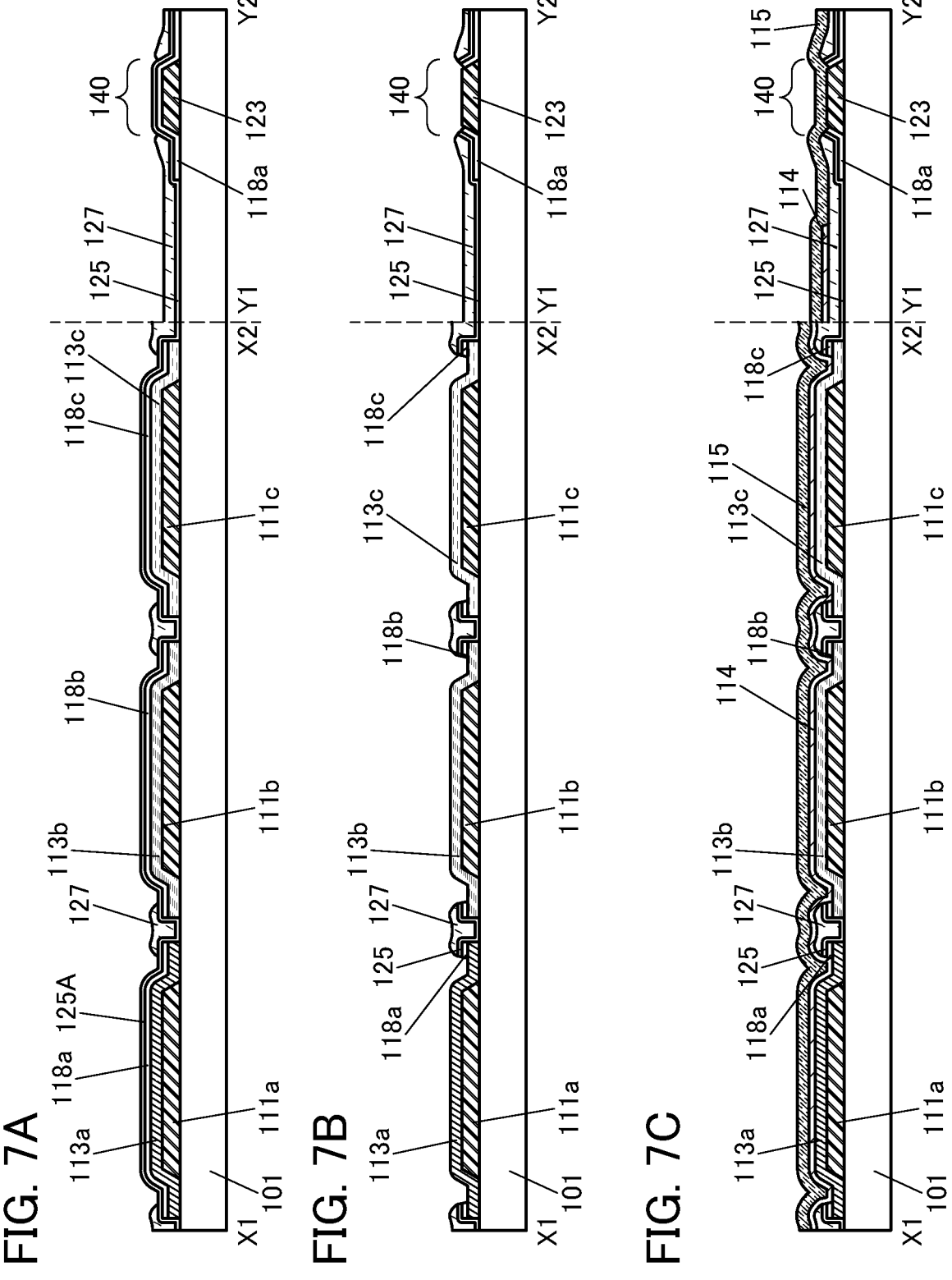
FIG. 7A to FIG. 7C are cross-sectional views illustrating the example of a method for fabricating a display apparatus.

Subsequently, the sacrificial layers 119a, 119b, and 119c are removed as illustrated in FIG. 7A. As a result, the sacrificial layer 118a is exposed over the pixel electrode 111a, the sacrificial layer 118b is exposed over the pixel electrode 111b, the sacrificial layer 118c is exposed over the pixel electrode 111c, and the sacrificial layer 118a is exposed over the conductive layer 123.

As described later in Fabrication method example 2, a step of forming an insulating film 125A may be performed without the removal of the sacrificial layers 119a, 119b, and 119c.

The step of removing the sacrificial layers can be performed by a method similar to that for the step of processing the sacrificial layers. In particular, using a wet etching method can reduce damage to the first layer 113a, the second layer 113b, and the third layer 113c in removing the sacrificial layers, as compared to the case of using a dry etching method.

The sacrificial layers may be removed by being dissolved in a solvent such as water or alcohol. Examples of alcohol include ethyl alcohol, methyl alcohol, isopropyl alcohol (IPA), and glycerin.

After the sacrificial layers are removed, drying treatment may be performed to remove water included in the EL layer and water adsorbed on the surface of the EL layer. For example, heat treatment in an inert gas atmosphere or a reduced-pressure atmosphere can be performed. The heat treatment can be performed at a substrate temperature higher than or equal to 50° C., and lower than or equal to 200° C., preferably higher than or equal to 60° C., and lower than or equal to 150° C., further preferably higher than or equal to 70° C., and lower than or equal to 120° C. Employing a reduced-pressure atmosphere is preferable, in which case drying at a lower temperature is possible.

Next, as illustrated in FIG. 7A, the insulating film 125A is formed to cover the first layer 113a, the second layer 113b, the third layer 113c, and the sacrificial layers 118a, 118b, and 118c.

The insulating film 125A is a layer to be the insulating layer 125 later. Thus, the insulating film 125A can be formed using a material that can be used for the insulating layer 125.

As the insulating film 125A, an insulating film is preferably formed at a substrate temperature higher than or equal to 60° C., higher than or equal to 80° C., higher than or equal to 100° C., or higher than or equal to 120° C., and lower than or equal to 200° C., lower than or equal to 180° C., lower than or equal to 160° C., lower than or equal to 150° C., or lower than or equal to 140° C. to have a thickness greater than or equal to 3 nm, greater than or equal to 5 nm, or greater than or equal to 10 nm and less than or equal to 200 nm, less than or equal to 150 nm, less than or equal to 100 nm, or less than or equal to 50 nm.

As the insulating film 125A, for example, an aluminum oxide film is preferably formed by an ALD method. The use of an ALD method is preferable, in which case deposition damage can be reduced and a film with good coverage can be formed.

Next, as illustrated in FIG. 7A, the insulating layer 127 is formed over the insulating film 125A.

For the insulating layer 127, the above-described organic material can be used.

For example, the insulating layer 127 can be patterned by application of a photosensitive resin, light exposure, and development.

Etching may be performed so that the surface level of the insulating layer 127 is adjusted. The insulating layer 127 may be processed by ashing using oxygen plasma, for example.

There is no particular limitation on the method for forming a film to be the insulating layer 127; for example, the film can be formed by a wet process such as spin coating, dipping, spray coating, ink-jetting, dispensing, screen printing, offset printing, a doctor knife method, slit coating, roll coating, curtain coating, or knife coating. Specifically, it is preferable to form an organic insulating film to be the insulating layer 127 by spin coating.

The insulating film 125A and the insulating layer 127 are preferably formed by a formation method that causes less damage to the EL layer. In particular, the insulating film 125A, which is formed in contact with the side surface of the EL layer, is preferably formed by a formation method that causes less damage to the EL layer than the method for forming the insulating layer 127. In addition, the insulating film 125A and the insulating layer 127 are each formed at a temperature lower than the upper temperature limit of the EL layer. The typical substrate temperatures in formation of the insulating film 125A and the insulating layer 127 are each lower than or equal to 200° C., preferably lower than or equal to 180° C., further preferably lower than or equal to 160° C., still further preferably lower than or equal to 150° C., yet still further preferably lower than or equal to 140° C.

Then, as illustrated in FIG. 7B, the insulating film 125A and the sacrificial layers 118a, 118b, and 118c are removed at least partly to expose the first layer 113a, the second layer 113b, the third layer 113c, and the conductive layer 123.

The sacrificial layers 118a, 118b, and 118c may be removed in a step that is different from or the same as a step of removing the insulating film 125A. The sacrificial layers 118a, 118b, and 118c and the insulating film 125A are preferably films that are formed using the same material, for example, in which case they can be removed in the same step. For the sacrificial layers 118a, 118b, and 118c and the insulating film 125A, insulating films are preferably formed by an ALD method, and aluminum oxide films are further preferably formed by an ALD method, for example.

As illustrated in FIG. 7B, a region of the insulating film 125A which overlaps with the insulating layer 127 remains as the insulating layer 125. Regions of the sacrificial layers 118a, 118b, and 118c which overlap with the insulating layer 127 remain.

As described above, the sacrificial layer can remain in the display apparatus of one embodiment of the present invention. Depending on the shape of the insulating layer 127, the sacrificial layers 118a, 118b, and 118c are entirely removed in some cases. Thus, the sacrificial layers 118a, 118b, and 118c do not necessarily remain in the display apparatus.

The insulating layer 125 (and the insulating layer 127) is (are) provided to cover the side surfaces of the pixel electrodes 111a, 111b, and 111c, the first layer 113a, the second layer 113b, and the third layer 113c. This inhibits contact of a film formed later with the side surfaces of these layers, thereby inhibiting a short circuit of the light-emitting devices. In addition, damage to the pixel electrodes 111a, 111b, and 111c, the first layer 113a, the second layer 113b, and the third layer 113c in later steps can be inhibited.

The step of removing the sacrificial layers can be performed by a method similar to that for the step of processing the sacrificial layers. For the sacrificial layers 118a, 118b, and 118c, a method similar to the method usable in the step of removing the sacrificial layers 119a, 119b, and 119c can be used.

The insulating film 125A is preferably processed by a dry etching method. The insulating film 125A is preferably processed by anisotropic etching. The insulating film 125A can be processed using an etching gas that can be used for processing the sacrificial layers.

Then, as illustrated in FIG. 7C, the fourth layer 114 is formed to cover the insulating layer 125, the insulating layer 127, the first layer 113a, the second layer 113b, and the third layer 113c.

In FIG. 7C, the cross-sectional view along Y1-Y2 shows the example where the fourth layer 114 is not provided in the connection portion 140. As illustrated in FIG. 7C, an end portion of the fourth layer 114 on the connection portion 140 side is preferably positioned on the inner side of the connection portion 140. In forming the fourth layer 114, for example, a mask for specifying the film formation area is preferably used. Depending on the conductivity of the fourth layer 114, the fourth layer 114 may be provided in the connection portion 140.

Materials that can be used for the fourth layer 114 are as described above. The fourth layer 114 can be formed by an evaporation method (including a vacuum evaporation method), a transfer method, a printing method, an inkjet method, a coating method, or the like. The fourth layer 114 may be formed using a premix material.

The fourth layer 114 is provided to cover the top surfaces of the first layer 113a, the second layer 113b, and the third layer 113c and the top surface and the side surface of the insulating layer 127. Here, in the case where the fourth layer 114 has high conductivity, a short circuit in the light-emitting device might be caused when the fourth layer 114 is in contact with any of the side surfaces of the pixel electrodes 111a, 111b, and 111c, the first layer 113a, the second layer 113b, and the third layer 113c. In the display apparatus of one embodiment of the present invention, however, a short circuit in the light-emitting devices can be inhibited because the insulating layers 125 and 127 cover the side surfaces of the pixel electrodes 111a, 111b, and 111c, the first layer 113a, the second layer 113b, and the third layer 113c to inhibit the fourth layer 114 having high conductivity from being in contact with these layers. Thus, the reliability of the light-emitting device can be increased.

Since the space between the first layer 113a and the second layer 113b and the space between the second layer 113b and the third layer 113c are filled with the insulating layers 125 and 127, the formation surface of the fourth layer 114 has a smaller step and higher planarity than the formation surface of the case where the insulating layers 125 and 127 are not provided. This can improve the coverage with the fourth layer 114.

Then, the common electrode 115 is formed over the fourth layer 114 and the conductive layer 123 as illustrated in FIG. 7C. Accordingly, the conductive layer 123 and the common electrode 115 are in direct contact with each other to be electrically connected to each other.

Note that a mask for specifying a film formation area may be used in the formation of the common electrode 115. Alternatively, the common electrode 115 may be formed without the use of the mask and may be processed with the use of a resist mask or the like after the common electrode 115 is formed.

Materials that can be used for the common electrode 115 are as described above. The common electrode 115 can be formed by a sputtering method or a vacuum evaporation method, for example. Alternatively, the common electrode 115 may be a stack of a film formed by an evaporation method and a film formed by a sputtering method.

After that, the protective layer 131 is formed over the common electrode 115. Furthermore, the substrate 120 is bonded to the protective layer 131 with the resin layer 122, whereby the display apparatus 100 illustrated in FIG. 1B can be fabricated. Note that FIG. 1B illustrates an example where the fourth layer 114 is provided in the connection portion 140 and the conductive layer 123 and the common electrode 115 are electrically connected to each other through the fourth layer 114.

Materials and deposition methods that can be used for the protective layer 131 are as described above. Examples of the deposition method of the protective layer 131 include a vacuum evaporation method, a sputtering method, a CVD method, and an ALD method. The protective layer 131 may have a single-layer structure or a stacked-layer structure.

Fabrication Method Example 2 of Display Apparatus

Next, an example of a method for fabricating a display apparatus is described with reference to FIG. 8A. FIG. 8A illustrates a cross section along the dashed-dotted line X1-X2 and a cross section along the dashed-dotted line Y1-Y2 in FIG. 1A side by side.

In Fabrication method example 2, steps illustrated in FIG. 8A are performed after the step illustrated in FIG. 6C. Note that detailed description of portions similar to those in Fabrication method example 1 is omitted in some cases.

In Fabrication method example 2, the insulating film 125A is formed over the sacrificial layers 119a, 119b, and 119c, without removal of the sacrificial layers 119a, 119b, and 119c, and then the insulating layer 127 is formed over the insulating film 125A.

Then, the insulating film 125A, the sacrificial layers 119a, 119b, and 119c, and the sacrificial layers 118a, 118b, and 118c are removed at least partly to expose the first layer 113a, the second layer 113b, and the third layer 113c.

The sacrificial layers 119a, 119b, and 119c may be removed in a step that is different from or the same as the step of removing the sacrificial layers 118a, 118b, and 118c. The sacrificial layers 118a, 118b, and 118c may be removed in a step that is different from or the same as the step of removing the insulating film 125A. The sacrificial layers 119a, 119b, and 119c, the sacrificial layers 118a, 118b, and 118c, and the insulating film 125A may be collectively removed.

As illustrated in FIG. 8A, a region of the insulating film 125A that overlaps with the insulating layer 127 remains as the insulating layer 125. Regions of the sacrificial layers 119a, 119b, and 119c and the sacrificial layers 118a, 118b, and 118c that overlap with the insulating layer 127 remain.

As described above, not only the first sacrificial layer but also the second sacrificial layer may remain in the display apparatus of one embodiment of the present invention.

Subsequently, the fourth layer 114 can be formed over the first layer 113a, the second layer 113b, and the third layer 113c, and the common electrode 115 can be formed over the fourth layer 114 as illustrated in FIG. 8A.

Fabrication Method Example 3 of Display Apparatus

Next, an example of a method for fabricating a display apparatus is described with reference to FIG. 8B and FIG. 8C. FIG. 8B and FIG. 8C each illustrate a cross-sectional view along the dashed-dotted line X1-X2 and a cross-sectional view along the dashed-dotted line Y1-Y2 in FIG. 1A side by side.

In Fabrication method example 3, a fabrication method of the case where EL layers having the same structure are formed in all subpixels is described.

EL layers having the same structure can be used in all subpixels in some cases where, for example, a full-color display apparatus is fabricated by combining a white-light-emitting device and a color filter or combining a blue-light-emitting device and a color conversion layer.

Even in the case where EL layers having the same structure are formed in all the subpixels, at least part of the EL layer is preferably formed into an island shape in each subpixel. The EL layer might include a layer with relatively high conductivity. When a layer with high conductivity is provided to be shared by a plurality of subpixels, leakage current might be generated between the plurality of subpixels. In particular, the leakage current becomes negligibly large in the case of a display apparatus with high resolution or a display apparatus with a high aperture ratio where a distance between subpixels is short, which might degrade the display quality of the display apparatus. Forming at least part of the EL layer into an island shape can inhibit leakage current from flowing between adjacent subpixels. Thus, the display quality of the display apparatus can be improved. That is, when a white-light-emitting device, a color filter, and the MML structure of one embodiment of the present invention are combined, a display apparatus having a high contrast ratio can be achieved. When a blue-light-emitting device, a color conversion layer, and the MML structure of one embodiment of the present invention are combined, a display apparatus having a high contrast ratio can be achieved.

First, as in Fabrication method example 1, the pixel electrodes 111a, 111b, and 111c and the conductive layer 123 are formed over the layer 101 including transistors. Then, as illustrated in FIG. 8B, an EL layer 113 is formed over the pixel electrodes 111a, 111b, and 111c and the conductive layer 123: the first sacrificial layer 118A is formed over the EL layer 113: and the second sacrificial layer 119A is formed over the first sacrificial layer 118A.

Next, as illustrated in FIG. 8B, the resist masks 190 are formed over the second sacrificial layer 119A. The resist masks 190 are provided at positions overlapping with the pixel electrodes 111a, 111b, and 111c and the conductive layer 123.

Here, when the resist mask 190 is formed such that the end portion of the resist mask 190 is positioned on the outer side of the end portion of the pixel electrode 111a, the end portion of the first layer 113a to be formed later can be provided on the outer side of the end portion of the pixel electrode 111a. Similarly, when the end portion of the resist mask 190 is positioned on the outer side of the end portion of the pixel electrode 111b, the end portion of the second layer 113b to be formed later can be provided on the outer side of the pixel electrode 111b. When the end portion of the resist mask 190 is positioned on the outer side of an end portion of the pixel electrode 111c, an end portion of the third layer 113c to be formed later can be provided on the outer side of the end portion of the pixel electrode 111c.

Meanwhile, when the resist mask 190 is formed such that the end portion of the resist mask 190 is positioned on the inner side of the end portion of the pixel electrode 111a, the end portion of the first layer 113a to be formed later can be provided on the inner side of the end portion of the pixel electrode 111a. Similarly, when the end portion of the resist mask 190 is positioned on the inner side of the end portion of the pixel electrode 111b, the end portion of the second layer 113b to be formed later can be provided on the inner side of the pixel electrode 111b. When the end portion of the resist mask 190 is positioned on the inner side of the end portion of the pixel electrode 111c, the end portion of the third layer 113c to be formed later can be provided on the inner side of the pixel electrode 111c.

Note that the resist mask 190 is preferably provided also at a position overlapping with the connection portion 140. This can inhibit the conductive layer 123 from being damaged during the fabrication process of the display apparatus.

Then, as in Fabrication method example 1, the sacrificial layers 119a are formed using the resist masks 190, the resist masks 190 are removed, and then, the sacrificial layers 118a are formed using the sacrificial layers 119a as masks. Then, part of the EL layer 113 is removed using the sacrificial layers 119a and the sacrificial layers 118a as masks. Accordingly, the first layer 113a, the second layer 113b, and the third layer 113c can be formed as illustrated in FIG. 8C. The first layer 113a, the second layer 113b, and the third layer 113c are formed by processing the EL layer 113, and thus have the same structure.

In Fabrication method example 1, where the first layer 113a, the second layer 113b, and the third layer 113c are formed using the respective films, processing of an EL layer using a resist mask is performed three times. By contrast, in Fabrication method example 3, the first layer 113a, the second layer 113b, and the third layer 113c can be formed by performing processing of an EL layer using resist masks only once. Fabrication method example 3 can thus have a reduced number of fabrication steps and is preferable.

The step illustrated in FIG. 8C can be followed by the step illustrated in FIG. 7A or the step illustrated in FIG. 8A. Thus, Fabrication method examples 1 and 2 can be referred to for the subsequent steps.

As described above, in the method for fabricating a display apparatus of this embodiment, an island-shaped EL layer is formed not by using a fine metal mask but by processing an EL layer formed over the entire surface; thus, the island-shaped EL layer can be formed to have a uniform thickness. Accordingly, a high-definition display apparatus or a display apparatus with a high aperture ratio can be achieved.

The first layer, the second layer, and the third layer included in the light-emitting devices of different colors are formed in separate steps. Accordingly, the EL layers can be formed to have structures (material, thickness, and the like) appropriate for the light-emitting devices of the respective colors. Thus, the light-emitting devices with favorable characteristics can be fabricated.

The display apparatus of one embodiment of the present invention includes the insulating layer that covers the side surfaces of the light-emitting layer and the carrier-transport layer. In the fabrication process of the display apparatus, the EL layer in which the light-emitting layer and the carrier-transport layer are stacked is processed; hence, less damage is caused to the light-emitting layer in this display apparatus. In addition, the insulating layer inhibits the EL layer formed into an island shape from being in contact with the carrier-injection layer or the common electrode, thereby inhibiting a short circuit in the light-emitting device.

When an insulating layer with a low impurity concentration (e.g., one of a hydrogen concentration and a carbon concentration, preferably both of them) is used as the insulating layer, a barrier property against at least one of water and oxygen can be increased. Thus, deterioration of the EL layer due to entry of at least one of water and oxygen from the insulating layer into the EL layer can be inhibited.

This embodiment can be combined with the other embodiments as appropriate. In this specification, in the case where a plurality of structure examples are shown in one embodiment, the structure examples can be combined as appropriate.

Embodiment 2

In this embodiment, the display apparatus of one embodiment of the present invention is described with reference to FIG. 9 to FIG. 12.

[Pixel Layout]

In this embodiment, pixel layouts different from that in FIG. 1A are mainly described. There is no particular limitation on the arrangement of subpixels, and a variety of methods can be employed. Examples of the arrangement of subpixels include stripe arrangement, S-stripe arrangement, matrix arrangement, delta arrangement, Bayer arrangement, and pentile arrangement.

Examples of a top surface shape of the subpixel include polygons such as a triangle, a tetragon (including a rectangle and a square), and a pentagon: polygons with rounded corners: an ellipse: and a circle. Here, a top surface shape of the subpixel corresponds to a top surface shape of a light-emitting region of the light-emitting device.

Figures 9A, 9B, 9C, 9D, 9E, 9F:
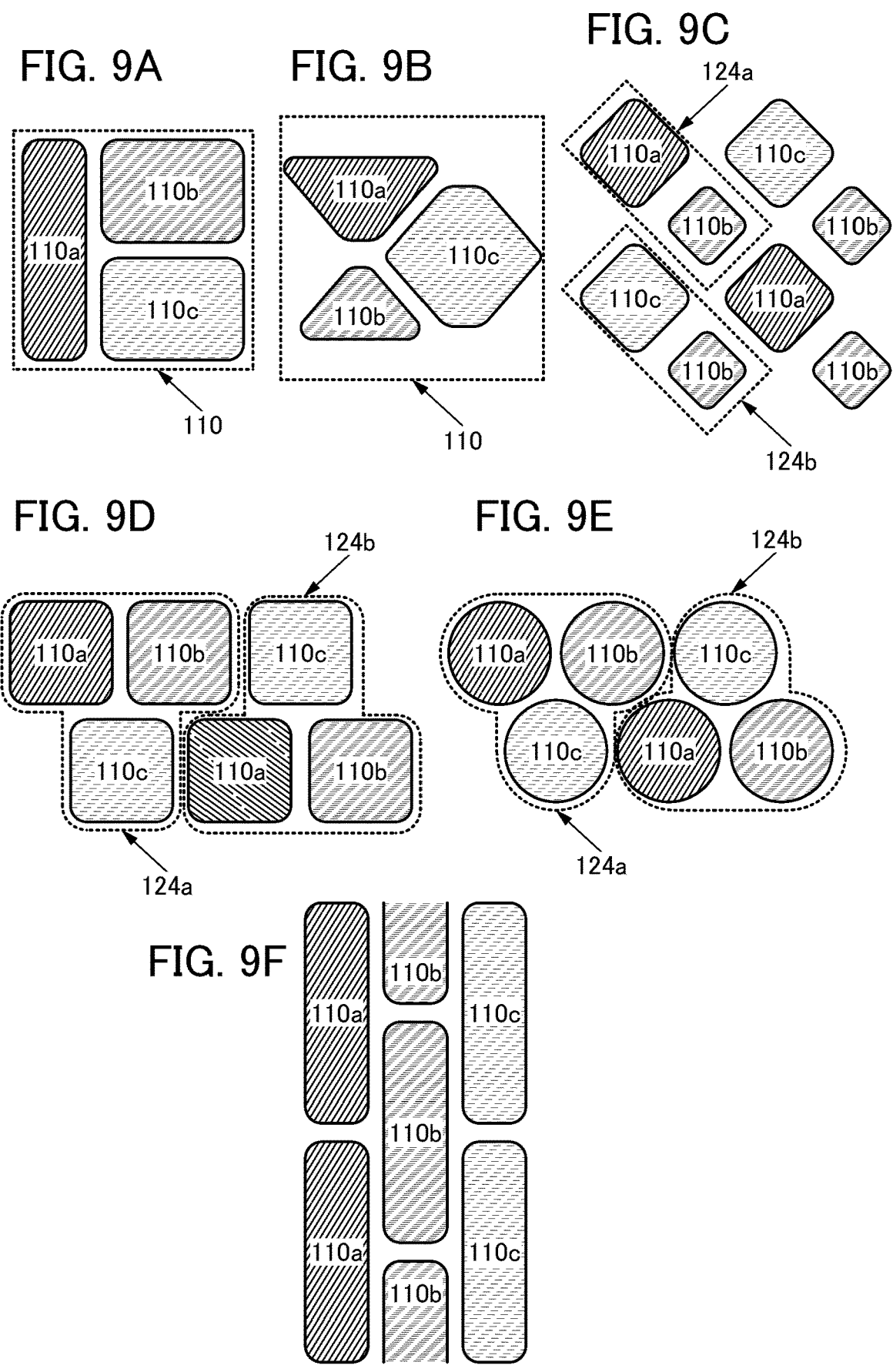
FIG. 9A to FIG. 9F are top views illustrating examples of a pixel.
Figures 11A, 11B, 11C, 11D, 11E, 11F, 11G, 11H, 11I, 11J:
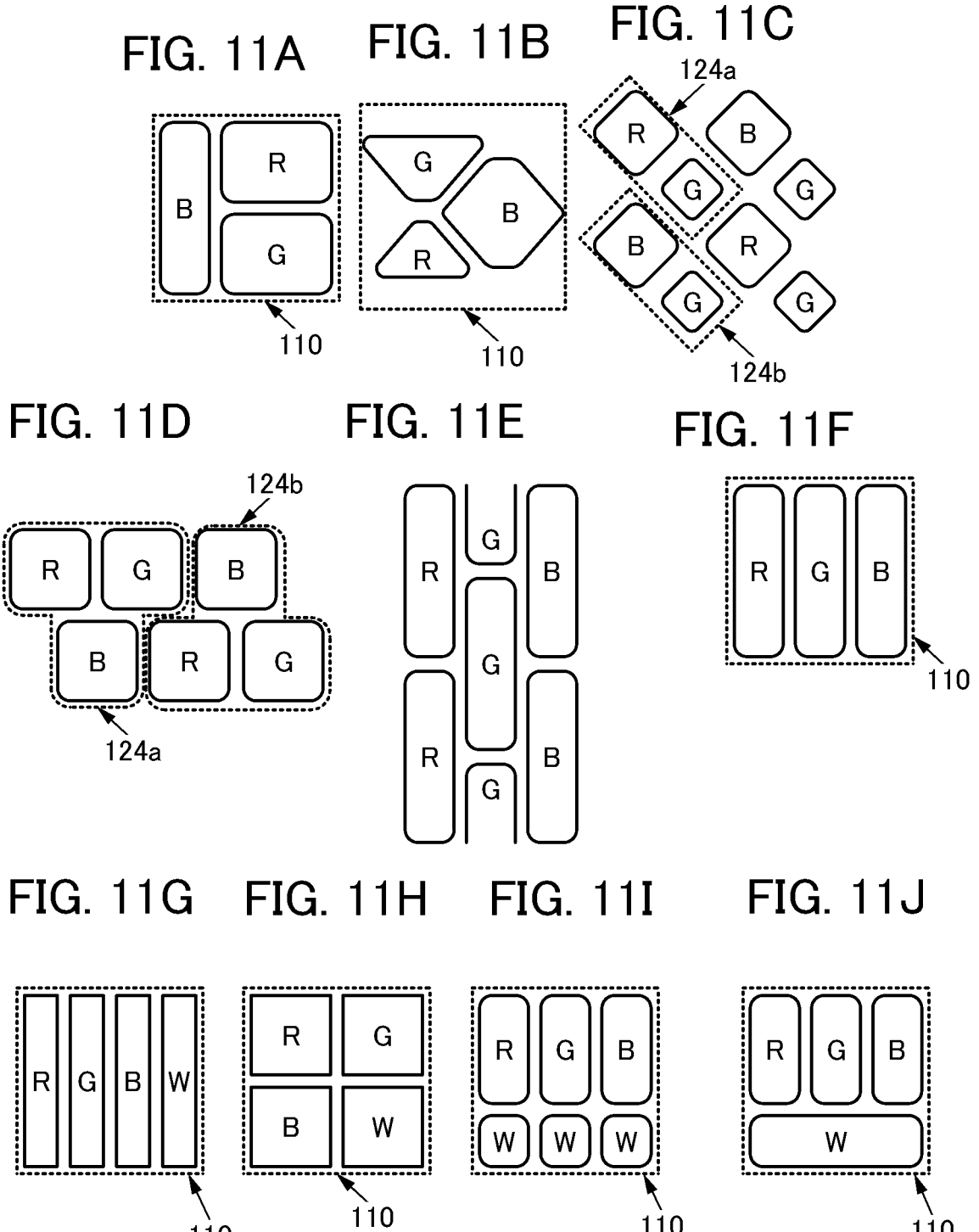
FIG. 11A to FIG. 11J are top views illustrating examples of a pixel.

The pixel 110 illustrated in FIG. 9A employs S-stripe arrangement. The pixel 110 illustrated in FIG. 9A is composed of three subpixels 110a, 110b, and 110c. For example, as illustrated in FIG. 11A, the subpixel 110a may be a blue subpixel B, the subpixel 110b may be a red subpixel R, and the subpixel 110c may be a green subpixel G.

The pixel 110 illustrated in FIG. 9B includes the subpixel 110a whose top surface has a rough trapezoidal shape with rounded corners, the subpixel 110b whose top surface has a rough triangle shape with rounded corners, and the subpixel 110c whose top surface has a rough tetragonal or rough hexagonal shape with rounded corners. The subpixel 110a has a larger light-emitting area than the subpixel 110*b*. In this manner, the shapes and sizes of the subpixels can be determined independently. For example, the size of a subpixel including a light-emitting device with higher reliability can be smaller. For example, as illustrated in FIG. 11B, the subpixel 110*a* may be the green subpixel G, the subpixel 110*b* may be the red subpixel R, and the subpixel 110*c* may be the blue subpixel B.

Pixels 124*a* and 124*b* illustrated in FIG. 9C employ pentile arrangement. FIG. 9C illustrates an example where the pixels 124*a* including the subpixel 110*a* and the subpixel 110*b* and the pixels 124*b* including the subpixel 110*b* and the subpixel 110*c* are alternately arranged. For example, as illustrated in FIG. 11C, the subpixel 110*a* may be the red subpixel R, the subpixel 110*b* may be the green subpixel G, and the subpixel 110*c* may be the blue subpixel B.

The pixels 124*a* and 124*b* illustrated in FIG. 9D and FIG. 9E employ delta arrangement. The pixel 124*a* includes two subpixels (the subpixels 110*a* and 110*b*) in the upper row (first row) and one subpixel (the subpixel 110*c*) in the lower row (second row). The pixel 124*b* includes one subpixel (the subpixel 110*c*) in the upper row (first row) and two subpixels (the subpixels 110*a* and 110*b*) in the lower row (second row). For example, as illustrated in FIG. 11D, the subpixel 110*a* may be the red subpixel R, the subpixel 110*b* may be the green subpixel G, and the subpixel 110*c* may be the blue subpixel B.

FIG. 9D is an example where each subpixel has a rough quadrangular top surface shape with rounded corners, and FIG. 9E is an example where each subpixel has a circular top surface shape.

FIG. 9F illustrates an example where subpixels of different colors are arranged in a zigzag manner. Specifically, the positions of the top sides of two subpixels arranged in the column direction (e.g., the subpixel 110*a* and the subpixel 110*b* or the subpixel 110*b* and the subpixel 110*c*) are not aligned in the top view. For example, as illustrated in FIG. 11E, the subpixel 110*a* may be the red subpixel R, the subpixel 110*b* may be the green subpixel G, and the subpixel 110*c* may be the blue subpixel B.

In a photolithography method, as a pattern to be formed by processing becomes finer, the influence of light diffraction becomes more difficult to ignore: accordingly, the fidelity in transferring a photomask pattern by light exposure is degraded, and it becomes difficult to process a resist mask into a desired shape. Thus, a pattern with rounded corners is likely to be formed even with a rectangular photomask pattern. Consequently, the top surface of a subpixel sometimes has a polygonal shape with rounded corners, an elliptical shape, a circular shape, or the like.

Furthermore, in the method for fabricating the display apparatus of one embodiment of the present invention, the EL layer is processed into an island shape with the use of a resist mask. A resist film formed over the EL layer needs to be cured at a temperature lower than the upper temperature limit of the EL layer. Thus, the resist film is insufficiently cured in some cases depending on the upper temperature limit of the material of the EL layer and the curing temperature of the resist material. An insufficiently cured resist film may have a shape different from a desired shape when processed. As a result, the top surface of the EL layer sometimes has a polygonal shape with rounded corners, an elliptical shape, a circular shape, or the like. For example, when a resist mask with a square top surface shape is intended to be formed, a resist mask with a circular top surface shape might be formed and the top surface shape of the EL layer might be circular.

To obtain a desired top surface shape of the EL layer, a technique of correcting a mask pattern in advance so that a transferred pattern agrees with a design pattern (an OPC (Optical Proximity Correction) technique) may be used. Specifically, with the OPC technique, a pattern for correction is added to a corner portion or the like of a figure on a mask pattern.

Also in the pixel 110 illustrated in FIG. 1A, which employs stripe arrangement, for example, the subpixel 110*a* can be the red subpixel R, the subpixel 110*b* can be the green subpixel G, and the subpixel 110*c* can be the blue subpixel B as illustrated in FIG. 11F.

As illustrated in FIG. 10A to FIG. 10H, the pixel can include four types of subpixels.

The pixels 110 illustrated in FIG. 10A to FIG. 10C employ stripe arrangement.

FIG. 10A illustrates an example where each subpixel has a rectangular top surface shape, FIG. 10B illustrates an example where each subpixel has a top surface shape formed by combining two half circles and a rectangle, and FIG. 10C illustrates an example where each subpixel has an elliptical top surface shape.

The pixels 110 illustrated in FIG. 10D to FIG. 10F employ matrix arrangement.

FIG. 10D illustrates an example where each subpixel has a square top surface shape, FIG. 10E illustrates an example where each subpixel has a substantially square top surface shape with rounded corners, and FIG. 10F illustrates an example where each subpixel has a circular top surface shape.

FIG. 10G and FIG. 10H each illustrate an example where one pixel 110 is composed of two rows and three columns.

The pixel 110 illustrated in FIG. 10G includes three subpixels (the subpixels 110*a*, 110*b*, and 110*c*) in the upper row (first row) and one subpixel (a subpixel 110*d*) in the lower row (second row). In other words, the pixel 110 includes the subpixel 110*a* in the left column (first column), the subpixel 110*b* in the center column (second column), the subpixel 110*c* in the right column (third column), and the subpixel 110*d* across these three columns.

The pixel 110 illustrated in FIG. 10H includes three subpixels (the subpixels 110*a*, 110*b*, and 110*c*) in the upper row (first row) and three subpixels 110*d* in the lower row (second row). In other words, the pixel 110 includes the subpixel 110*a* and the subpixel 110*d* in the left column (first column), the subpixel 110*b* and another the subpixel 110*d* in the center column (second column), and the subpixel 110*c* and another subpixel 110*d* in the right column (third column). Matching the positions of the subpixels in the upper row and the lower row as illustrated in FIG. 10H enables dust and the like that would be produced in the manufacturing process to be removed efficiently. Thus, a display apparatus with high display quality can be provided.

The pixels 110 illustrated in FIG. 10A to FIG. 10H are each composed of the four subpixels 110*a*, 110*b*, 110*c*, and 110*d*. The subpixels 110*a*, 110*b*, 110*c*, and 110*d* include light-emitting devices that emit light of different colors. The subpixels 110*a*, 110*b*, 110*c*, and 110*d* can be of four colors of R, G, B, and white (W), of four colors of R, G, B, and Y, of four colors of R, G, B, and infrared light (IR), or the like. For example, the subpixels 110*a*, 110*b*, 110*c*, and 110*d* can be red, green, blue, and white subpixels, respectively, as illustrated in FIG. 11G to FIG. 11J.

The display apparatus of one embodiment of the present invention may include a light-receiving device in the pixel.

Three of the four subpixels included in the pixel 110 illustrated in FIG. 11G to FIG. 11J may include a light-emitting device and the other one may include a light-receiving device.

For example, a pn or pin photodiode can be used as the light-receiving device. The light-receiving device functions as a photoelectric conversion device (also referred to as a photoelectric conversion element) that detects light entering the light-receiving device and generates charge. The amount of charge generated from the light-receiving device depends on the amount of light entering the light-receiving device.

It is particularly preferable to use an organic photodiode including a layer containing an organic compound, as the light-receiving device. An organic photodiode, which is easily made thin, lightweight, and large in area and has a high degree of freedom for shape and design, can be used in a variety of display apparatuses.

In one embodiment of the present invention, an organic EL device is used as the light-emitting device, and an organic photodiode is used as the light-receiving device. The organic EL device and the organic photodiode can be formed over the same substrate. Thus, the organic photodiode can be incorporated in the display apparatus including the organic EL device.

The light-receiving device includes at least an active layer functioning as a photoelectric conversion layer between a pair of electrodes. In this specification and the like, one of the pair of electrodes may be referred to as a pixel electrode and the other may be referred to as a common electrode.

For example, the subpixels 110a, 110b, and 110c may be subpixels of three colors of R, G, and B, and the subpixel 110d may be a subpixel including the light-receiving device.

One of the pair of electrodes of the light-receiving device functions as an anode, and the other electrode functions as a cathode. The case where the pixel electrode functions as an anode and the common electrode functions as a cathode will be described below as an example. When the light-receiving device is driven by application of reverse bias between the pixel electrode and the common electrode, light entering the light-receiving device can be detected and charge can be generated and extracted as current. Alternatively, the pixel electrode may function as a cathode and the common electrode may function as an anode.

A fabrication method similar to that of the light-emitting device can be employed for the light-receiving device. An island-shaped active layer (also referred to as a photoelectric conversion layer) included in the light-receiving device is formed by processing a film that is to be the active layer and formed over the entire surface, not by using a fine metal mask; thus, the island-shaped active layer can be formed to have a uniform thickness. In addition, a sacrificial layer provided over the active layer can reduce damage to the active layer in the fabrication process of the display apparatus, increasing the reliability of the light-receiving device.

Here, a layer shared by the light-receiving device and the light-emitting device might have different functions in the light-emitting device and the light-receiving device. In this specification, the name of a component is based on its function in the light-emitting device in some cases. For example, a hole-injection layer functions as a hole-injection layer in the light-emitting device and functions as a hole-transport layer in the light-receiving device. Similarly, an electron-injection layer functions as an electron-injection layer in the light-emitting device and functions as an electron-transport layer in the light-receiving device. A layer shared by the light-receiving device and the light-emitting device may have the same function in both the light-emitting device and the light-receiving device. The hole-transport layer functions as a hole-transport layer in both the light-emitting device and the light-receiving device, and the electron-transport layer functions as an electron-transport layer in both the light-emitting device and the light-receiving device.

The active layer included in the light-receiving device includes a semiconductor. Examples of the semiconductor include an inorganic semiconductor such as silicon and an organic semiconductor including an organic compound. This embodiment describes an example where an organic semiconductor is used as the semiconductor included in the active layer. An organic semiconductor is preferably used, in which case the light-emitting layer and the active layer can be formed by the same method (e.g., a vacuum evaporation method) and thus the same manufacturing apparatus can be used.

Examples of an n-type semiconductor material included in the active layer are electron-accepting organic semiconductor materials such as fullerene (e.g., $C_{60}$ fullerene and $C_{70}$ fullerene) and fullerene derivatives. Fullerene has a soccer ball-like shape, which is energetically stable. Both the HOMO level and the LUMO level of fullerene are deep (low). Having a deep LUMO level, fullerene has an extremely high electron-accepting property (acceptor property). When I-electron conjugation (resonance) spreads in a plane as in benzene, an electron-donating property (donor property) usually increases; however, having a spherical shape, fullerene has a high electron-accepting property even when $\pi$-electrons widely spread therein. The high electron-accepting property efficiently causes rapid charge separation and is useful for the light-receiving device. Both $C_{60}$ fullerene and $C_{70}$ fullerene have a wide absorption band in the visible light region, and $C_{70}$ fullerene is especially preferable because of having a larger $\pi$-electron conjugated system and a wider absorption band in the long wavelength region than $C_{60}$ fullerene. Other examples of the fullerene derivative include [6,6]-Phenyl-$C_{71}$-butyric acid methyl ester (abbreviation: $PC_{70}BM$), [6,6]-Phenyl-$C_{61}$-butyric acid methyl ester (abbreviation: $PC_{60}BM$), and 1',1'',4',4''-Tetrahydro-di[1,4]methanonaphthaleno[1,2:2',3',56,60:2'', 3''][5,6]fullerene-$C_{60}$ (abbreviation: ICBA).

Another example of an n-type semiconductor material includes a perylenetetracarboxylic derivative such as N,N-dimethyl-3,4,9,10-perylenetetracarboxylic diimide (abbreviation: Me-PTCDI).

Another example of an n-type semiconductor material is 2,2'-(5,5'-(thieno[3,2-b]thiophene-2,5-diyl)bis(thiophene-5, 2-diyl))bis(methan-1-yl-1-ylidene)dimalononitrile (abbreviation: FT2TDMN).

Other examples of the n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of a p-type semiconductor material contained in the active layer include electron-donating organic semiconductor materials such as copper(II) phthalocyanine (CuPc), tetraphenyldibenzoperiflanthene (DBP), zinc phthalocyanine (ZnPc), tin(II) phthalocyanine (SnPc), quinacridone, and rubrene.

Other examples of the p-type semiconductor material include a carbazole derivative, a thiophene derivative, a furan derivative, and a compound having an aromatic amine skeleton. Furthermore, other examples of the p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a rubrene derivative, a tetracene derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of the same kind, which have molecular orbital energy levels close to each other, can improve a carrier-transport property.

For example, the active layer is preferably formed by co-evaporation of an n-type semiconductor and a p-type semiconductor. Alternatively, the active layer may be formed by stacking an n-type semiconductor and a p-type semiconductor.

In addition to the active layer, the light-receiving device may further include a layer containing a substance with a high hole-transport property, a substance with a high electron-transport property, a substance with a bipolar property (a substance with a high electron-transport property and a high hole-transport property), or the like. Without limitation to the above, the light-receiving device may further include a layer containing any of a substance having a high hole-injection property, a hole-blocking material, a substance having a high electron-injection property, an electron-blocking material, and the like.

Either a low molecular compound or a high molecular compound can be used in the light-receiving device, and an inorganic compound may also be included. Each layer included in the light-receiving device can be formed by a method such as an evaporation method (including a vacuum evaporation method), a transfer method, a printing method, an inkjet method, or a coating method.

As the hole-transport material or the electron-blocking material, a high molecular compound such as poly(3,4-ethylenedioxy thiophene)/poly(styrenesulfonic acid) (PE-DOT/PSS), or an inorganic compound such as a molybdenum oxide or copper iodide (CuI) can be used, for example. As the electron-transport material or the hole-blocking material, an inorganic compound such as zinc oxide (ZnO) or an organic compound such as polyethylenimine ethoxylated (PEIE) can be used. The light-receiving device may include a mixed film of PEIE and ZnO, for example.

For the active layer, a high molecular compound such as poly[[4,8-bis[5-(2-ethylhexyl)-2-thienyl]benzo[1,2-b:4,5-b']dithiophene-2,6-diyl]-2,5-thiophenediyl[5,7-bis(2-ethylhexyl)-4,8-dioxo-4H,8H-benzo[1,2-c:4,5-c']dithiophene-1,3-diyl]] polymer (abbreviation: PBDB-T) or a PBDB-T derivative, which functions as a donor, can be used. For example, a method in which an acceptor material is dispersed to PBDB-T or a PBDB-T derivative can be used.

Three or more kinds of materials may be used for the active layer. For example, a third material may be mixed with an n-type semiconductor material and a p-type semiconductor material in order to expand the absorption wavelength range. In this case, the third material may be a low molecular compound or a high molecular compound.

In the display apparatus including light-emitting devices and a light-receiving device in each pixel, the pixel has a light-receiving function; thus, the display apparatus can detect a contact or approach of an object while displaying an image. For example, all the subpixels included in the display apparatus can display an image; alternatively, some of the subpixels can emit light as a light source, some of the rest of the subpixels can detect light, and the other subpixels can display an image.

In the display apparatus of one embodiment of the present invention, the light-emitting devices are arranged in a matrix in the display portion, and an image can be displayed on the display portion. Furthermore, the light-receiving devices are arranged in a matrix in the display portion, and the display portion has one or both of an image capturing function and a sensing function in addition to an image displaying function. The display portion can be used as an image sensor or a touch sensor. That is, by detecting light with the display portion, an image can be captured or the approach or contact of an object (e.g., a finger, a hand, or a pen) can be detected. Furthermore, in the display apparatus of one embodiment of the present invention, the light-emitting devices can be used as a light source of the sensor. Accordingly, a light-receiving portion and a light source do not need to be provided separately from the display apparatus; hence, the number of components of an electronic device can be reduced. For example, a fingerprint authentication device provided in the electronic device, a capacitive touch panel for scroll operation, or the like is not necessarily provided separately. Thus, with the use of the display apparatus of one embodiment of the present invention, the electronic device can be provided at lower manufacturing cost.

In the display apparatus of one embodiment of the present invention, when an object reflects (or scatters) light emitted from the light-emitting device included in the display portion, the light-receiving device can detect the reflected light (or scattered light); thus, image capturing or touch detection is possible even in a dark place.

In the case where the light-receiving device is used as an image sensor, the display apparatus can capture an image with the use of the light-receiving device. For example, the display apparatus of this embodiment can be used as a scanner.

For example, data on biological information such as a fingerprint or a palm print can be obtained with the use of the image sensor. That is, a biometric authentication sensor can be incorporated in the display apparatus. When the display apparatus incorporates a biometric authentication sensor, the number of components of an electronic device can be reduced as compared with the case where a biometric authentication sensor is provided separately from the display apparatus; thus, the size and weight of the electronic device can be reduced.

In the case where the light-receiving device is used as the touch sensor, the display apparatus can detect the approach or contact of an object with the use of the light-receiving device.

Figure 12A:
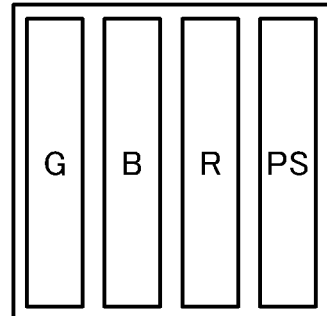
FIG. 12A to FIG. 12D are top views illustrating examples of a pixel.
Figure 12B:
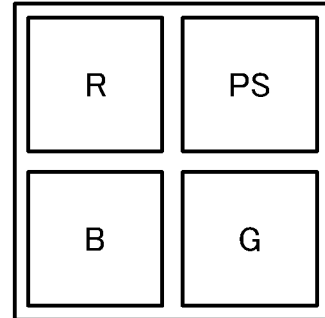

Pixels illustrated in FIG. 12A and FIG. 12B each include the subpixel G, the subpixel B, the subpixel R, and a subpixel PS. Note that the arrangement order of the subpixels is not limited to the structures illustrated in the drawings and can be determined as appropriate. For example, the positions of the subpixel G and the subpixel R may be interchanged with each other.

The pixel illustrated in FIG. 12A employs stripe arrangement. The pixel illustrated in FIG. 12B employs matrix arrangement.

The subpixel R includes a light-emitting device that emits red light. The subpixel G includes a light-emitting device that emits green light. The subpixel B includes a light-emitting device that emits blue light.

The subpixel PS includes a light-receiving device. The wavelength of light detected by the subpixel PS and is not particularly limited. The subpixel PS can have a structure in which one or both of infrared light and visible light can be detected.

Figure 12C:
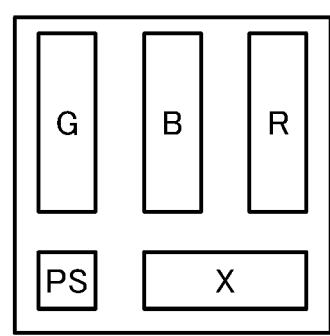
Figure 12D:
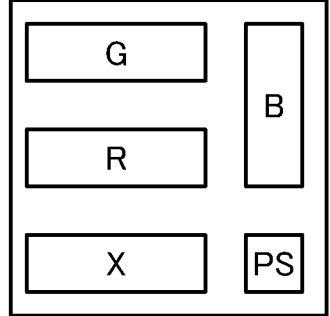

Pixels illustrated in FIG. 12C and FIG. 12D each include the subpixel G, the subpixel B, the subpixel R, the subpixel PS, and a subpixel X. Note that the arrangement order of the subpixels is not limited to the structures illustrated in the drawings and can be determined as appropriate. For example, the positions of the subpixel G and the subpixel R may be interchanged with each other.

FIG. 12C illustrates an example where one pixel is provided in two rows and three columns. Three subpixels (the subpixel G, the subpixel B, and the subpixel R) are provided in the upper row (first row). In FIG. 12C, two subpixels (the subpixel PS and the subpixel X) are provided in the lower row (second row).

FIG. 12D illustrates an example where one pixel is composed of three rows and two columns. In FIG. 12D, the pixel includes the subpixel G in the first row, the subpixel R in the second row, and the subpixel B across these two rows. In addition, two subpixels (the subpixel X and the subpixel PS) are provided in the third row. In other words, the pixel illustrated in FIG. 12D includes three subpixels (the subpixel G, the subpixel R, and the subpixel X) in the left column (first column) and two subpixels (the subpixel B and the subpixel PS) in the right column (second column).

The layout of the subpixels R, G, and B illustrated in FIG. 12C is stripe arrangement. The layout of the subpixels R, G, and B illustrated in FIG. 12D is what is called S stripe arrangement. Thus, high display quality can be achieved.

Note that the layout of the pixels including the subpixel PS is not limited to the structures illustrated in FIG. 12A to FIG. 12D.

The subpixel X can have a structure including a light-emitting device that emits infrared light (IR), for example. In this case, the subpixel PS preferably detects infrared light. For example, while an image is displayed using the subpixels R, G, and B, the subpixel PS can detect reflected light of the light emitted from the subpixel X that is used as a light source.

The subpixel X can have a structure including a light-receiving device, for example. In this case, the wavelength ranges of the light detected by the subpixel PS and the subpixel X may be the same, different, or partially the same. For example, one of the subpixel PS and the subpixel X may mainly detect visible light while the other mainly detects infrared light.

The light-receiving area of the subpixel PS is smaller than the light-receiving area of the subpixel X. A smaller light-receiving area leads to a narrower image-capturing range, prevents a blur in a captured image, and improves the definition. Thus, the use of the subpixel PS enables higher-resolution or higher-definition image capturing than the use of the light-receiving device included in the subpixel X. For example, image capturing for personal authentication with the use of a fingerprint, a palm print, the iris, the shape of a blood vessel (including the shape of a vein and the shape of an artery), a face, or the like is possible by using the subpixel PS.

The light-receiving device included in the subpixel PS preferably detects visible light, and preferably detects one or more of blue light, violet light, bluish violet light, green light, greenish yellow light, yellow light, orange light, red light, and the like. The light-receiving device included in the subpixel PS may detect infrared light.

In the case where the subpixel X has a structure including the light-receiving device, the subpixel X can be used in a touch sensor (also referred to as a direct touch sensor), a near touch sensor (also referred to as a hover sensor, a hover touch sensor, a contactless sensor, or a touchless sensor), or the like. The wavelength of light detected by the subpixel X can be determined as appropriate depending on the application purpose. For example, the subpixel X preferably detects infrared light. Thus, touch detection is possible even in a dark place.

Here, the touch sensor or the near touch sensor can detect an approach or contact of an object (e.g., a finger, a hand, or a pen).

The touch sensor can detect an object when the display apparatus and the object come in direct contact with each other. The near touch sensor can detect an object even when the object is not in contact with the display apparatus. For example, the display apparatus can preferably detect an object when the distance between the display apparatus and the object is greater than or equal to 0.1 mm and less than or equal to 300 mm, preferably greater than or equal to 3 mm and less than or equal to 50 mm. This structure enables the display apparatus to be operated without direct contact of an object: in other words, the display apparatus can be operated in a contactless (touchless) manner. With the above structure, the display apparatus can be controlled with a reduced risk of making the display apparatus dirty or damaging the display apparatus or without the object directly touching a dirt (e.g., dust, bacteria, or a virus) attached to the display apparatus.

The refresh rate of the display apparatus of one embodiment of the present invention can be variable. For example, the refresh rate is adjusted (adjusted in the range from 1 Hz to 240 Hz, for example) in accordance with contents displayed on the display apparatus, whereby power consumption can be reduced. The driving frequency of the touch sensor or the near touch sensor may be changed in accordance with the refresh rate. In the case where the refresh rate of the display apparatus is 120 Hz, for example, the driving frequency of the touch sensor or the near touch sensor can be higher than 120 Hz (typically 240 Hz). With this structure, low power consumption can be achieved, and the response speed of the touch sensor or the near-touch sensor can be increased.

Figure 12E:
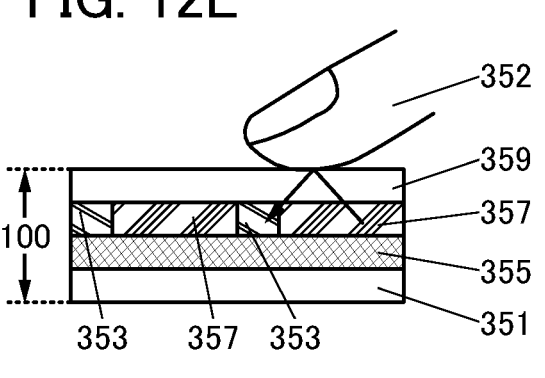
FIG. 12E to FIG. 12G are cross-sectional views illustrating examples of a display apparatus.
Figure 12F:
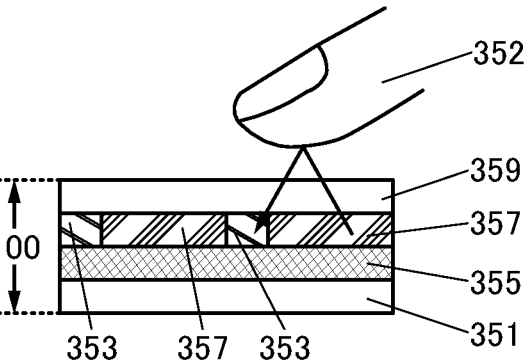
Figure 12G:
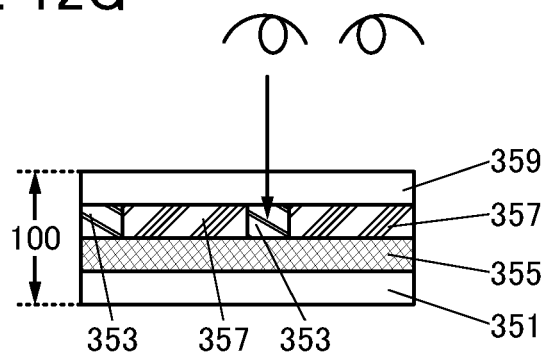

The display apparatus 100 illustrated in FIG. 12E to FIG. 12G includes a layer 353 including a light-receiving device, a functional layer 355, and a layer 357 including a light-emitting device, between a substrate 351 and a substrate 359.

The functional layer 355 includes a circuit for driving a light-receiving device and a circuit for driving a light-emitting device. A switch, a transistor, a capacitor, a resistor, a wiring, a terminal, and the like can be provided in the functional layer 355. Note that in the case where the light-emitting device and the light-receiving device are driven by a passive-matrix method, a structure not provided with a switch and a transistor may be employed.

For example, after light emitted from the light-emitting device in the layer 357 including the light-emitting device is reflected by a finger 352 touching the display apparatus 100 as illustrated in FIG. 12E, the light-receiving device in the layer 353 including the light-receiving device detects the reflected light. Thus, the touch of the finger 352 on the display apparatus 100 can be detected.

Alternatively, the display apparatus may have a function of detecting an object that is close to (i.e., not touching) the display apparatus as illustrated in FIG. 12F and FIG. 12G or capturing an image of such an object. FIG. 12F illustrates an example where a human finger is detected, and FIG. 12G illustrates an example where information on the periphery, surface, or inside of the human eye (e.g., the number of blinks, movement of an eyeball, and movement of an eyelid) is detected.

In the display apparatus of this embodiment, an image of the periphery of an eye, the surface the eye, or the inside (fundus or the like) of the eye of a user of a wearable device can be captured with the use of the light-receiving device. Therefore, the wearable device can have a function of detecting one or more selected from a blink, movement of an iris, and movement of an eyelid of the user.

As described above, the pixel composed of the subpixels each including the light-emitting device can employ any of a variety of layouts in the display apparatus of one embodiment of the present invention. The display apparatus of one embodiment of the present invention can have a structure in which the pixel includes both a light-emitting device and a light-receiving device. Also in this case, any of a variety of layouts can be employed. The display apparatus of one embodiment of the present invention can have one or both of an image capturing function and a sensing function in addition to an image displaying function. Thus, the display apparatus of one embodiment of the present invention can be regarded as highly compatible with the function other than the display function.

This embodiment can be combined with the other embodiments as appropriate.

Embodiment 3

In this embodiment, display apparatuses of embodiments of the present invention are described with reference to FIG. 13 to FIG. 24.

The display apparatus of this embodiment can be a high-resolution display apparatus. Accordingly, the display apparatus in this embodiment can be used for display portions of information terminals (wearable devices) such as watch-type and bracelet-type information terminals and display portions of wearable devices capable of being worn on a head, such as a VR device like a head-mounted display and a glasses-type AR device.

The display apparatus of this embodiment can be a high-definition display apparatus or a large-sized display apparatus. Accordingly, the display apparatus of this embodiment can be used for display portions of electronic devices such as a digital camera, a digital video camera, a digital photo frame, a mobile phone, a portable game console, a portable information terminal, and an audio reproducing device, in addition to display portions of electronic devices with a relatively large screen, such as a television device, a desktop or laptop personal computer, a monitor of a computer and the like, digital signage, and a large game machine such as a pachinko machine.

[Display Module]

Figure 13A:
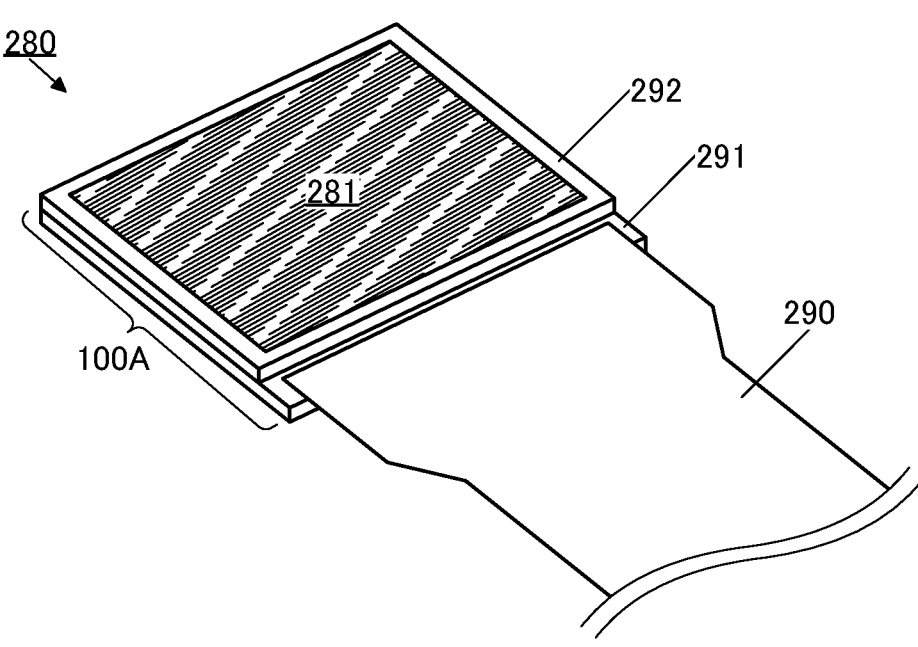
FIG. 13A and FIG. 13B are perspective views illustrating an example of a display apparatus.

FIG. 13A is a perspective view of a display module 280. The display module 280 includes a display apparatus 100A and an FPC 290. Note that the display apparatus included in the display module 280 is not limited to the display apparatus 100A and may be any of a display apparatus 100B to a display apparatus 100F described later.

The display module 280 includes a substrate 291 and a substrate 292. The display module 280 includes a display portion 281. The display portion 281 is a region of the display module 280 where an image is displayed, and is a region where light from pixels provided in a pixel portion 284 described later can be seen.

Figure 13B:
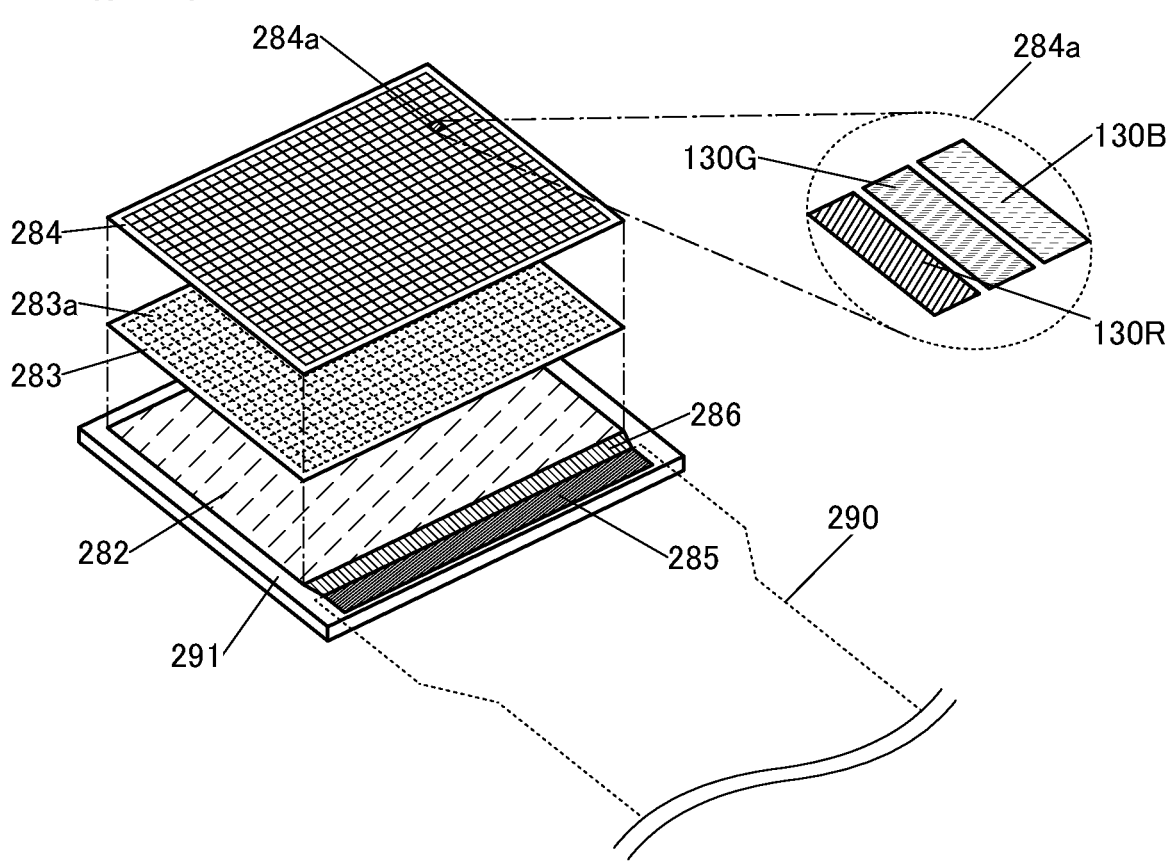

FIG. 13B is a perspective view schematically illustrating a structure on the substrate 291 side. Over the substrate 291, a circuit portion 282, a pixel circuit portion 283 over the circuit portion 282, and the pixel portion 284 over the pixel circuit portion 283 are stacked. A terminal portion 285 to be connected to the FPC 290 is provided in a portion over the substrate 291 which does not overlap with the pixel portion 284. The terminal portion 285 and the circuit portion 282 are electrically connected to each other through a wiring portion 286 formed of a plurality of wirings.

The pixel portion 284 includes a plurality of pixels 284a arranged periodically. An enlarged view of one pixel 284a is illustrated on the right side of FIG. 13B. The pixel 284a includes the light-emitting device 130R that emits red light, the light-emitting device 130G that emits green light, and the light-emitting device 130B that emits blue light.

The pixel circuit portion 283 includes a plurality of pixel circuits 283a arranged periodically.

One pixel circuit 283a is a circuit that controls driving of a plurality of elements included in one pixel 284a. One pixel circuit 283a may be provided with three circuits each of which controls driving of an element. For example, the pixel circuit 283a can include at least one selection transistor, one current control transistor (driving transistor), and a capacitor for one light-emitting device. In this case, a gate signal is input to a gate of the selection transistor, and a source signal is input to a source of the selection transistor. With such a structure, an active-matrix display apparatus is achieved.

The circuit portion 282 includes a circuit for driving the pixel circuits 283a in the pixel circuit portion 283. For example, one or both of a gate line driver circuit and a source line driver circuit are preferably included. In addition, at least one of an arithmetic circuit, a memory circuit, a power supply circuit, and the like may be included.

The FPC 290 functions as a wiring for supplying a video signal, a power supply potential, or the like to the circuit portion 282 from the outside. An IC may be mounted on the FPC 290.

The display module 280 can have a structure in which one or both of the pixel circuit portion 283 and the circuit portion 282 are stacked below the pixel portion 284; thus, the aperture ratio (the effective display area ratio) of the display portion 281 can be significantly high. For example, the aperture ratio of the display portion 281 can be higher than or equal to 40% and lower than 100%, preferably higher than or equal to 50% and lower than or equal to 95%, further preferably higher than or equal to 60% and lower than or equal to 95%. Furthermore, the pixels 284a can be arranged extremely densely and thus the display portion 281 can have an extremely high resolution. For example, the pixels 284*a* are preferably arranged in the display portion 281 with a resolution higher than or equal to 2000 ppi, preferably higher than or equal to 3000 ppi, further preferably higher than or equal to 5000 ppi, still further preferably higher than or equal to 6000 ppi, and lower than or equal to 20000 ppi or lower than or equal to 30000 ppi.

Such a display module 280 has an extremely high resolution, and thus can be suitably used for a VR device such as a head-mounted display or a glasses-type AR device. For example, even with a structure where the display portion of the display module 280 is seen through a lens, pixels of the extremely-high-resolution display portion 281 included in the display module 280 are prevented from being perceived when the display portion is enlarged by the lens, so that display providing a high sense of immersion can be performed. Without being limited thereto, the display module 280 can be suitably used for electronic devices including a relatively small display portion. For example, the display module 280 can be favorably used in a display portion of a wearable electronic device, such as a watch.

[Display Apparatus 100A]

Figure 14A:
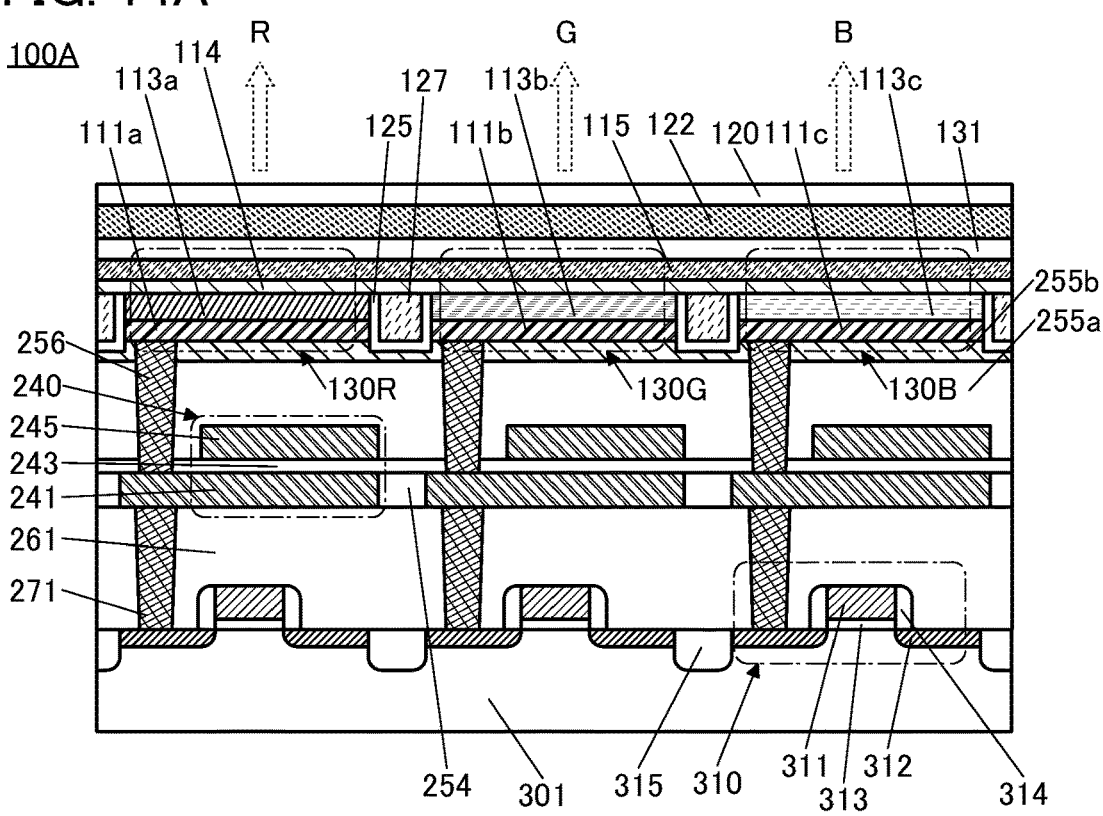
FIG. 14A to FIG. 14C are cross-sectional views illustrating examples of a display apparatus.

The display apparatus 100A illustrated in FIG. 14A includes a substrate 301, the light-emitting devices 130R, 130G and 130B, a capacitor 240, and a transistor 310.

The substrate 301 corresponds to the substrate 291 in FIG. 13A and FIG. 13B. A stacked-layer structure including the substrate 301 and the components thereover up to an insulating layer 255*b* corresponds to the layer 101 including transistors in Embodiment 1.

The transistor 310 is a transistor including a channel formation region in the substrate 301. As the substrate 301, a semiconductor substrate such as a single crystal silicon substrate can be used, for example. The transistor 310 includes part of the substrate 301, a conductive layer 311, low-resistance regions 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance region 312 is a region where the substrate 301 is doped with an impurity, and functions as one of a source and a drain. The insulating layer 314 is provided to cover the side surface of the conductive layer 311.

An element isolation layer 315 is provided between two adjacent transistors 310 to be embedded in the substrate 301.

An insulating layer 261 is provided to cover the transistor 310, and the capacitor 240 is provided over the insulating layer 261.

The capacitor 240 includes a conductive layer 241, a conductive layer 245, and an insulating layer 243 positioned therebetween. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 261 and is embedded in an insulating layer 254. The conductive layer 241 is electrically connected to one of the source and the drain of the transistor 310 through a plug 271 embedded in the insulating layer 261. The insulating layer 243 is provided to cover the conductive layer 241. The conductive layer 245 is provided in a region overlapping with the conductive layer 241 with the insulating layer 243 therebetween.

An insulating layer 255*a* is provided to cover the capacitor 240, and the insulating layer 255*b* is provided over the insulating layer 255*a*.

As each of the insulating layer 255*a* and the insulating layer 255*b*, a variety of inorganic insulating films such as an oxide insulating film, a nitride insulating film, an oxynitride insulating film, and a nitride oxide insulating film can be suitably used. As the insulating layer 255*a*, an oxide insulating film or an oxynitride insulating film, such as a silicon oxide film, a silicon oxynitride film, or an aluminum oxide film, is preferably used. As the insulating layer 255*b*, a nitride insulating film or a nitride oxide insulating film, such as a silicon nitride film or a silicon nitride oxide film, is preferably used. Specifically, it is preferable that a silicon oxide film be used as the insulating layer 255*a* and a silicon nitride film be used as the insulating layer 255*b*. The insulating layer 255*b* preferably has a function of an etching protective film. Alternatively, a nitride insulating film or a nitride oxide insulating film may be used as the insulating layer 255*a*, and an oxide insulating film or an oxynitride insulating film may be used as the insulating layer 255*b*. Although this embodiment shows an example where a depressed portion is provided in the insulating layer 255*b*, a depressed portion is not necessarily provided in the insulating layer 255*b*.

The light-emitting device 130R, the light-emitting device 130G, and the light-emitting device 130B are provided over the insulating layer 255*b*. FIG. 14A illustrates an example where the light-emitting device 130R, the light-emitting device 130G, and the light-emitting device 130B each have a structure similar to the stacked-layer structure illustrated in FIG. 1B. An insulator is provided in a region between adjacent light-emitting devices. In FIG. 14A and the like, the insulating layer 125 and the insulating layer 127 over the insulating layer 125 are provided in this region.

The pixel electrodes 111*a*, 111*b*, and 111*c* of the light-emitting device are each electrically connected to one of the source and the drain of the transistor 310 through a plug 256 embedded in the insulating layers 255*a* and 255*b*, the conductive layer 241 embedded in the insulating layer 254, and the plug 271 embedded in the insulating layer 261. The level of the top surface of the insulating layer 255*b* is equal to or substantially equal to the level of the top surface of the plug 256. A variety of conductive materials can be used for the plugs.

The protective layer 131 is provided over the light-emitting device 130R, the light-emitting device 130G, and the light-emitting device 130B. The substrate 120 is bonded to the protective layer 131 with the resin layer 122. Embodiment 1 can be referred to for details of the light-emitting devices and the components thereover up to the substrate 120. The substrate 120) corresponds to the substrate 292 in FIG. 13A.

Top end portions of the pixel electrodes 111*a*, 111*b*, and 111*c* are not covered with an insulating layer. This allows the distance between adjacent light-emitting devices to be extremely short. As a result, the display apparatus can have high resolution or high definition.

FIG. 1B and the like illustrate an example where the light-emitting devices 130R, 130G, and 130G include the first layer 113*a*, the second layer 113*b*, and the third layer 113*c*, respectively, which have different structures; however, the EL layers included in the light-emitting devices 130R, 130G, and 130B may have the same structure.

Figure 14B:
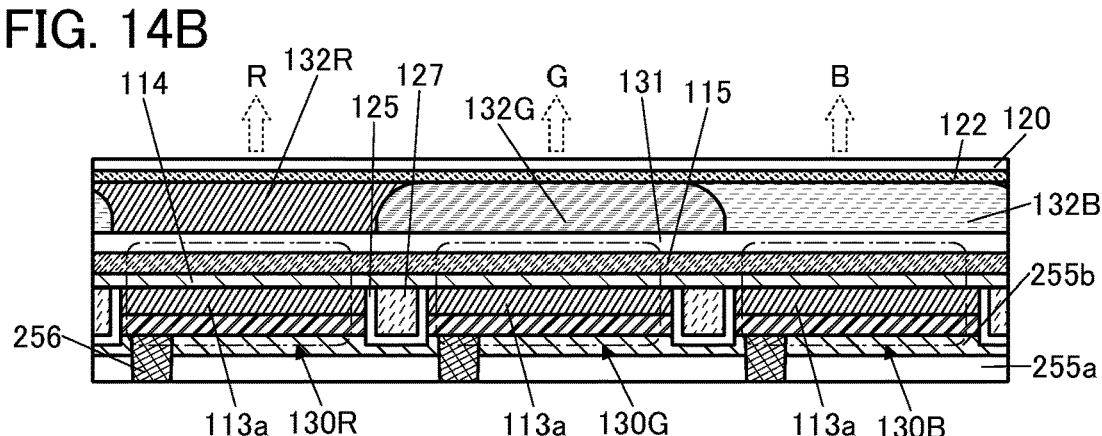
Figure 14C:
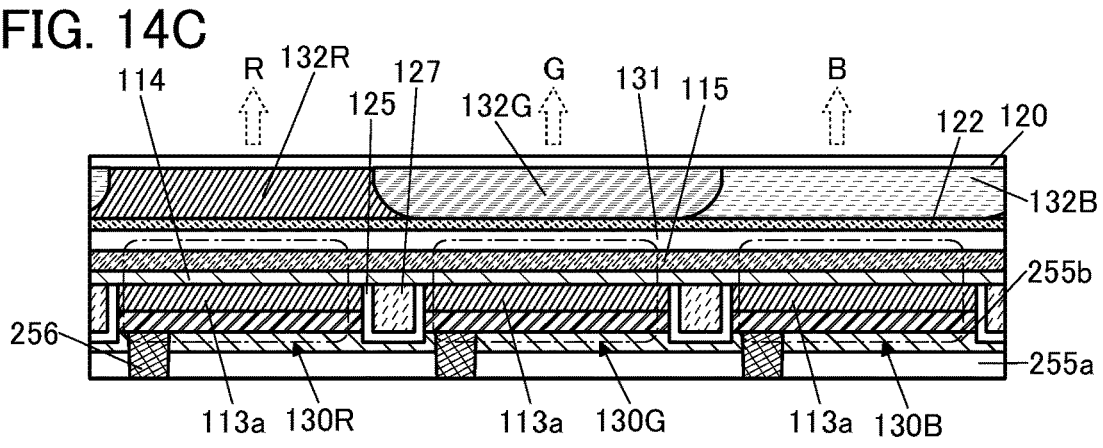

FIG. 14B and FIG. 14C each illustrate an example where the light-emitting devices 130R, 130G, and 130B have the same structure. The light-emitting devices 130R, 130G, and 130B illustrated in FIG. 14B and FIG. 14C each include the first layer 113a and the fourth layer 114 between the pixel electrode and the common electrode 115. For example, the light-emitting devices 130R, 130G, and 130B can emit white light.

FIG. 14B illustrates an example where coloring layers 132R, 132G, and 132B are provided over the protective layer 131. The substrate 120 is bonded to the coloring layers 132R, 132G, and 132B with the resin layer 122.

FIG. 14C illustrates an example where the substrate 120 provided with the coloring layers 132R, 132G, and 132B is bonded to the protective layer 131 with the resin layer 122.

In FIG. 14B and FIG. 14C, the light-emitting device 130R and the coloring layer 132R overlap with each other, and light emitted from the light-emitting device 130R passes through the red coloring layer 132R and is extracted as red light to the outside of the display apparatus. Similarly, the light-emitting device 130G and the green coloring layer 132G overlap with each other, and light emitted from the light-emitting device 130G passes through the coloring layer 132G and is extracted as green light to the outside of the display apparatus. The light-emitting device 130B and the blue coloring layer 132B overlap with each other, and light emitted from the light-emitting device 130B passes through the coloring layer 132B and is extracted as blue light to the outside of the display apparatus.

[Display Apparatus 100B]

Figure 15:
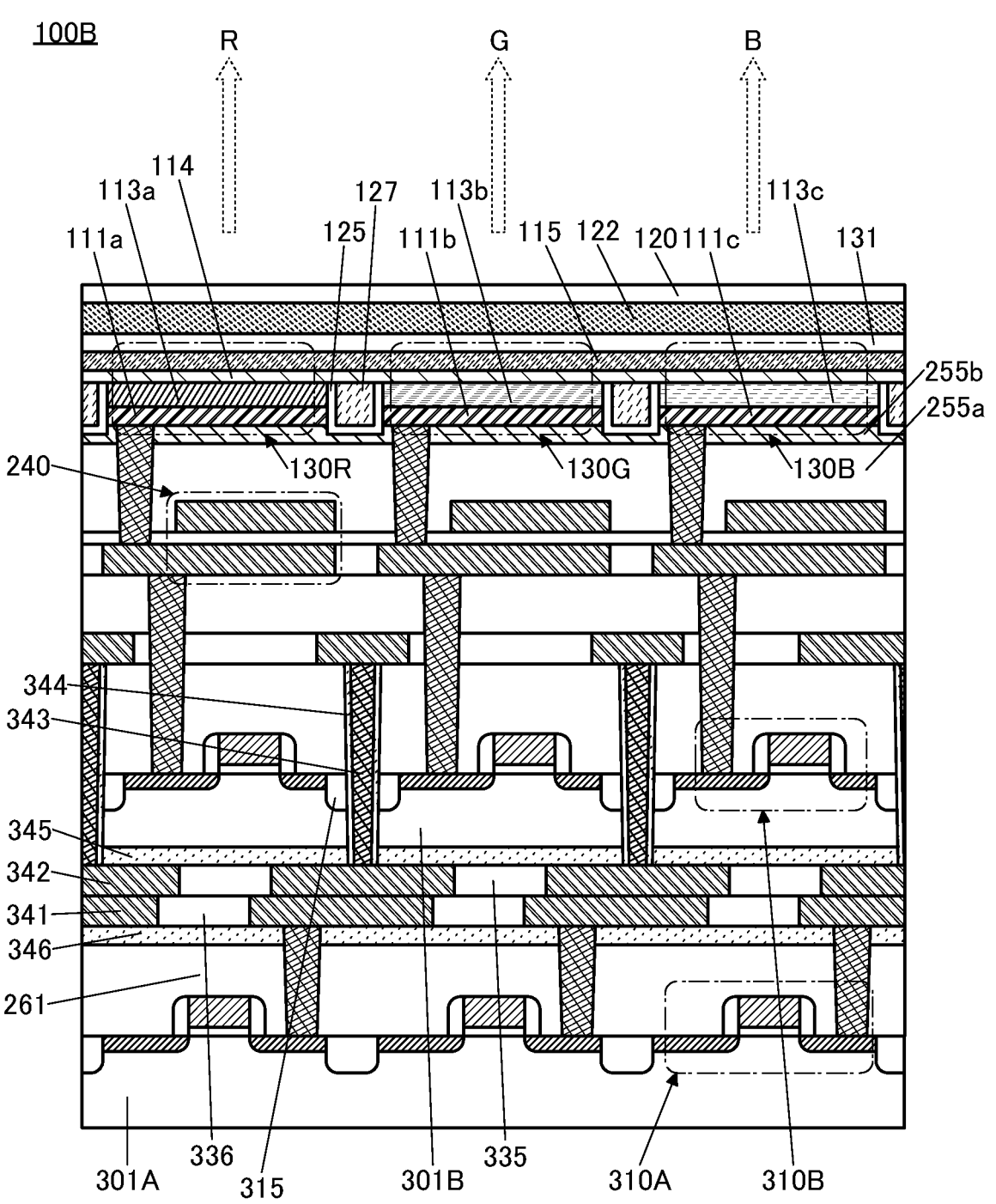
FIG. 15 is a cross-sectional view illustrating an example of a display apparatus.

The display apparatus 100B illustrated in FIG. 15 has a structure where a transistor 310A and a transistor 310B in each of which a channel is formed in a semiconductor substrate are stacked. Note that in the description of the display apparatus below, portions similar to those of the above-mentioned display apparatus are not described in some cases.

In the display apparatus 100B, a substrate 301B provided with the transistor 310B, the capacitor 240, and the light-emitting devices is bonded to a substrate 301A provided with the transistor 310A.

Here, an insulating layer 345 is preferably provided on the bottom surface of the substrate 301B. An insulating layer 346 is preferably provided over the insulating layer 261 provided over the substrate 301A. The insulating layers 345 and 346 are insulating layers functioning as protective layers and can inhibit diffusion of impurities into the substrate 301B and the substrate 301A. For the insulating layers 345 and 346, an inorganic insulating film that can be used for the protective layer 131 or an insulating layer 332 can be used.

The substrate 301B is provided with a plug 343 that penetrates the substrate 301B and the insulating layer 345. An insulating layer 344 is preferably provided to cover a side surface of the plug 343. The insulating layer 344 functions as a protective layer and can inhibit diffusion of impurities into the substrate 301B. For the insulating layer 344, an inorganic insulating film that can be used for the protective layer 131 can be used.

A conductive layer 342 is provided under the insulating layer 345 on the rear surface of the substrate 301B (the surface opposite to the substrate 120). The conductive layer 342 is preferably provided to be embedded in an insulating layer 335. The bottom surfaces of the conductive layer 342 and the insulating layer 335 are preferably planarized. Here, the conductive layer 342 is electrically connected to the plug 343.

Over the substrate 301A, a conductive layer 341 is provided over the insulating layer 346. The conductive layer 341 is preferably provided to be embedded in an insulating layer 336. The top surfaces of the conductive layer 341 and the insulating layer 336 are preferably planarized.

The conductive layer 341 and the conductive layer 342 are bonded to each other, whereby the substrate 301A and the substrate 301B are electrically connected to each other. Here, improving the flatness of a plane formed by the conductive layer 342 and the insulating layer 335 and a plane formed by the conductive layer 341 and the insulating layer 336 allows the conductive layer 341 and the conductive layer 342 to be bonded to each other favorably.

The conductive layer 341 and the conductive layer 342 are preferably formed using the same conductive material. For example, a metal film containing an element selected from Al, Cr, Cu, Ta, Ti, Mo, and W, a metal nitride film containing the above element as a component (a titanium nitride film, a molybdenum nitride film, or a tungsten nitride film), or the like can be used. Copper is particularly preferably used for the conductive layer 341 and the conductive layer 342. In that case, it is possible to employ Cu-to-Cu (copper-to-copper) direct bonding technique (a technique for achieving electrical continuity by connecting Cu (copper) pads.

[Display Apparatus 100C]

Figure 16:
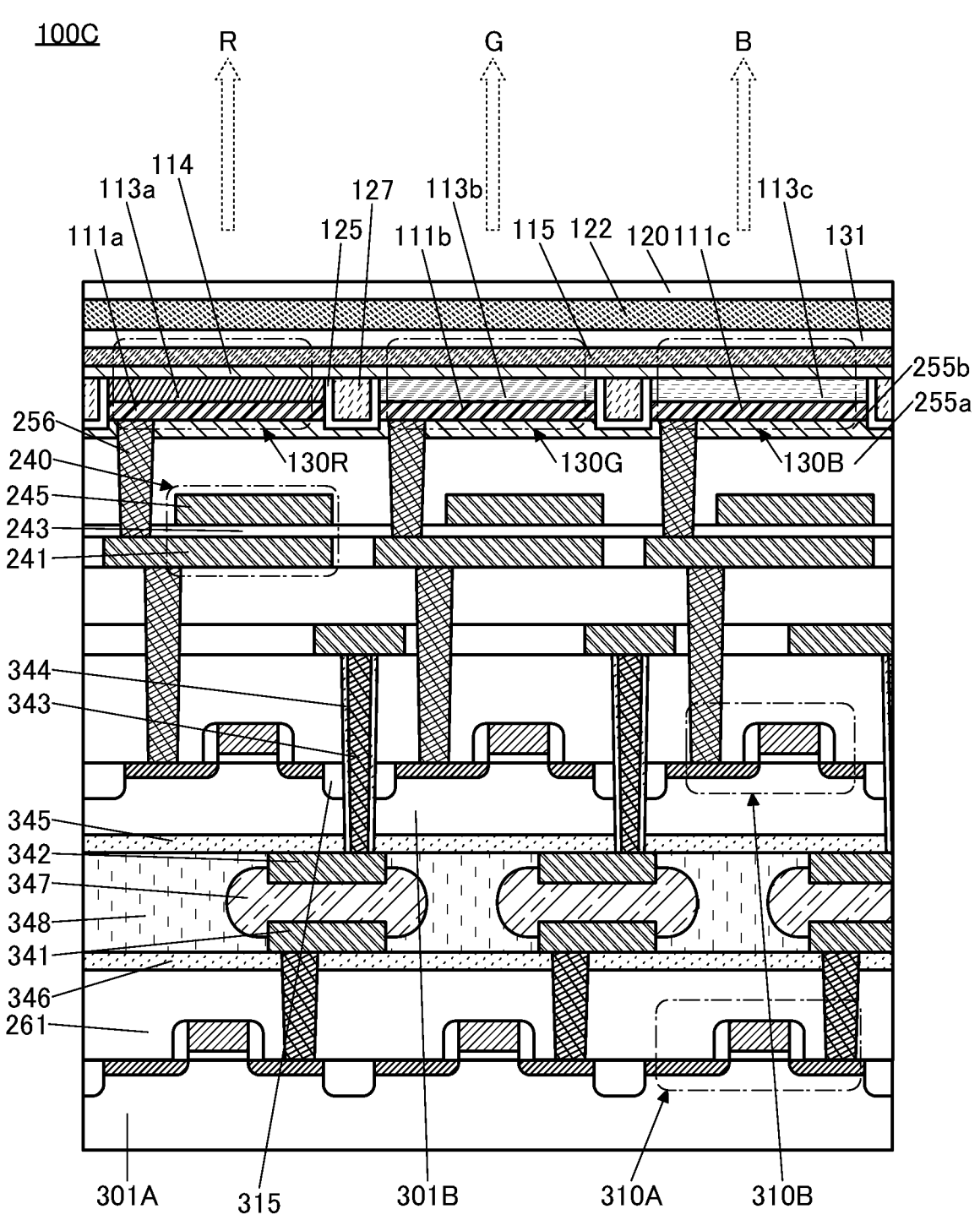
FIG. 16 is a cross-sectional view illustrating an example of a display apparatus.

The display apparatus 100C illustrated in FIG. 16 has a structure where the conductive layer 341 and the conductive layer 342 are bonded to each other through a bump 347.

As illustrated in FIG. 16, providing the bump 347 between the conductive layer 341 and the conductive layer 342 enables the conductive layer 341 and the conductive layer 342 to be electrically connected to each other. The bump 347 can be formed using a conductive material containing gold (Au), nickel (Ni), indium (In), tin (Sn), or the like, for example. As another example, solder may be used for the bump 347. An adhesive layer 348 may be provided between the insulating layer 345 and the insulating layer 346. In the case where the bump 347 is provided, the insulating layer 335 and the insulating layer 336 may be omitted.

[Display Apparatus 100D]

Figure 17:
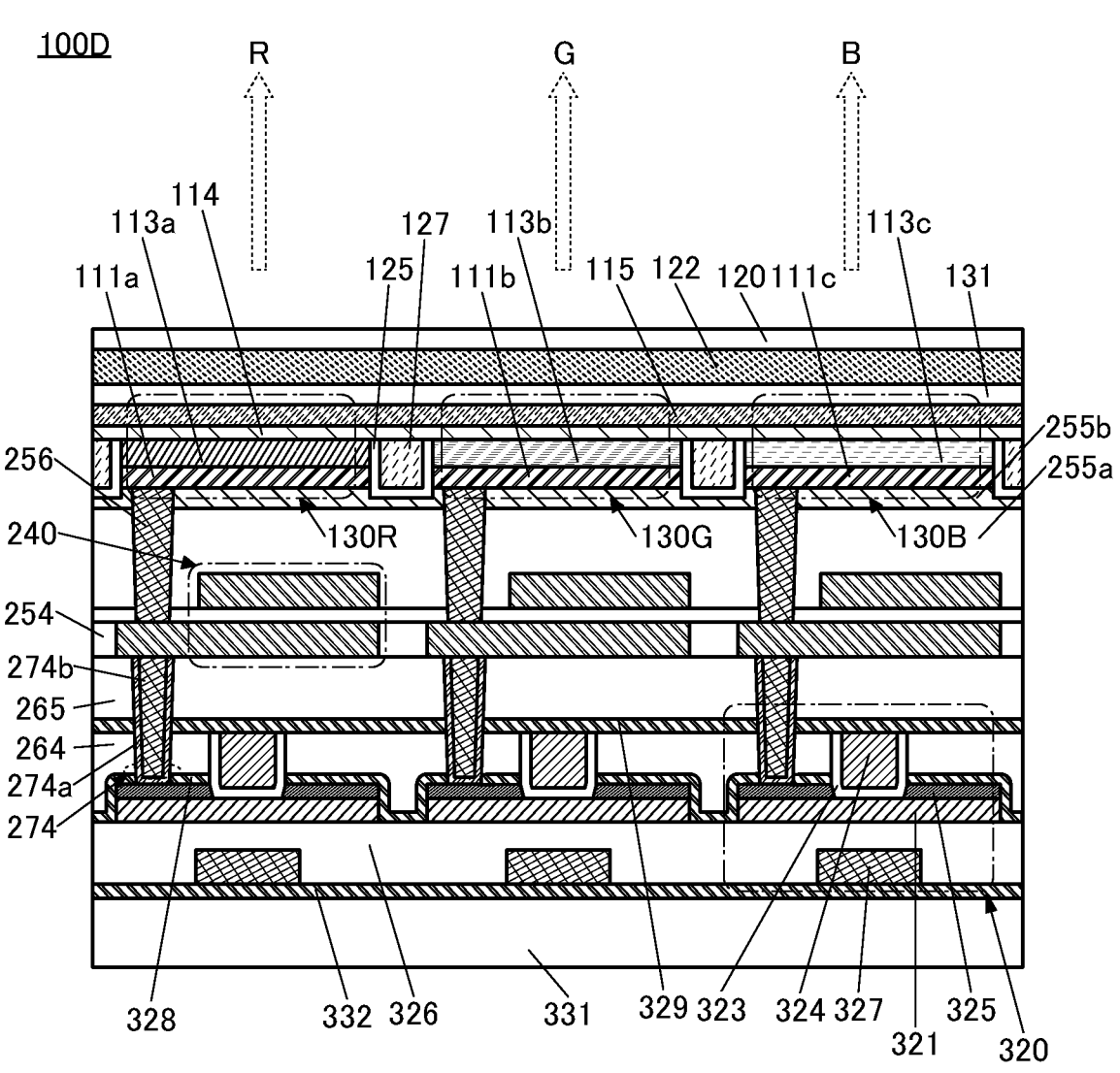
FIG. 17 is a cross-sectional view illustrating an example of a display apparatus.

The display apparatus 100D illustrated in FIG. 17 differs from the display apparatus 100A mainly in a structure of a transistor.

A transistor 320 is a transistor that contains a metal oxide (also referred to as an oxide semiconductor) in a semiconductor layer where a channel is formed (i.e., an OS transistor).

The transistor 320 includes a semiconductor layer 321, an insulating layer 323, a conductive layer 324, a pair of conductive layers 325, an insulating layer 326, and a conductive layer 327.

A substrate 331 corresponds to the substrate 291 in FIG. 13A and FIG. 13B. A stacked-layer structure including the substrate 331 and components thereover up to the insulating layer 255b corresponds to the layer 101 including transistors in Embodiment 1. As the substrate 331, an insulating substrate or a semiconductor substrate can be used.

The insulating layer 332 is provided over the substrate 331. The insulating layer 332 functions as a barrier layer that prevents diffusion of impurities such as water and hydrogen from the substrate 331 into the transistor 320 and release of oxygen from the semiconductor layer 321 to the insulating layer 332 side. As the insulating layer 332, for example, a film through which hydrogen or oxygen is less likely to diffuse than in a silicon oxide film, such as an aluminum oxide film, a hafnium oxide film, or a silicon nitride film, can be used.

The conductive layer 327 is provided over the insulating layer 332, and the insulating layer 326 is provided to cover the conductive layer 327. The conductive layer 327 functions as a first gate electrode of the transistor 320, and part of the insulating layer 326 functions as a first gate insulating layer. An oxide insulating film such as a silicon oxide film is preferably used as at least part of the insulating layer 326 that is in contact with the semiconductor layer 321. The top surface of the insulating layer 326 is preferably planarized.

The semiconductor layer 321 is provided over the insulating layer 326. The semiconductor layer 321 preferably includes a metal oxide (also referred to as an oxide semiconductor) film having semiconductor characteristics. The pair of conductive layers 325 are provided over and in contact with the semiconductor layer 321 and function as a source electrode and a drain electrode.

An insulating layer 328 is provided to cover the top and side surfaces of the pair of conductive layers 325, the side surface of the semiconductor layer 321, and the like, and an insulating layer 264 is provided over the insulating layer 328. The insulating layer 328 functions as a barrier layer that prevents diffusion of impurities such as water and hydrogen from the insulating layer 264 and the like into the semiconductor layer 321 and release of oxygen from the semiconductor layer 321. As the insulating layer 328, an insulating film similar to the insulating layer 332 can be used.

An opening reaching the semiconductor layer 321 is provided in the insulating layer 328 and the insulating layer 264. The insulating layer 323 that is in contact with the side surfaces of the insulating layer 264, the insulating layer 328, and the conductive layer 325, and the top surface of the semiconductor layer 321, and the conductive layer 324 are embedded in the opening. The conductive layer 324 functions as a second gate electrode, and the insulating layer 323 functions as a second gate insulating layer.

The top surface of the conductive layer 324, the top surface of the insulating layer 323, and the top surface of the insulating layer 264 are subjected to planarization treatment so that their levels are equal to or substantially equal to each other, and an insulating layer 329 and an insulating layer 265 are provided to cover these layers.

The insulating layer 264 and the insulating layer 265 each function as an interlayer insulating layer. The insulating layer 329 functions as a barrier layer that prevents diffusion of impurities such as water and hydrogen from the insulating layer 265 and the like into the transistor 320. As the insulating layer 329, an insulating film similar to the insulating layer 328 and the insulating layer 332 can be used.

A plug 274 electrically connected to one of the pair of conductive layers 325 is provided so as to be embedded in the insulating layer 265, the insulating layer 329, and the insulating layer 264. Here, the plug 274 preferably includes a conductive layer 274a that covers the side surface of an opening in the insulating layer 265, the insulating layer 329, the insulating layer 264, and the insulating layer 328 and part of the top surface of the conductive layer 325, and a conductive layer 274b in contact with the top surface of the conductive layer 274a. In this case, a conductive material through which hydrogen and oxygen are less likely to diffuse is preferably used for the conductive layer 274a.
[Display Apparatus 100E]

Figure 18:
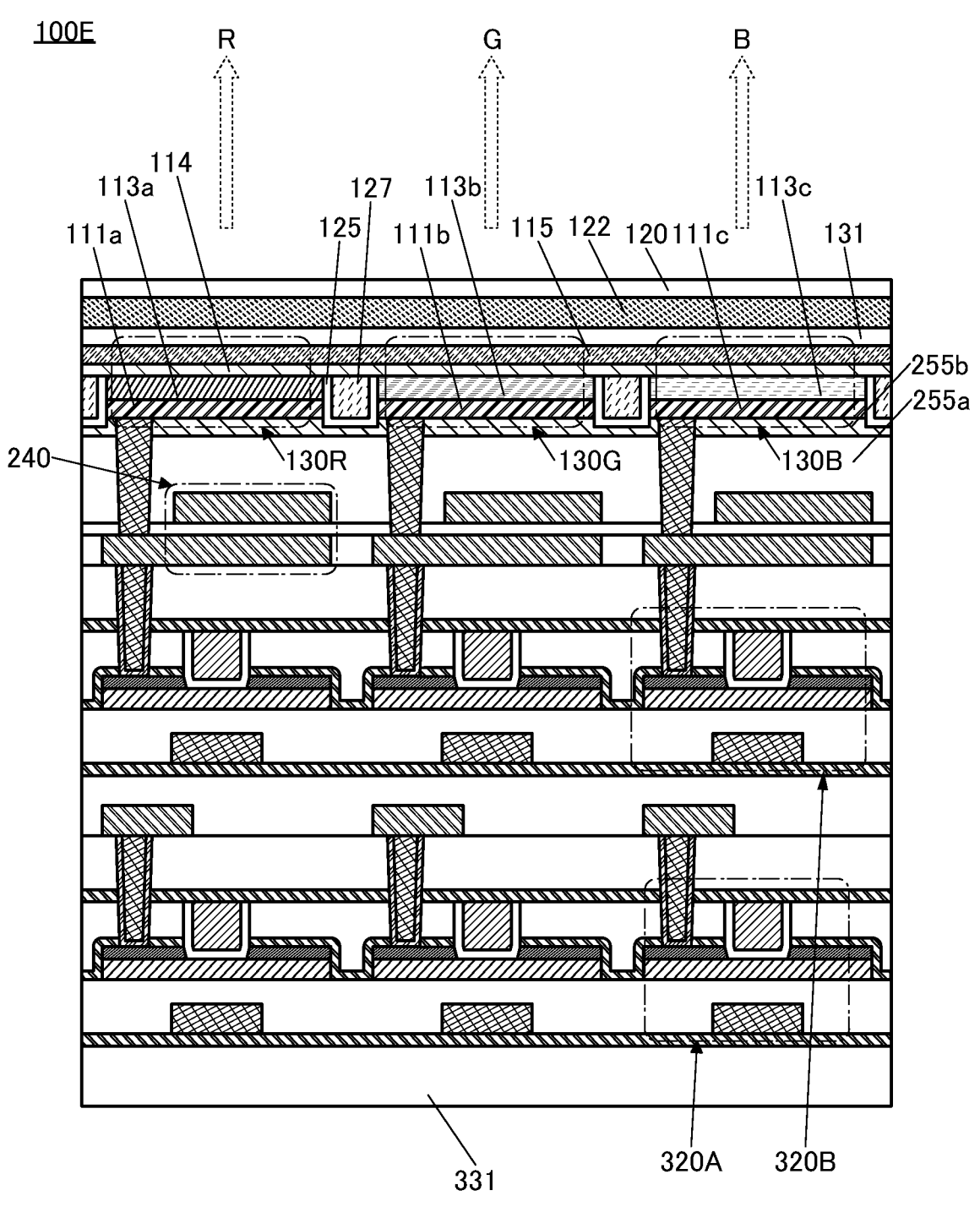
FIG. 18 is a cross-sectional view illustrating an example of a display apparatus.

The display apparatus 100E illustrated in FIG. 18 has a structure in which a transistor 320A and a transistor 320B each including an oxide semiconductor in a semiconductor where a channel is formed are stacked.

The description of the display apparatus 100D can be referred to for the transistor 320A, the transistor 320B, and the components around them.

Although the structure where two transistors including an oxide semiconductor are stacked is described, the present invention is not limited thereto. For example, three or more transistors may be stacked.
[Display Apparatus 100F]

Figure 19:
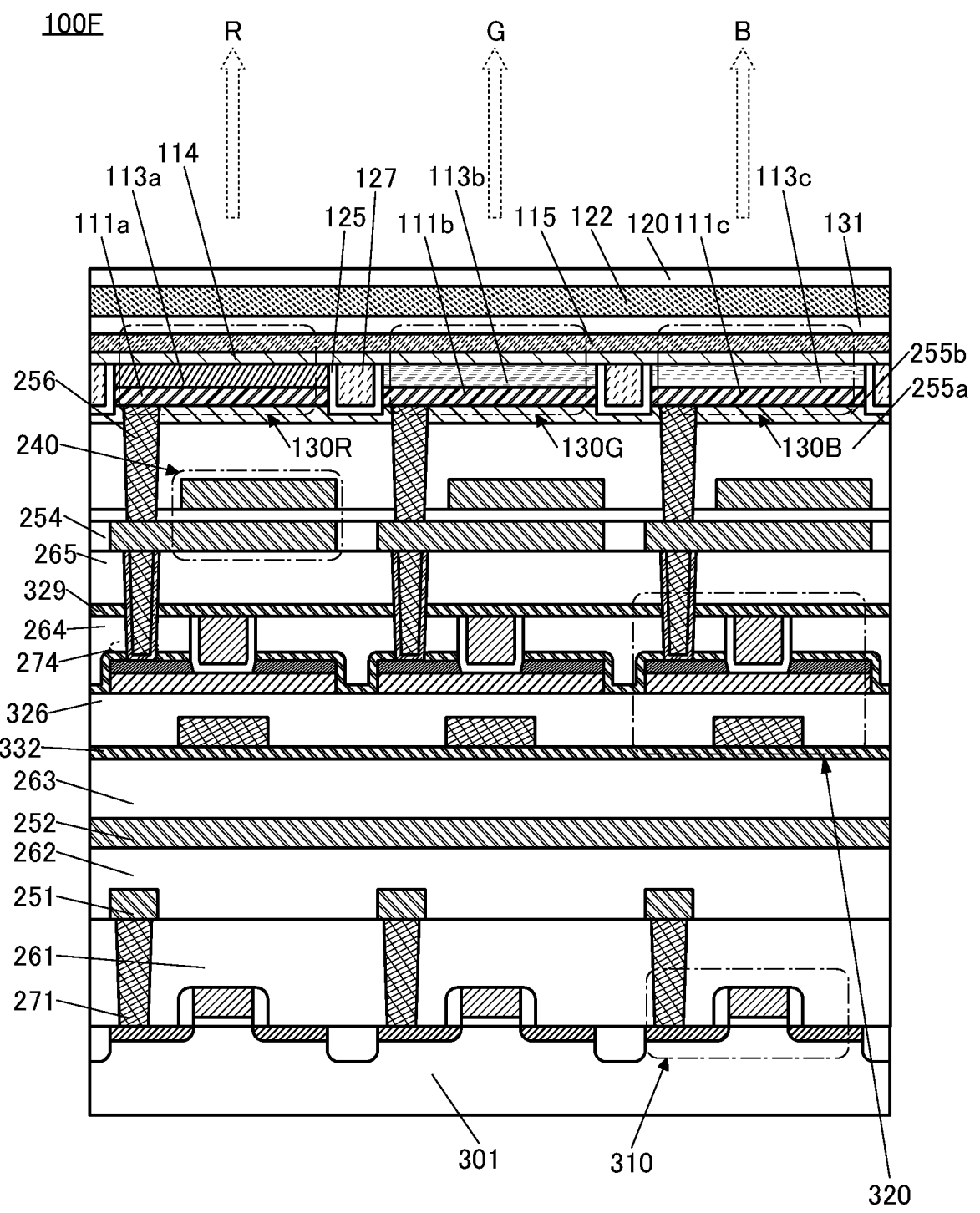
FIG. 19 is a cross-sectional view illustrating an example of a display apparatus.

The display apparatus 100F illustrated in FIG. 19 has a structure in which the transistor 310 whose channel is formed in the substrate 301 and the transistor 320 including a metal oxide in the semiconductor layer where the channel is formed are stacked.

The insulating layer 261 is provided to cover the transistor 310, and a conductive layer 251 is provided over the insulating layer 261. An insulating layer 262 is provided to cover the conductive layer 251, and a conductive layer 252 is provided over the insulating layer 262. The conductive layer 251 and the conductive layer 252 each function as a wiring. An insulating layer 263 and the insulating layer 332 are provided to cover the conductive layer 252, and the transistor 320 is provided over the insulating layer 332. The insulating layer 265 is provided to cover the transistor 320, and the capacitor 240 is provided over the insulating layer 265. The capacitor 240 and the transistor 320 are electrically connected to each other through the plug 274.

The transistor 320 can be used as a transistor included in the pixel circuit. The transistor 310 can be used as a transistor included in the pixel circuit or a transistor included in a driver circuit (a gate line driver circuit or a source line driver circuit) for driving the pixel circuit. The transistor 310 and the transistor 320 can also be used as transistors included in a variety of circuits such as an arithmetic circuit and a memory circuit.

With such a structure, not only the pixel circuit but also the driver circuit and the like can be formed directly under the light-emitting devices; thus, the display apparatus can be downsized as compared with the case where a driver circuit is provided around a display region.
[Display Apparatus 100G]

Figure 20:
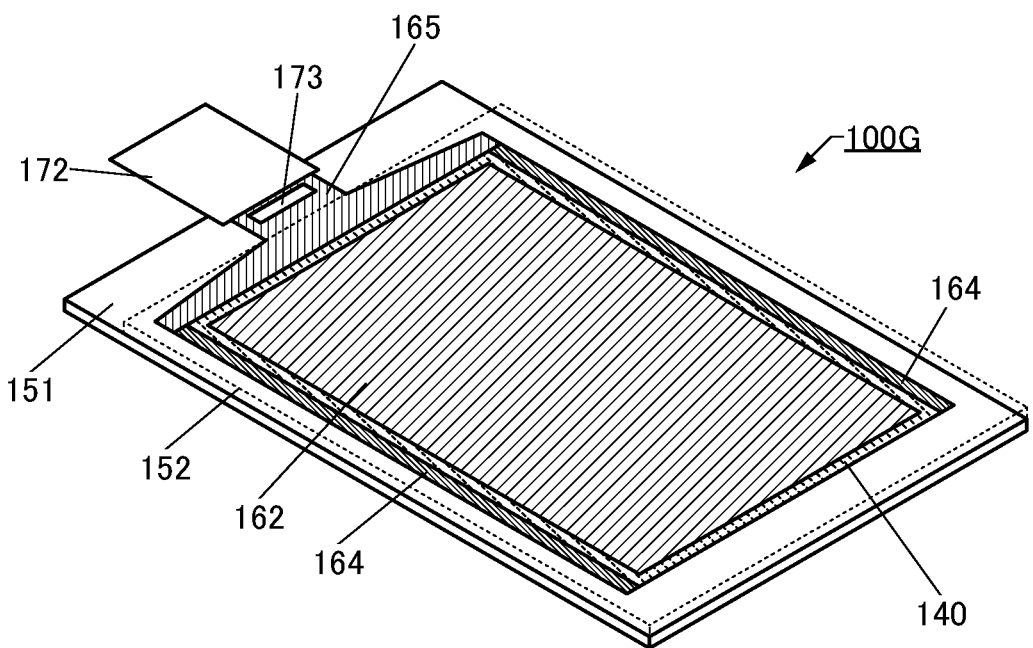
FIG. 20 is a perspective view illustrating an example of a display apparatus.
Figures 21A, 21B, 21C:
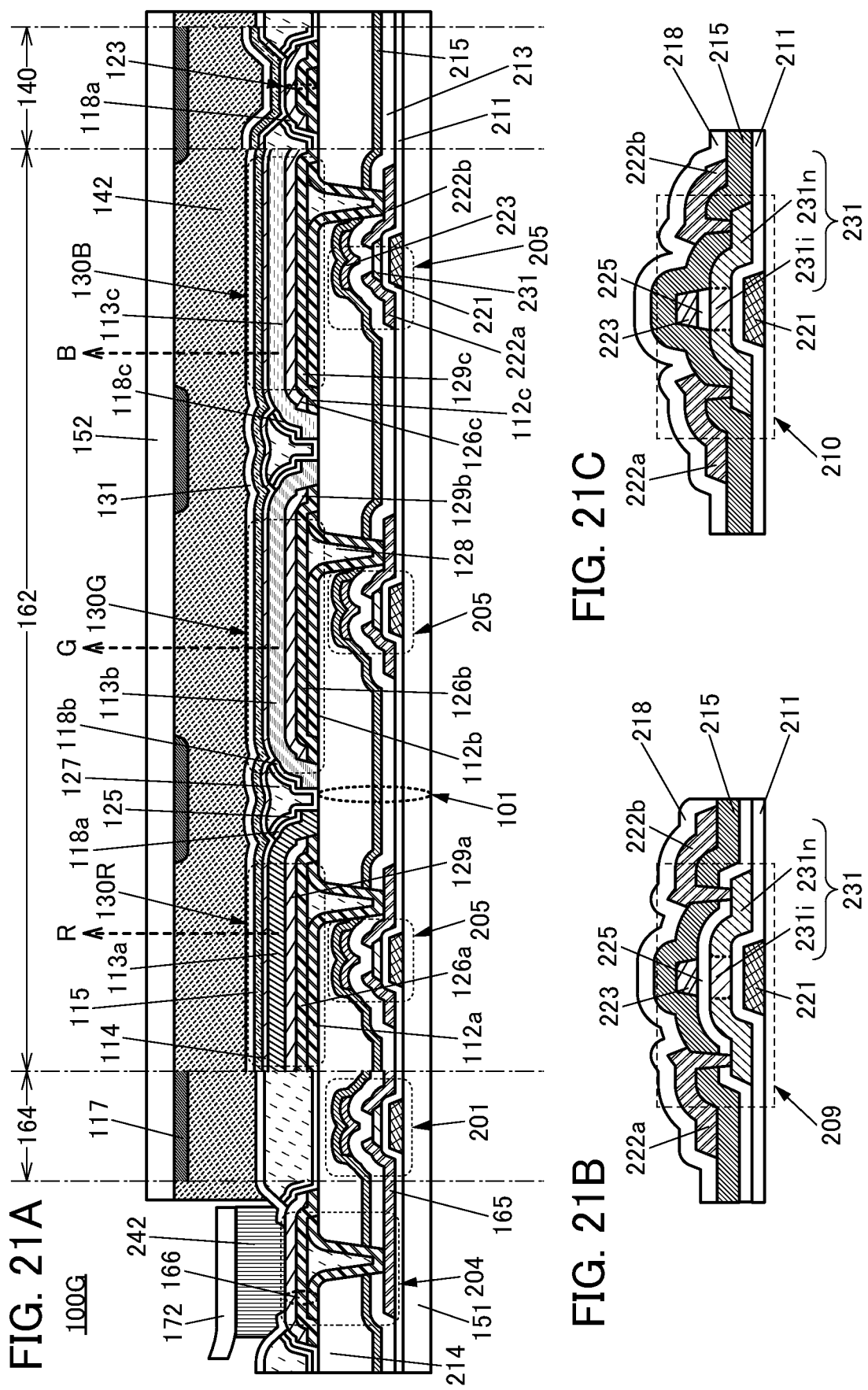
FIG. 21A is a cross-sectional view illustrating an example of a display apparatus.
FIG. 21B and FIG. 21C are cross-sectional views illustrating examples of transistors.

FIG. 20 is a perspective view of the display apparatus 100G, and FIG. 21A is a cross-sectional view of the display apparatus 100G.

In the display apparatus 100G, a substrate 152 and a substrate 151 are bonded to each other. In FIG. 20, the substrate 152 is denoted by a dashed line.

The display apparatus 100G includes a display portion 162, the connection portion 140, a circuit 164, a wiring 165, and the like. FIG. 20 illustrates an example where an IC 173 and an FPC 172 are mounted on the display apparatus 100G. Thus, the structure illustrated in FIG. 20 can be regarded as a display module including the display apparatus 100G, the IC (integrated circuit), and the FPC.

The connection portion 140 is provided outside the display portion 162. The connection portion 140 can be provided along one or more sides of the display portion 162. The number of connection portions 140 can be one or more. FIG. 20 illustrates an example where the connection portion 140 is provided to surround the four sides of the display portion. A common electrode of a light-emitting device is electrically connected to a conductive layer in the connection portion 140, so that a potential can be supplied to the common electrode.

As the circuit 164, a scan line driver circuit can be used, for example.

The wiring 165 has a function of supplying a signal and power to the display portion 162 and the circuits 164. The signal and power are input to the wiring 165 from the outside through the FPC 172 or input to the wiring 165 from the IC 173.

FIG. 20 illustrates an example where the IC 173 is provided over the substrate 151 by a COG (Chip On Glass) method, a COF (Chip On Film) method, or the like. An IC including a scan line driver circuit, a signal line driver circuit, or the like can be used as the IC 173, for example. Note that the display apparatus 100G and the display module are not necessarily provided with an IC. The IC may be mounted on the FPC by a COF method or the like.

FIG. 21A illustrates an example of cross sections of part of a region including the FPC 172, part of the circuit 164, part of the display portion 162, part of the connection portion 140, and part of a region including an end portion of the display apparatus 100G.

The display apparatus 100G illustrated in FIG. 21A includes a transistor 201, a transistor 205, the light-emitting device 130R that emits red light, the light-emitting device 130G that emits green light, the light-emitting device 130B that emits blue light, and the like between the substrate 151 and the substrate 152.

The light-emitting devices 130R, 130G, and 130B each have the same structure as the stacked-layer structure illustrated in FIG. 1B except the structure of the pixel electrode. Embodiment 1 can be referred to for the details of the light-emitting devices.

The light-emitting device 130R includes a conductive layer 112a, a conductive layer 126a over the conductive layer 112a, and a conductive layer 129a over the conductive layer 126a. All of the conductive layers 112a, 126a, and 129a can be referred to as pixel electrodes, or one or two of them can be referred to as pixel electrodes.

The light-emitting device 130G includes a conductive layer 112b, a conductive layer 126b over the conductive layer 112b, and a conductive layer 129b over the conductive layer 126b.

The light-emitting device 130B includes a conductive layer 112c, a conductive layer 126c over the conductive layer 112c, and a conductive layer 129c over the conductive layer 126c.

The conductive layer 112a is connected to the conductive layer 222b included in the transistor 205 through an opening provided in the insulating layer 214. The end portion of the conductive layer 126a is positioned on the outer side of the end portion of the conductive layer 112a. The end portion of the conductive layer 126a and the end portion of the conductive layer 129a are aligned or substantially aligned with each other. For example, a conductive layer functioning as a reflective electrode can be used as the conductive layer 112a and the conductive layer 126a, and a conductive layer functioning as a transparent electrode can be used as the conductive layer 129a.

Detailed description of the conductive layers 112b, 126b, and 129b of the light-emitting device 130G and the conductive layers 112c, 126c, and 129c of the light-emitting device 130B is omitted because these conductive layers are similar to the conductive layers 112a, 126a, and 129a of the light-emitting device 130R.

Depressed portions are formed in the conductive layers 112a, 112b, and 112c to cover the openings provided in the insulating layer 214. A layer 128 is embedded in each of the depressed portions of the conductive layers 112a, 122b, and 112c.

The layer 128 has a planarization function for the depressed portions of the conductive layers 112a, 112b, and 112c. The conductive layers 126a, 126b, and 126c electrically connected to the conductive layers 112a, 112b, and 112c, respectively, are provided over the conductive layers 112a, 112b, and 112c and the layer 128. Thus, regions overlapping with the depressed portions of the conductive layers 112a, 112b, and 112c can also be used as the light-emitting regions, increasing the aperture ratio of the pixels.

The layer 128 may be an insulating layer or a conductive layer. Any of a variety of inorganic insulating materials, organic insulating materials, and conductive materials can be used for the layer 128 as appropriate. In particular, the layer 128 is preferably formed using an insulating material.

An insulating layer containing an organic material can be suitably used for the layer 128. For the layer 128, an acrylic resin, a polyimide resin, an epoxy resin, a polyamide resin, a polyimide-amide resin, a siloxane resin, a benzocy-clobutene-based resin, a phenol resin, a precursor of any of these resins, or the like can be used, for example. A photosensitive resin can also be used for the layer 128. As the photosensitive resin, a positive photosensitive material or a negative photosensitive material can be used.

When a photosensitive resin is used, the layer 128 can be formed through only light-exposure and development steps, reducing the influence of dry etching, wet etching, or the like on the surfaces of the conductive layers 112a, 112b, and 112c. When the layer 128 is formed using a negative photosensitive resin, the layer 128 can sometimes be formed using the same photomask (light-exposure mask) as the photomask used for forming the opening in the insulating layer 214.

The top and side surfaces of the conductive layer 126a and the top and side surfaces of the conductive layer 129a are covered with the first layer 113a. Similarly, the top surface and side surfaces of the conductive layer 126b and the top and side surfaces of the conductive layer 129b are covered with the second layer 113b. Moreover, the top and side surfaces of the conductive layer 126c and the top and side surfaces of the conductive layer 129c are covered with the third layer 113c. Accordingly, regions provided with the conductive layers 126a, 126b, and 126c can be entirely used as the light-emitting regions of the light-emitting devices 130R, 130G, and 130B, increasing the aperture ratio of the pixels.

The side surfaces of the first layer 113a, the second layer 113b, and the third layer 113c are covered with the insulating layers 125 and 127. The sacrificial layer 118a is positioned between the first layer 113a and the insulating layer 125. The sacrificial layer 118b is positioned between the second layer 113b and the insulating layer 125, and the sacrificial layer 118c is positioned between the third layer 113c and the insulating layer 125. The fourth layer 114 is provided over the first layer 113a, the second layer 113b, the third layer 113c, and the insulating layers 125 and 127. The common electrode 115 is provided over the fourth layer 114. The fourth layer 114 and the common electrode 115 are each a continuous film shared by a plurality of light-emitting devices.

The protective layer 131 is provided over the light-emitting devices 130R, 130G, and 130B. The protective layer 131 and the substrate 152 are bonded to each other with an adhesive layer 142. A solid sealing structure, a hollow sealing structure, or the like can be employed to seal the light-emitting devices. In FIG. 21A, a solid sealing structure is employed in which a space between the substrate 152 and the substrate 151 is filled with the adhesive layer 142. Alternatively, a hollow sealing structure in which the space is filled with an inert gas (e.g., nitrogen or argon) may be employed. Here, the adhesive layer 142 may be provided not to overlap with the light-emitting devices. The space may be filled with a resin other than the frame-shaped adhesive layer 142.

The conductive layer 123 is provided over the insulating layer 214 in the connection portion 140. An example is described in which the conductive layer 123 has a stacked-layer structure of a conductive film obtained by processing the same conductive film as the conductive layers 112a, 112b, and 112c: a conductive film obtained by processing the same conductive film as the conductive layers 126a, 126b, and 126c: and a conductive film obtained by processing the same conductive film as the conductive layers 129a, 129b, and 129c. The end portion of the conductive layer 123 is covered with the sacrificial layer, the insulating layer 125, and the insulating layer 127. The fourth layer 114 is provided over the conductive layer 123, and the common electrode 115 is provided over the fourth layer 114. The conductive layer 123 and the common electrode 115 are electrically connected to each other through the fourth layer 114. Note that the fourth layer 114 is not necessarily formed in the connection portion 140. In this case, the conductive layer 123 and the common electrode 115 are in direct contact with each other to be electrically connected to each other.

The display apparatus 100G has a top-emission structure. Light emitted from the light-emitting device is emitted toward the substrate 152. For the substrate 152, a material having a high property of transmitting visible light is preferably used. The pixel electrode contains a material that reflects visible light, and a counter electrode (the common electrode 115) contains a material that transmits visible light.

A stacked-layer structure including the substrate 151 and the components thereover up to the insulating layer 214 corresponds to the layer 101 including transistors in Embodiment 1.

The transistor 201 and the transistor 205 are formed over the substrate 151. These transistors can be fabricated using the same material in the same step.

An insulating layer 211, an insulating layer 213, an insulating layer 215, and the insulating layer 214 are provided in this order over the substrate 151. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of gate insulating layers and the number of insulating layers covering the transistors are not limited and may each be one or two or more.

A material through which impurities such as water and hydrogen do not easily diffuse is preferably used for at least one of the insulating layers covering the transistors. This allows the insulating layer to function as a barrier layer. Such a structure can effectively inhibit diffusion of impurities into the transistors from the outside and increase the reliability of a display apparatus.

An inorganic insulating film is preferably used as each of the insulating layer 211, the insulating layer 213, and the insulating layer 215. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

An organic insulating layer is suitable as the insulating layer 214 functioning as a planarization layer. Examples of materials that can be used for the organic insulating layer include an acrylic resin, a polyimide resin, an epoxy resin, a polyamide resin, a polyimide-amide resin, a siloxane resin, a benzocyclobutene-based resin, a phenol resin, and precursors of these resins. The insulating layer 214 may have a stacked-layer structure of an organic insulating layer and an inorganic insulating layer. The uppermost layer of the insulating layer 214 preferably has a function of an etching protective layer. Accordingly, a depressed portion can be prevented from being formed in the insulating layer 214 at the time of processing the conductive layer 112a, the conductive layer 126a, the conductive layer 129a, or the like. Alternatively, a depressed portion may be formed in the insulating layer 214 at the time of processing the conductive layer 112a, the conductive layer 126a, the conductive layer 129a, or the like.

Each of the transistor 201 and the transistor 205 includes a conductive layer 221 functioning as a gate, the insulating layer 211 functioning as a gate insulating layer, a conductive layer 222a and the conductive layer 222b functioning as a source and a drain, a semiconductor layer 231, the insulating layer 213 functioning as a gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display apparatus of this embodiment. For example, a planar transistor, a staggered transistor, an inverted staggered transistor, or the like can be used. A top-gate or a bottom-gate transistor structure may be employed. Alternatively, gates may be provided above and below the semiconductor layer where a channel is formed.

The structure where the semiconductor layer where a channel is formed is provided between two gates is used for the transistor 201 and the transistor 205. The two gates may be connected to each other and supplied with the same signal to drive the transistor. Alternatively, a potential for controlling the threshold voltage may be supplied to one of the two gates and a potential for driving may be supplied to the other to control the threshold voltage of the transistor.

There is no particular limitation on the crystallinity of a semiconductor material used for the transistors, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. A single crystal semiconductor or a semiconductor having crystallinity is preferably used, in which case degradation of the transistor characteristics can be inhibited.

The semiconductor layer of the transistor preferably includes a metal oxide (also referred to as an oxide semiconductor). That is, a transistor including a metal oxide in its channel formation region (hereinafter, also referred to as an OS transistor) is preferably used for the display apparatus of this embodiment.

As the oxide semiconductor having crystallinity, a CAAC (c-axis aligned crystalline)-OS, an nc (nanocrystalline)-OS, and the like can be given.

Alternatively, a transistor using silicon in its channel formation region (a Si transistor) may be used. As silicon, single crystal silicon, polycrystalline silicon, amorphous silicon, and the like can be given. In particular, a transistor containing low-temperature polysilicon (LTPS) in its semiconductor layer (hereinafter also referred to as an LTPS transistor) can be used. The LTPS transistor has high field-effect mobility and favorable frequency characteristics.

With the use of Si transistors such as LTPS transistors, a circuit required to be driven at a high frequency (e.g., a source driver circuit) can be formed on the same substrate as the display portion. Thus, external circuits mounted on the display apparatus can be simplified, and component cost and mounting cost can be reduced.

An OS transistor has extremely higher field-effect mobility than a transistor containing amorphous silicon. In addition, the OS transistor has an extremely low leakage current between a source and a drain in an off state (hereinafter, also referred to as off-state current), and charge accumulated in a capacitor that is connected in series to the transistor can be retained for a long period. Furthermore, power consumption of the display apparatus can be reduced with the use of an OS transistor.

The off-state current value per micrometer of channel width of the OS transistor at room temperature can be lower than or equal to 1 aA ($1\times10^{-18}$ A), lower than or equal to 1 zA ($1\times10^{-21}$ A), or lower than or equal to 1 yA ($1\times10^{-24}$ A). Note that the off-state current value per micrometer of channel width of a Si transistor at room temperature is higher than or equal to 1 fA ($1\times10^{-15}$ A) and lower than or equal to 1 pA ($1\times10^{-12}$ A). In other words, the off-state current of an OS transistor is lower than that of a Si transistor by approximately ten orders of magnitude.

To increase the emission luminance of the light-emitting device included in the pixel circuit, the amount of current fed through the light-emitting device needs to be increased. For this, it is necessary to increase the source-drain voltage of a driving transistor included in the pixel circuit. Since an OS transistor has a higher withstand voltage between the source and the drain than a Si transistor, a high voltage can be applied between the source and the drain of the OS transistor. Accordingly, when an OS transistor is used as the driving transistor included in the pixel circuit, the amount of current flowing through the light-emitting device can be increased, so that the emission luminance of the light-emitting device can be increased.

When transistors operate in a saturation region, a change in source-drain current with respect to a change in gate-source voltage can be smaller in an OS transistor than in a Si transistor. Accordingly, when an OS transistor is used as the driving transistor in the pixel circuit, the amount of current flowing between the source and the drain can be set minutely by a change in gate-source voltage; hence, the amount of current flowing through the light-emitting device can be controlled. Accordingly, the number of gray levels in the pixel circuit can be increased.

Regarding saturation characteristics of a current flowing when transistors operate in a saturation region, even in the case where the source-drain voltage of an OS transistor increases gradually, a more stable current (saturation current) can be fed through the OS transistor than through a Si transistor. Thus, by using an OS transistor as the driving transistor, a stable current can be fed through light-emitting devices even when the current-voltage characteristics of the EL devices vary, for example. In other words, when the OS transistor operates in the saturation region, the source-drain current hardly changes with an increase in the source-drain voltage; hence, the emission luminance of the light-emitting device can be stable.

As described above, with the use of an OS transistor as a driving transistor included in the pixel circuit, it is possible to achieve "inhibition of black floating", "increase in emission luminance", "increase in gray level", "inhibition of variation in light-emitting devices", and the like.

The metal oxide used for the semiconductor layer preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more kinds selected from aluminum, gallium, yttrium, and tin.

It is particularly preferable that an oxide containing indium (In), gallium (Ga), and zinc (Zn) (also referred to as IGZO) be used as the metal oxide used for the semiconductor layer. Alternatively, it is preferable to use an oxide containing indium, tin, and zinc. Further alternatively, it is preferable to use an oxide containing indium, gallium, tin, and zinc. Alternatively, an oxide containing indium (In), aluminum (Al), and zinc (Zn) (also referred to as IAZO) is preferably used for the semiconductor layer. Alternatively, an oxide containing indium (In), aluminum (Al), gallium (Ga), and zinc (Zn) (also referred to as IAGZO) is preferably used for the semiconductor layer.

When the metal oxide used for the semiconductor layer is an In-M-Zn oxide, the atomic ratio of In is preferably higher than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=1:3:2 or a composition in the neighborhood thereof, In:M:Zn=1:3:4 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of +30% of an intended atomic ratio.

For example, when the atomic ratio is described as In:Ga:Zn=4:2:3 or a composition in the neighborhood thereof, the case is included where Ga is greater than or equal to 1 and less than or equal to 3 and Zn is greater than or equal to 2 and less than or equal to 4 with In being 4. When the atomic ratio is described as In:Ga:Zn=5:1:6 or a composition in the neighborhood thereof, the case is included where Ga is greater than 0.1 and less than or equal to 2 and Zn is greater than or equal to 5 and less than or equal to 7 with In being 5. When the atomic ratio is described as In:Ga:Zn=1:1:1 or a composition in the neighborhood thereof, the case is included where Ga is greater than 0.1 and less than or equal to 2 and Zn is greater than 0.1 and less than or equal to 2 with In being 1.

The transistor included in the circuit 164 and the transistor included in the display portion 162 may have the same structure or different structures. One structure or two or more types of structures may be employed for a plurality of transistors included in the circuit 164. Similarly, one structure or two or more types of structures may be employed for a plurality of transistors included in the display portion 162.

All of the transistors included in the display portion 162 may be OS transistors or all of the transistors included in the display portion 162 may be Si transistors; alternatively, some of the transistors included in the display portion 162 may be OS transistors and the others may be Si transistors.

For example, when both an LTPS transistor and an OS transistor are used in the display portion 162, the display apparatus can have low power consumption and high drive capability. Note that a structure where an LTPS transistor and an OS transistor are used in combination is referred to as LTPO in some cases. Note that as a further suitable example, a structure can be given where an OS transistor is used as, for example, a transistor functioning as a switch for controlling conduction and non-conduction between wirings and an LTPS transistor is used as, for example, a transistor for controlling current.

For example, one of the transistors included in the display portion 162 functions as a transistor for controlling a current flowing through the light-emitting device and can be referred to as a driving transistor. One of a source and a drain of the driving transistor is electrically connected to the pixel electrode of the light-emitting device. An LTPS transistor is preferably used as the driving transistor. Accordingly, the amount of current flowing through the light-emitting device can be increased in the pixel circuit.

Another transistor included in the display portion 162 functions as a switch for controlling selection and non-selection of the pixel and can be referred to as a selection transistor. A gate of the selection transistor is electrically connected to a gate line, and one of a source and a drain thereof is electrically connected to a source line (signal line). An OS transistor is preferably used as the selection transistor. Accordingly, the gray level of the pixel can be maintained even with an extremely low frame frequency (e.g., 1 fps or less); thus, power consumption can be reduced by stopping the driver in displaying a still image.

As described above, the display apparatus of one embodiment of the present invention can have all of a high aperture ratio, high resolution, high display quality, and low power consumption.

Note that the display apparatus of one embodiment of the present invention has a structure including the OS transistor and the light-emitting device having an MML (metal maskless) structure. With this structure, the leakage current that might flow through the transistor and the leakage current that might flow between adjacent light-emitting devices (also referred to as lateral leakage current, side leakage current, or the like) can be extremely low. With the structure, a viewer can notice any one or more of the image crispness, the image sharpness, a high chroma, and a high contrast ratio in an image displayed on the display apparatus. When the leakage current that might flow through the transistor and the lateral leakage current that might flow between light-emitting devices are extremely low, display with little leakage of light at the time of black display (i.e., with few phenomena in which the black image looks whitish) (such display is also referred to as deep black display) can be achieved.

In particular, in the case where a light-emitting device having the MML structure employs the above-described SBS structure, a layer provided between light-emitting devices (for example, also referred to as an organic layer or a common layer which is commonly used between the light-emitting devices) is disconnected: accordingly, display with no or extremely small lateral leakage can be achieved.

FIG. 21B and FIG. 21C illustrate other structure examples of transistors.

A transistor 209 and a transistor 210 each include the conductive layer 221 functioning as a gate, the insulating layer 211 functioning as a gate insulating layer, the semiconductor layer 231 including a channel formation region 231$i$ and a pair of low-resistance regions 231$n$, the conductive layer 222$a$ connected to one of the pair of low-resistance regions 231$n$, the conductive layer 222$b$ connected to the other of the pair of the low-resistance regions 231$n$, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231$i$. The insulating layer 225 is positioned at least between the conductive layer 223 and the channel formation region 231$i$. Furthermore, an insulating layer 218 covering the transistor may be provided.

FIG. 21B illustrates an example of the transistor 209 in which the insulating layer 225 covers the top and side surfaces of the semiconductor layer 231. The conductive layer 222$a$ and the conductive layer 222$b$ are connected to the low-resistance regions 231$n$ through openings provided in the insulating layer 225 and the insulating layer 215. One of the conductive layer 222$a$ and the conductive layer 222$b$ functions as a source, and the other functions as a drain.

Meanwhile, in the transistor 210 illustrated in FIG. 21C, the insulating layer 225 overlaps with the channel formation region 231$i$ of the semiconductor layer 231 and does not overlap with the low-resistance regions 231$n$. The structure illustrated in FIG. 21C can be formed by processing the insulating layer 225 with the conductive layer 223 as a mask, for example. In FIG. 21C, the insulating layer 215 is provided to cover the insulating layer 225 and the conductive layer 223, and the conductive layer 222$a$ and the conductive layer 222$b$ are connected to the low-resistance regions 231$n$ through the openings in the insulating layer 215.

A connection portion 204 is provided in a region of the substrate 151 where the substrate 152 does not overlap. In the connection portion 204, the wiring 165 is electrically connected to the FPC 172 through a conductive layer 166 and a connection layer 242. An example is illustrated in which the conductive layer 166 has a stacked-layer structure of a conductive film obtained by processing the same conductive film as the conductive layers 112$a$, 112$b$, and 112$c$, a conductive film obtained by processing the same conductive film as the conductive layers 126$a$, 126$b$, and 126$c$, and a conductive film obtained by processing the same conductive film as the conductive layers 129$a$, 129$b$, and 129$c$. The conductive layer 166 is exposed on the top surface of the connection portion 204. Thus, the connection portion 204 and the FPC 172 can be electrically connected to each other through the connection layer 242.

A light-blocking layer 117 is preferably provided on a surface of the substrate 152 that faces the substrate 151. The light-blocking layer 117 can be provided between adjacent light-emitting devices, in the connection portion 140, and in the circuit 164, for example. A variety of optical members can be arranged on the outer surface of the substrate 152.

The protective layer 131 covering the light-emitting device can inhibit an impurity such as water from entering the light-emitting device, and increase the reliability of the light-emitting device.

The material that can be used for the substrate 120 can be used for each of the substrate 151 and the substrate 152.

The material that can be used for the resin layer 122 can be used for the adhesive layer 142.

As the connection layer 242, an anisotropic conductive film (ACF), an anisotropic conductive paste (ACP), or the like can be used.

[Display Apparatus 100H]

Figures 22A, 22B, 22C, 22D:
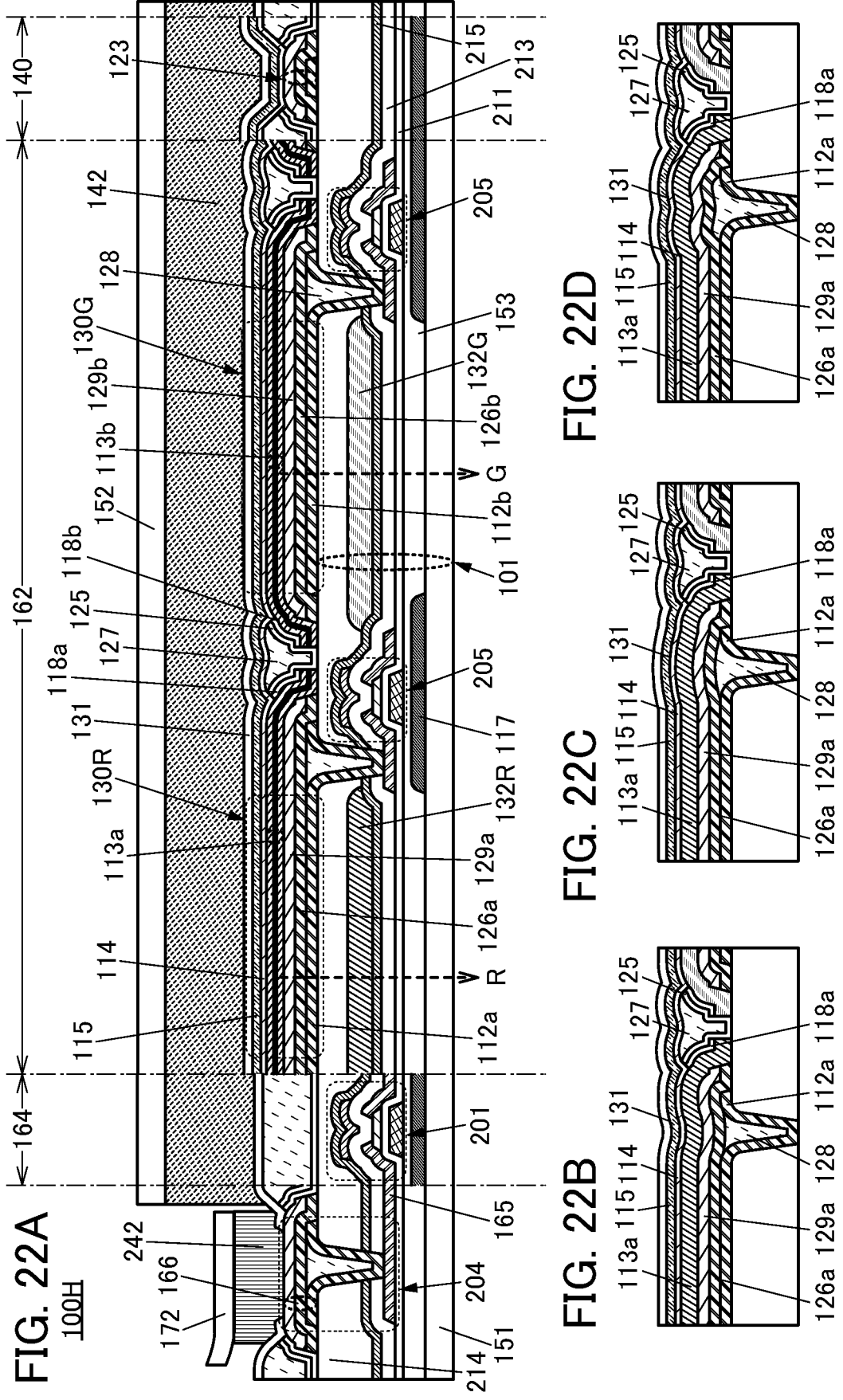
FIG. 22A to FIG. 22D are cross-sectional views illustrating examples of a display apparatus.

The display apparatus 100H illustrated in FIG. 22A is different from the display apparatus 100G mainly in that the display apparatus 100H is a bottom-emission display apparatus in which a white light-emitting device and a color filter are combined.

Light emitted from the light-emitting devices is emitted toward the substrate 151. For the substrate 151, a material having a high property of transmitting visible light is preferably used. On the other hand, there is no limitation on the light-transmitting property of a material used for the substrate 152.

The light-blocking layer 117 is preferably formed between the substrate 151 and the transistor 201 and between the substrate 151 and the transistor 205. FIG. 22A illustrates an example where the light-blocking layer 117 is provided over the substrate 151, an insulating layer 153 is provided over the light-blocking layer 117, and the transistors 201 and 205 and the like are provided over the insulating layer 153.

The light-emitting device 130R and the red coloring layer 132R overlap with each other, and light emitted from the light-emitting device 130R passes through the coloring layer 132R and is extracted as red light to the outside of the display apparatus 100H. Similarly, the light-emitting device 130G and the green coloring layer 132G overlap with each other, and light emitted from the light-emitting device 130G passes through the coloring layer 132G and is extracted as green light to the outside of the display apparatus 100H.

The light-emitting device 130R includes the conductive layer 112a, the conductive layer 126a over the conductive layer 112a, and the conductive layer 129a over the conductive layer 126a.

The light-emitting device 130G includes the conductive layer 112b, the conductive layer 126b over the conductive layer 112b, and the conductive layer 129b over the conductive layer 126b.

A material having a high property of transmitting visible light is used for each of the conductive layers 112a, 112b, 112c, 126a, 126b, 126c, 129a, 129b, and 129c. A material reflecting visible light is preferably used for the common electrode 115.

Each of the light-emitting devices included in the subpixels emitting red light, green light, and blue light can be configured to emit white light. That is, the first layer 113a and the second layer 113b can have the same structure. Each of the first layer 113a and the second layer 113b is illustrated as three layers in FIG. 22A and can have, specifically, a stacked-layer structure including a first light-emitting unit, a charge-generation layer, and a second light-emitting unit. The display apparatus 100H can be fabricated using Fabrication method example 3 of the display apparatus described in Embodiment 1.

Although FIG. 21A, FIG. 22A, and the like illustrate an example where the top surface of the layer 128 includes a flat portion, the shape of the layer 128 is not particularly limited. FIG. 22B to FIG. 22D illustrate variation examples of the layer 128.

As illustrated in FIGS. 22B and 22D, the top surface of the layer 128 can have a shape such that its center and the vicinity thereof are recessed, i.e., a shape including a concave surface, in a cross-sectional view.

As illustrated in FIG. 22C, the top surface of the layer 128 can have a shape such that its center and the vicinity thereof bulge, i.e., a shape including a convex surface, in a cross-sectional view.

The top surface of the layer 128 may include one or both of a convex surface and a concave surface. The number of convex surfaces and the number of concave surfaces included in the top surface of the layer 128 are not limited and can each be one or more.

The level of the top surface of the layer 128 and the level of the top surface of the conductive layer 112a may be equal to or substantially equal to each other, or may be different from each other. For example, the level of the top surface of the layer 128 may be either lower or higher than the level of the top surface of the conductive layer 112a.

FIG. 22B can be regarded as illustrating an example where the layer 128 fits in the depressed portion formed in the conductive layer 112a. By contrast, as illustrated in FIG. 22D, the layer 128 may exist also outside the depression portion formed in the conductive layer 112a, that is, the layer 128 may be formed to have a top surface wider than the depression portion.

[Display Apparatus 100J]

Figure 23:
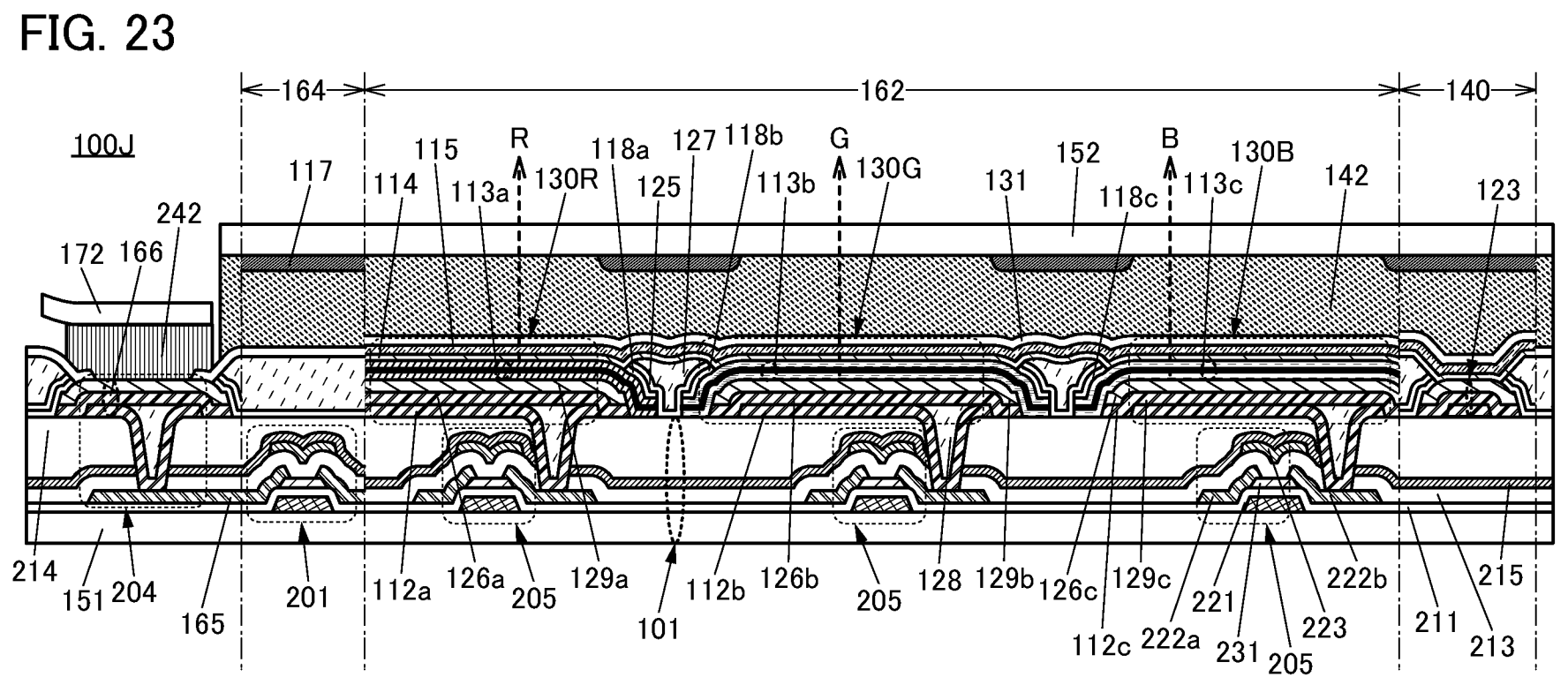

The display apparatus 100J illustrated in FIG. 23 is different from the display apparatus 100G mainly in including a light-emitting device with a tandem structure.

Each of the first layer 113a, the second layer 113b, and the third layer 113c is illustrated as three layers in FIG. 23 and can have, specifically, a stacked-layer structure including a first light-emitting unit, a charge-generation layer, and a second light-emitting unit.

In the display apparatus 100J, the first layer 113a can have the structure in which the second light-emitting unit including a red-light-emitting layer is stacked over the first light-emitting unit including a red-light-emitting layer. Likewise, the second layer 113b can have the structure in which the second light-emitting unit including a green-light-emitting layer is stacked over the first light-emitting unit including a green-light-emitting layer. The third layer 113c can have the structure in which the second light-emitting unit including a blue-light-emitting layer is stacked over the first light-emitting unit including a blue-light-emitting layer.

The use of the light-emitting device having the tandem structure allows the display apparatus to have higher luminance. Alternatively, the current needed for obtaining the same luminance can be reduced, which can improve the reliability of the display apparatus.

[Display Apparatus 100K]

Figure 24:
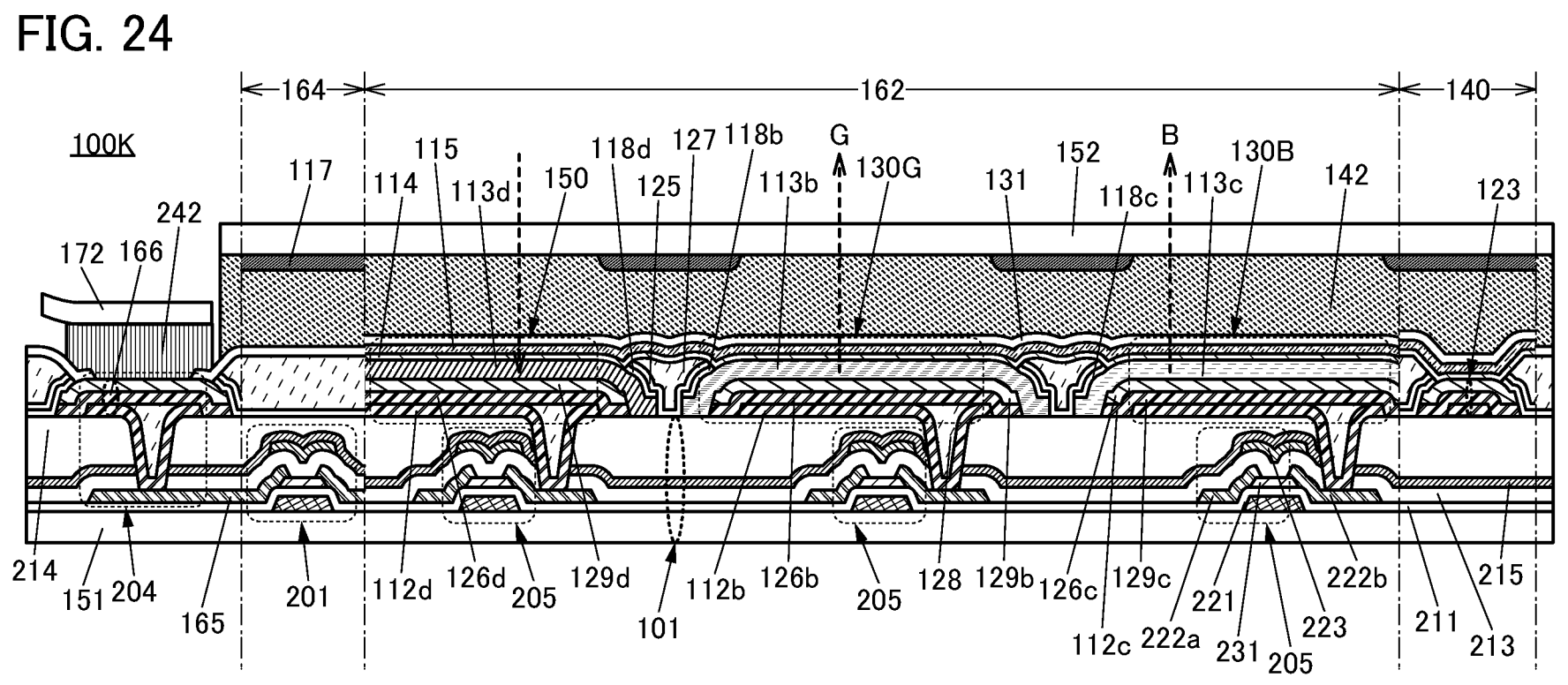

A display apparatus 100K illustrated in FIG. 24 is different from the display apparatus 100G mainly in including a light-receiving device 150.

The light-receiving device 150 includes a conductive layer 112d, a conductive layer 126d over the conductive layer 112d, and a conductive layer 129d over the conductive layer 126d.

The conductive layer 112d is connected to the conductive layer 222b included in the transistor 205 through an opening provided in the insulating layer 214.

The top and side surfaces of the conductive layer 126d and the top and side surfaces of the conductive layer 129d are covered with a fifth layer 113*d*. The fifth layer 113*d* includes at least an active layer.

The side surface of the fifth layer 113*d* is covered with the insulating layers 125 and 127. A sacrifice layer 118*d* is positioned between the fifth layer 113*d* and the insulating layer 125. The fourth layer 114 is provided over the fifth layer 113*d* and the insulating layers 125 and 127, and the common electrode 115 is provided over the fourth layer 114. The fourth layer 114 is a continuous film provided to be shared by the light-receiving device and the light-emitting devices.

The display apparatus 100K can employ any of the pixel layouts that are described with reference to FIG. 12A to FIG. 12D in Embodiment 2, for example. The light-receiving device 150 can be provided in the subpixel PS or the subpixel X. Embodiment 1 can be referred to for the details of the display apparatus including the light-receiving device.

This embodiment can be combined with the other embodiments as appropriate.

Embodiment 4

In this embodiment, a light-emitting device that can be used in the display apparatus of one embodiment of the present invention will be described.

Figure 25A:
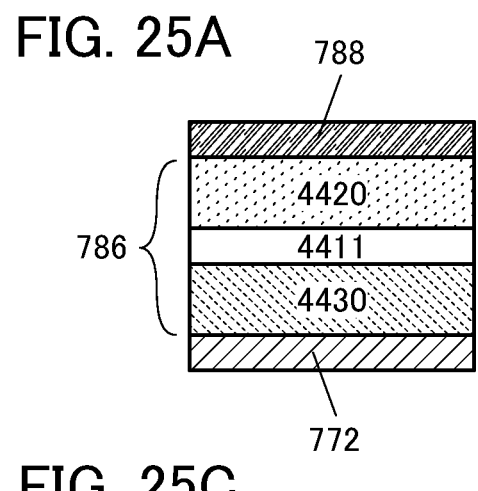
FIG. 25A to FIG. 25F are diagrams illustrating structure examples of a light-emitting device.

As illustrated in FIG. 25A, the light-emitting device includes an EL layer 786 between a pair of electrodes (a lower electrode 772 and an upper electrode 788). The EL layer 786 can be formed of a plurality of layers such as a layer 4420, a light-emitting layer 4411, and a layer 4430. The layer 4420 can include, for example, a layer containing a substance with a high electron-injection property (an electron-injection layer) and a layer containing a substance with a high electron-transport property (an electron-transport layer). The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer).

The structure including the layer 4420, the light-emitting layer 4411, and the layer 4430, which is provided between a pair of electrodes, can function as a single light-emitting unit, and the structure in FIG. 25A is referred to as a single structure in this specification.

Figure 25B:
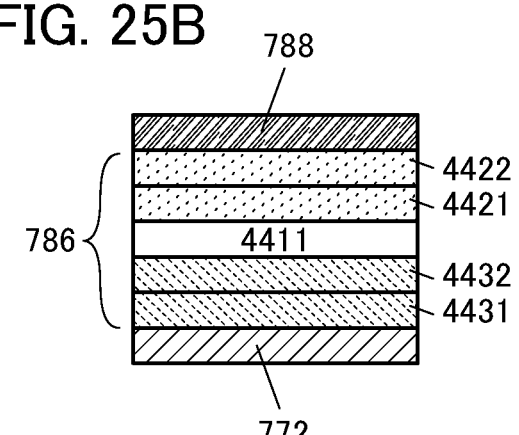

FIG. 25B is a variation example of the EL layer 786 included in the light-emitting device illustrated in FIG. 25A. Specifically, the light-emitting device illustrated in FIG. 25B includes a layer 4431 over the lower electrode 772, a layer 4432 over the layer 4431, the light-emitting layer 4411 over the layer 4432, a layer 4421 over the light-emitting layer 4411, a layer 4422 over the layer 4421, and the upper electrode 788 over the layer 4422. When the lower electrode 772 is an anode and the upper electrode 788 is a cathode, for example, the layer 4431 functions as a hole-injection layer, the layer 4432 functions as a hole-transport layer, the layer 4421 functions as an electron-transport layer, and the layer 4422 functions as an electron-injection layer. Alternatively, when the lower electrode 772 is a cathode and the upper electrode 788 is an anode, the layer 4431 functions as an electron-injection layer, the layer 4432 functions as an electron-transport layer, the layer 4421 functions as a hole-transport layer, and the layer 4422 functions as a hole-injection layer. With such a layer structure, carriers can be efficiently injected to the light-emitting layer 4411, and the efficiency of the recombination of carriers in the light-emitting layer 4411 can be enhanced.

Figure 25C:
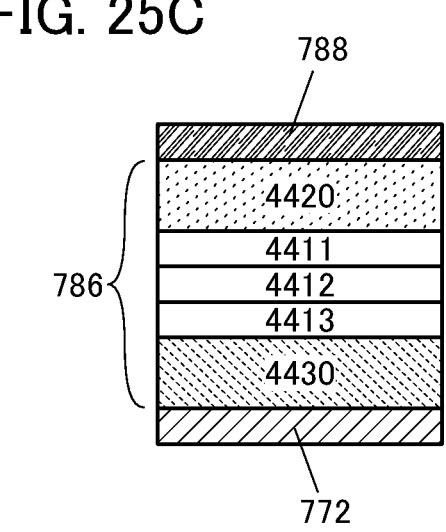
Figure 25D:
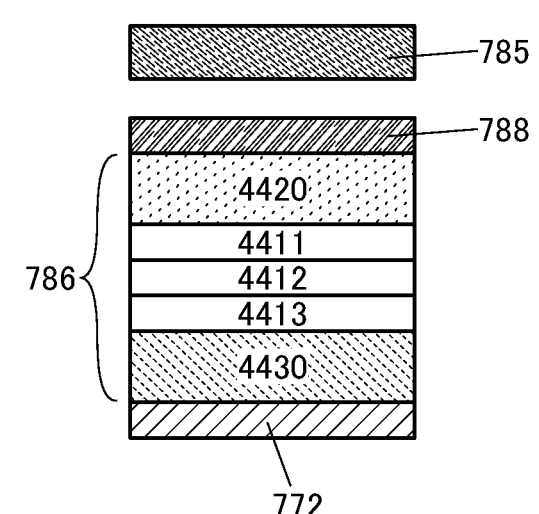

Note that the structure where a plurality of light-emitting layers (light-emitting layers 4411, 4412, and 4413) are provided between the layer 4420 and the layer 4430 as illustrated in FIG. 25C and FIG. 25D is also a variation of the single structure.

Figure 25E:
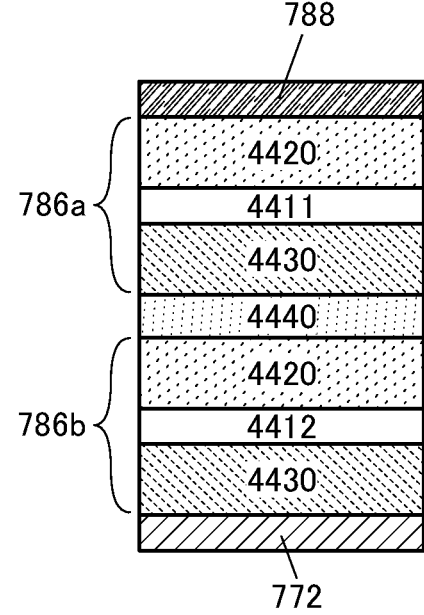
Figure 25F:
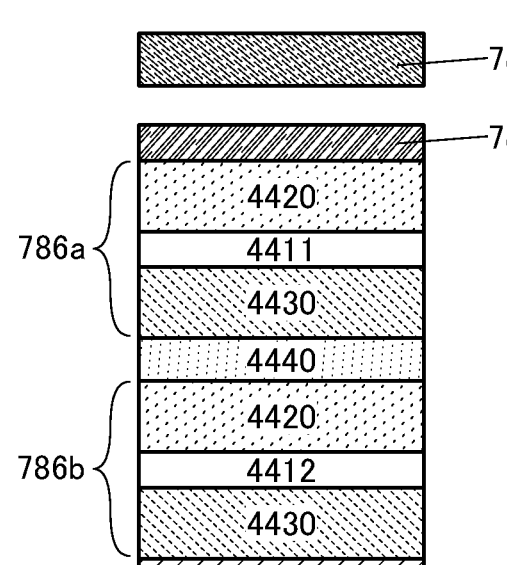

A structure in which a plurality of light-emitting units (an EL layer 786*a* and an EL layer 786*b*) are connected in series with a charge-generation layer 4440 therebetween as illustrated in FIG. 25E or FIG. 25F is referred to as a tandem structure in this specification. Note that a tandem structure may be referred to as a stack structure. The tandem structure enables a light-emitting device capable of high-luminance light emission.

In FIG. 25C and FIG. 25D, light-emitting materials that emit light of the same color, or moreover, the same light-emitting material may be used for the light-emitting layer 4411, the light-emitting layer 4412, and the light-emitting layer 4413. For example, a light-emitting material that emits blue light may be used for the light-emitting layer 4411, the light-emitting layer 4412, and the light-emitting layer 4413. A color conversion layer may be provided as a layer 785 illustrated in FIG. 25D.

Alternatively, light-emitting materials that emit light of different colors may be used for the light-emitting layer 4411, the light-emitting layer 4412, and the light-emitting layer 4413. White light emission can be obtained when the light-emitting layer 4411, the light-emitting layer 4412, and the light-emitting layer 4413 emit light of complementary colors. A color filter (also referred to as a coloring layer) may be provided as the layer 785 illustrated in FIG. 25D. When white light passes through a color filter, light of a desired color can be obtained.

In FIG. 25E and FIG. 25F, light-emitting materials that emit light of the same color, or moreover, the same light-emitting material may be used for the light-emitting layer 4411 and the light-emitting layer 4412. Alternatively, light-emitting materials that emit light of different colors may be used for the light-emitting layer 4411 and the light-emitting layer 4412. White light emission can be obtained when the light-emitting layer 4411 and the light-emitting layer 4412 emit light of complementary colors. FIG. 25F illustrates an example where the layer 785 is further provided. One or both of a color conversion layer and a color filter (coloring layer) can be used as the layer 785.

Note that also in FIG. 25C, FIG. 25D, FIG. 25E, and FIG. 25F, the layer 4420 and the layer 4430 may each have a stacked-layer structure of two or more layers as illustrated in FIG. 25B.

A structure in which light-emitting devices of different emission colors (e.g., blue (B), green (G), and red (R)) are separately formed is referred to as an SBS (Side By Side) structure in some cases.

The emission color of the light-emitting device can be red, green, blue, cyan, magenta, yellow, white, or the like depending on the material that constitutes the EL layer 786. Furthermore, the color purity can be further increased when the light-emitting device has a microcavity structure.

The light-emitting device that emits white light preferably contains two or more kinds of light-emitting substances in the light-emitting layer. To obtain white light emission with the use of two kinds of light-emitting substances, the two kinds of light-emitting substances may be selected such that their emission colors are complementary colors. For example, when an emission color of a first light-emitting layer and an emission color of a second light-emitting layer are complementary colors, the light-emitting device can be configured to emit white light as a whole. When white light emission is obtained using three or more kinds of light-emitting substances, the light-emitting device is configured to emit white light as a whole by combining emission colors of the three or more kinds of light-emitting substances The light-emitting layer preferably contains two or more selected from light-emitting substances that emit light of red (R), green (G), blue (B), yellow (Y), orange (O), and the like. Alternatively, the light-emitting layer preferably contains two or more light-emitting substances that emit light containing two or more of spectral components of R, G, and B.

This embodiment can be combined with the other embodiments as appropriate.

Embodiment 5

In this embodiment, electronic devices of one embodiment of the present invention are described with reference to FIG. 26 to FIG. 28.

Electronic devices of this embodiment each include the display apparatus of one embodiment of the present invention in a display portion. The display apparatus of one embodiment of the present invention can be easily increased in resolution and definition. Thus, the display apparatus of one embodiment of the present invention can be used for a display portion of a variety of electronic devices.

Examples of electronic devices include electronic devices with a relatively large screen, such as a television device, a desktop or laptop personal computer, a monitor of a computer or the like, digital signage, and a large game machine such as a pachinko machine: a digital camera: a digital video camera: a digital photo frame: a mobile phone: a portable game machine: a portable information terminal: and an audio reproducing device.

In particular, the display apparatus of one embodiment of the present invention can have a high resolution, and thus can be suitably used for an electronic device having a relatively small display portion. Examples of such an electronic device include a watch-type or a bracelet-type information terminal device (wearable device), and a wearable device worn on a head, such as a device for VR such as a head-mounted display, a glasses-type device for AR, and a device for MR.

The definition of the display apparatus of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K (number of pixels: 3840×2160), or 8K (number of pixels: 7680×4320). In particular, a definition of 4K, 8K, or higher is preferable. The pixel density (resolution) of the display apparatus of one embodiment of the present invention is preferably 100 ppi or higher, further preferably 300 ppi or higher, further preferably 500 ppi or higher, further preferably 1000 ppi or higher, still further preferably 2000 ppi or higher, still further preferably 3000 ppi or higher, still further preferably 5000 ppi or higher, yet further preferably 7000 ppi or higher. With the use of such a display apparatus having one or both of high definition and high resolution, the electronic device can provide higher realistic sensation, sense of depth, and the like in personal use such as portable use and home use. There is no particular limitation on the screen ratio (aspect ratio) of the display apparatus of one embodiment of the present invention. For example, the display apparatus is compatible with a variety of screen ratios such as 1:1 (a square), 4:3, 16:9, and 16:10.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, odor, or infrared rays).

The electronic device in this embodiment can have a variety of functions. For example, the electronic device can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Examples of a wearable device that can be worn on a head are described with reference to FIG. 26A to FIG. 26D. These wearable devices have one or both of a function of displaying AR contents and a function of displaying VR contents. Note that these wearable devices may have a function of displaying SR or MR contents, in addition to AR and VR contents. The electronic device having a function of displaying contents of AR, VR, SR, MR, or the like enables the user to reach a higher level of immersion.

Figures 26A, 26B, 26C, 26D:
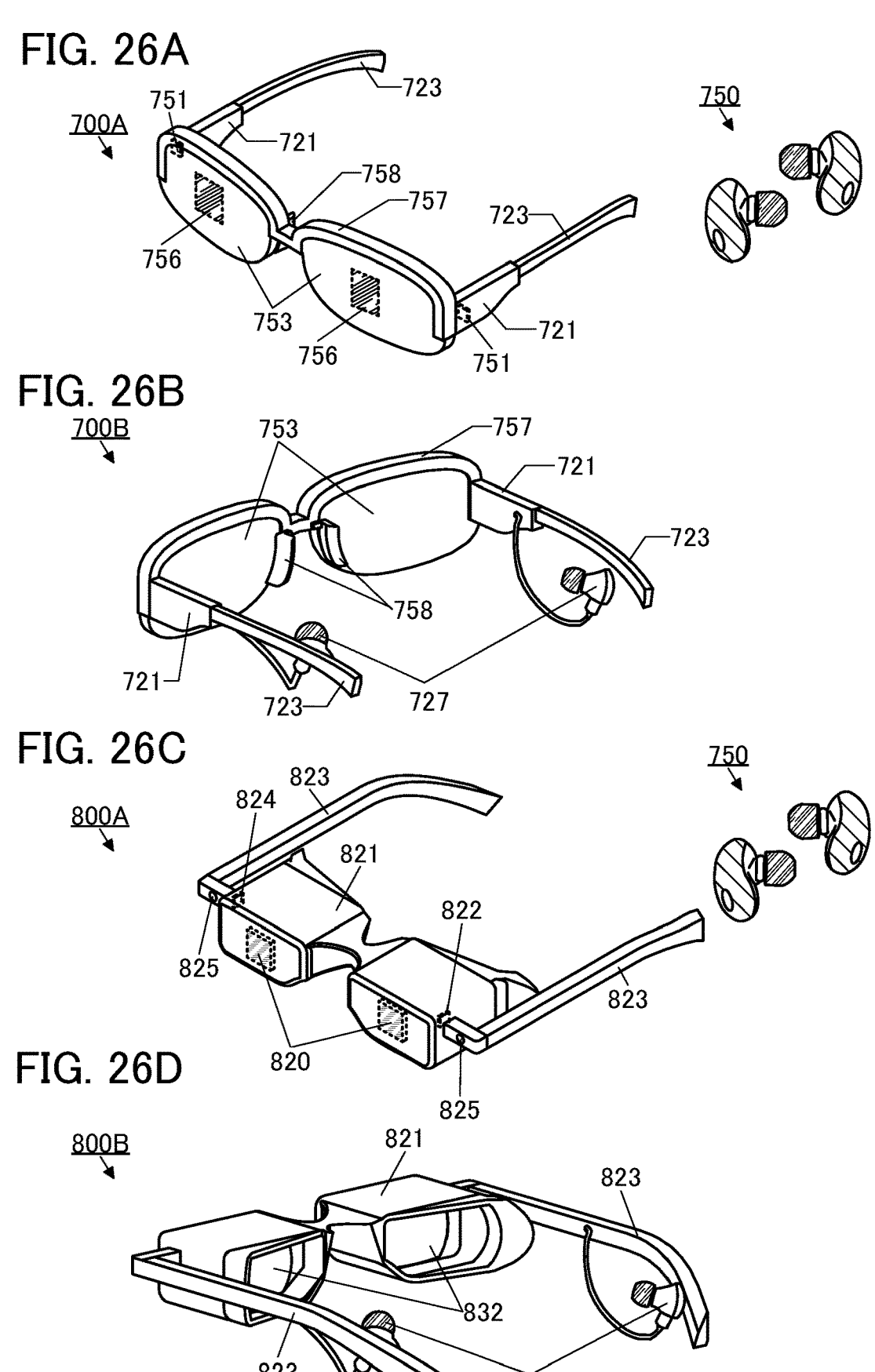
FIG. 26A to FIG. 26D are diagrams illustrating examples of an electronic device.

An electronic device 700A illustrated in FIG. 26A and an electronic device 700B illustrated in FIG. 26B each include a pair of display panels 751, a pair of housings 721, a communication portion (not illustrated), a pair of mounting portions 723, a control portion (not illustrated), an image capturing portion (not illustrated), a pair of optical members 753, a frame 757, and a pair of nose pads 758.

The display apparatus of one embodiment of the present invention can be used for the display panels 751. Thus, the electronic devices are capable of performing ultrahigh-resolution display.

The electronic device 700A and the electronic device 700B can each project images displayed on the display panels 751 onto display regions 756 of the optical members 753. Since the optical members 753 have a light-transmitting property, a user can see images displayed on the display regions, which are superimposed on transmission images seen through the optical members 753. Accordingly, the electronic device 700A and the electronic device 700B are electronic devices capable of AR display.

In the electronic device 700A and the electronic device 700B, a camera capable of capturing images of the front side may be provided as the image capturing portion. Furthermore, when the electronic device 700A and the electronic device 700B are provided with an acceleration sensor such as a gyroscope sensor, the orientation of the user's head can be sensed and an image corresponding to the orientation can be displayed on the display regions 756.

The communication portion includes a wireless communication device, and a video signal and the like can be supplied by the wireless communication device. Instead of or in addition to the wireless communication device, a connector that can be connected to a cable for supplying a video signal and a power supply potential may be provided.

The electronic device 700A and the electronic device 700B are provided with a battery so that they can be charged wirelessly and/or by wire.

A touch sensor module may be provided in the housing 721. The touch sensor module has a function of detecting a touch on the outer surface of the housing 721. Detecting a tap operation, a slide operation, or the like by the user with the touch sensor module enables various types of processing. For example, a video can be paused or restarted by a tap operation, and can be fast-forwarded or fast-reversed by a slide operation. When the touch sensor module is provided in each of the two housings 721, the range of the operation can be increased.

Various touch sensors can be applied to the touch sensor module. For example, any of touch sensors of the following types can be used: a capacitive type, a resistive type, an infrared type, an electromagnetic induction type, a surface acoustic wave type, and an optical type. In particular, a capacitive sensor or an optical sensor is preferably used for the touch sensor module.

In the case of using an optical touch sensor, a photoelectric conversion device (also referred to as a photoelectric conversion element) can be used as a light-receiving device (also referred to as a light-receiving element). One or both of an inorganic semiconductor and an organic semiconductor can be used for an active layer of the photoelectric conversion device.

An electronic device 800A illustrated in FIG. 26C and an electronic device 800B illustrated in FIG. 26D each include a pair of display portions 820, a housing 821, a communication portion 822, a pair of wearing portions 823, a control portion 824, a pair of image capturing portions 825, and a pair of lenses 832.

The display apparatus of one embodiment of the present invention can be used in the display portions 820. Thus, the electronic devices are capable of performing ultrahigh-resolution display. Such electronic devices provide an enhanced sense of immersion to the user.

The display portions 820 are positioned inside the housing 821 so as to be seen through the lenses 832. When the pair of display portions 820 display different images, three-dimensional display using parallax can be performed.

The electronic device 800A and the electronic device 800B can be regarded as electronic devices for VR. The user who wears the electronic device 800A or the electronic device 800B can see images displayed on the display portions 820 through the lenses 832.

The electronic device 800A and the electronic device 800B preferably include a mechanism for adjusting the lateral positions of the lenses 832 and the display portions 820 so that the lenses 832 and the display portions 820 are positioned optimally in accordance with the positions of the user's eyes. Moreover, the electronic device 800A and the electronic device 800B preferably include a mechanism for adjusting focus by changing the distance between the lenses 832 and the display portions 820.

The electronic device 800A or the electronic device 800B can be mounted on the user's head with the mounting portions 823. FIG. 26C or the like illustrates an example where the wearing portion 823 has a shape like a temple (also referred to as a joint or the like) of glasses: however, one embodiment of the present invention is not limited thereto. The mounting portion 823 can have any shape with which the user can wear the electronic device, for example, a shape of a helmet or a band.

The image capturing portion 825 has a function of obtaining information on the external environment. Data obtained by the image capturing portion 825 can be output to the display portion 820. An image sensor can be used for the image capturing portion 825. Moreover, a plurality of cameras may be provided so as to support a plurality of fields of view, such as a telescope field of view and a wide field of view.

Although an example where the image capturing portions 825 are provided is shown here, a range sensor capable of measuring a distance between the user and an object (hereinafter also referred to as a sensing portion) just needs to be provided. In other words, the image capturing portion 825 is one embodiment of the sensing portion. As the sensing portion, an image sensor or a distance image sensor such as LIDAR (Light Detection and Ranging) can be used, for example. By using images obtained by the camera and images obtained by the range image sensor, more information can be obtained and a gesture operation with higher accuracy is possible.

The electronic device 800A may include a vibration mechanism that functions as bone-conduction earphones. For example, any one or more of the display portion 820, the housing 821, and the mounting portion 823 can employ a structure including the vibration mechanism. Thus, without additionally requiring an audio device such as headphones, earphones, or a speaker, the user can enjoy video and sound only by wearing the electronic device 800A.

The electronic device 800A and the electronic device 800B may each include an input terminal. To the input terminal, a cable for supplying a video signal from a video output device or the like, power for charging the battery provided in the electronic device, and the like can be connected.

The electronic device of one embodiment of the present invention may have a function of performing wireless communication with earphones 750. The earphones 750 include a communication portion (not illustrated) and has a wireless communication function. The earphones 750 can receive information (e.g., audio data) from the electronic device with the wireless communication function. For example, the electronic device 700A in FIG. 26A has a function of transmitting information to the earphones 750 with the wireless communication function. As another example, the electronic device 800A illustrated in FIG. 26C has a function of transmitting information to the earphones 750 with the wireless communication function.

The electronic device may include an earphone portion. The electronic device 700B in FIG. 26B includes earphone portions 727. For example, the earphone portion 727 and the control portion can be connected to each other by wire. Part of a wiring that connects the earphone portion 727 and the control portion may be positioned inside the housing 721 or the mounting portion 723.

Similarly, the electronic device 800B illustrated in FIG. 26D includes earphone portions 827. For example, the earphone portion 827 and the control portion 824 are connected to each other by wire. Part of a wiring that connects the earphone portion 827 and the control portion 824 may be positioned inside the housing 821 or the mounting portion 823. Alternatively, the earphone portions 827 and the mounting portions 823 may include magnets. This is preferable because the earphone portions 827 can be fixed to the mounting portions 823 with magnetic force and thus can be easily housed.

The electronic device may include an audio output terminal to which earphones, headphones, or the like can be connected. The electronic device may include one or both of an audio input terminal and an audio input mechanism. As the audio input mechanism, a sound collecting device such as a microphone can be used, for example. The electronic device may have a function of what is called a headset by including the audio input mechanism.

As described above, both the glasses-type device (e.g., the electronic device 700A and the electronic device 700B) and the goggles-type device (e.g., the electronic device 800A and the electronic device 800B) are preferable as the electronic device of one embodiment of the present invention.

The electronic device of one embodiment of the present invention can transmit information to earphones by wire or wirelessly.

An electronic device 6500 illustrated in FIG. 27A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display apparatus of one embodiment of the present invention can be used for the display portion 6502.

FIG. 27B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery 6518 with high capacity can be mounted without an increase in the thickness of the electronic device. Moreover, part of the display panel 6511 is folded back so that a connection portion with the FPC 6515 is provided on the back side of a pixel portion, whereby an electronic device with a narrow bezel can be achieved.

FIG. 27C illustrates an example of a television device. In a television device 7100, a display portion 7000 is incorporated in a housing 7101. Here, the housing 7101 is supported by a stand 7103.

The display apparatus of one embodiment of the present invention can be used for the display portion 7000.

Operation of the television device 7100 illustrated in FIG. 27C can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be controlled and videos displayed on the display portion 7000 can be operated.

Note that the television device 7100 has a structure in which a receiver, a modem, and the like are provided. A general television broadcast can be received with the receiver. When the television device is connected to a communication network by wire or wirelessly via the modem, one-way (from a transmitter to a receiver) or two-way (between a transmitter and a receiver or between receivers, for example) data communication can be performed.

FIG. 27D illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The display apparatus of one embodiment of the present invention can be used for the display portion 7000.

FIG. 27E and FIG. 27F illustrate examples of digital signage.

Digital signage 7300 illustrated in FIG. 27E includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 27F is digital signage 7400 attached to a cylindrical pillar 7401. The digital signage 7400 includes the display portion 7000 provided along a curved surface of the pillar 7401.

The display apparatus of one embodiment of the present invention can be used for the display portion 7000 illustrated in each of FIG. 27E and FIG. 27F.

A larger area of the display portion 7000 can increase the amount of information that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 27E and FIG. 27F, it is preferable that the digital signage 7300 or the digital signage 7400 can work with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

Electronic devices illustrated in FIG. 28A to FIG. 28G include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The display apparatus of one embodiment of the present invention can be used for the display portion 9001 in FIG. 28A to FIG. 28G.

The electronic devices illustrated in FIG. 28A to FIG. 28G have a variety of functions. For example, the electronic devices can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. In addition, the electronic devices may each include a camera or the like and have a function of taking a still image or a moving image and storing the taken image in a recording medium (an external recording medium or a recording medium incorporated in the camera), a function of displaying the taken image on the display portion, or the like.

The details of the electronic devices illustrated in FIG. 28A to FIG. 28G are described below:

FIG. 28A is a perspective view illustrating a portable information terminal 9101. The portable information terminal 9101 can be used as a smartphone, for example. Note that the portable information terminal 9101 may include the speaker 9003, the connection terminal 9006, the sensor 9007, or the like. The portable information terminal 9101 can display characters and image information on its plurality of surfaces. FIG. 28A illustrates an example where three icons 9050 are displayed. Furthermore, information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the radio field intensity. Alternatively, the icon 9050 or the like may be displayed at the position where the information 9051 is displayed.

FIG. 28B is a perspective view illustrating a portable information terminal 9102. The portable information terminal 9102 has a function of displaying information on three or more surfaces of the display portion 9001. Here, an example is illustrated in which information 9052, information 9053, and information 9054 are displayed on different surfaces. For example, a user can check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer the call, for example.

FIG. 28C is a perspective view illustrating a tablet terminal 9103. The tablet terminal 9103 is capable of executing a variety of applications such as mobile phone calls, e-mailing, viewing and editing texts, music reproduction, Internet communication, and a computer game, for example. The tablet terminal 9103 includes the display portion 9001, the camera 9002, the microphone 9008, and the speaker 9003 on the front surface of the housing 9000; the operation keys 9005 as buttons for operation on the left side surface of the housing 9000; and the connection terminal 9006 on the bottom surface of the housing 9000.

FIG. 28D is a perspective view illustrating a watch-type portable information terminal 9200. For example, the portable information terminal 9200 can be used as a Smartwatch (registered trademark). The display surface of the display portion 9001 is curved, and display can be performed on the curved display surface. Furthermore, for example, mutual communication between the portable information terminal 9200 and a headset capable of wireless communication can be performed, and thus hands-free calling is possible. With the connection terminal 9006, the portable information terminal 9200 can perform mutual data transmission with another information terminal and charging. Note that the charging operation may be performed by wireless power feeding.

FIG. 28E to FIG. 28G are perspective views illustrating a foldable portable information terminal 9201. FIG. 28E is a perspective view of an opened state of the portable information terminal 9201, FIG. 28G is a perspective view of a folded state thereof, and FIG. 28F is a perspective view of a state in the middle of change from one of FIG. 28E and FIG. 28G to the other. The portable information terminal 9201 is highly portable in the folded state and is highly browsable in the opened state because of a seamless large display region. The display portion 9001 of the portable information terminal 9201 is supported by three housings 9000 joined together by hinges 9055. The display portion 9001 can be folded with a radius of curvature of greater than or equal to 0.1 mm and less than or equal to 150 mm, for example.

This embodiment can be combined with the other embodiments as appropriate.

EXAMPLE

This example shows formation of an aluminum oxide (AlOx) film that can be used for a display apparatus of one embodiment of the present invention and evaluation results.
[Evaluation 1]

First, differences in film quality of aluminum oxide films depending on the deposition temperature were evaluated.

Samples were each fabricated in such a manner that a silicon oxide film was formed on a silicon substrate by thermal oxidation treatment, and then an aluminum oxide film was formed over the silicon oxide film by an ALD method to a thickness of 50 nm.

For the formation of the aluminum oxide film, TMA (trimethylaluminum) was used as a precursor and an $H_2O$ gas was used as an oxidizing gas.

The aluminum oxide films were formed at three substrate temperatures: 80° C., 100° C., and 120° C.

Table 1 shows the deposition rate, wet etching rate (a mixed acid aluminum etchant, 45° C.), and stress of the aluminum oxide films at each deposition temperature.

TABLE 1

| | Deposition temperature | | |
|---|---|---|---|
| | 80° C. | 100° C. | 120° C. |
| GPC Deposition amount in one cycle | 0.11 nm/cycle | 0.12 nm/cycle | 0.12 nm/cycle |
| Wet etching rate Mixed acid aluminum etchant (45° C.) | 10.7 nm/min | 8.3 nm/min | 4.3 nm/min |
| Stress | 414 MPa (Tensile) | 434 MPa (Tensile) | 325 MPa (Tensile) |

As Table 1 shows, GPCs (Growth per cycle: deposition amount in one cycle) were almost equal to each other regardless of the deposition temperature. There was no big difference in stress depending on the deposition temperature and tensile stress was caused in each deposition temperature. Meanwhile, it is found that the wet etching rate tends to be lower as the deposition temperature is higher.

Figure 29:
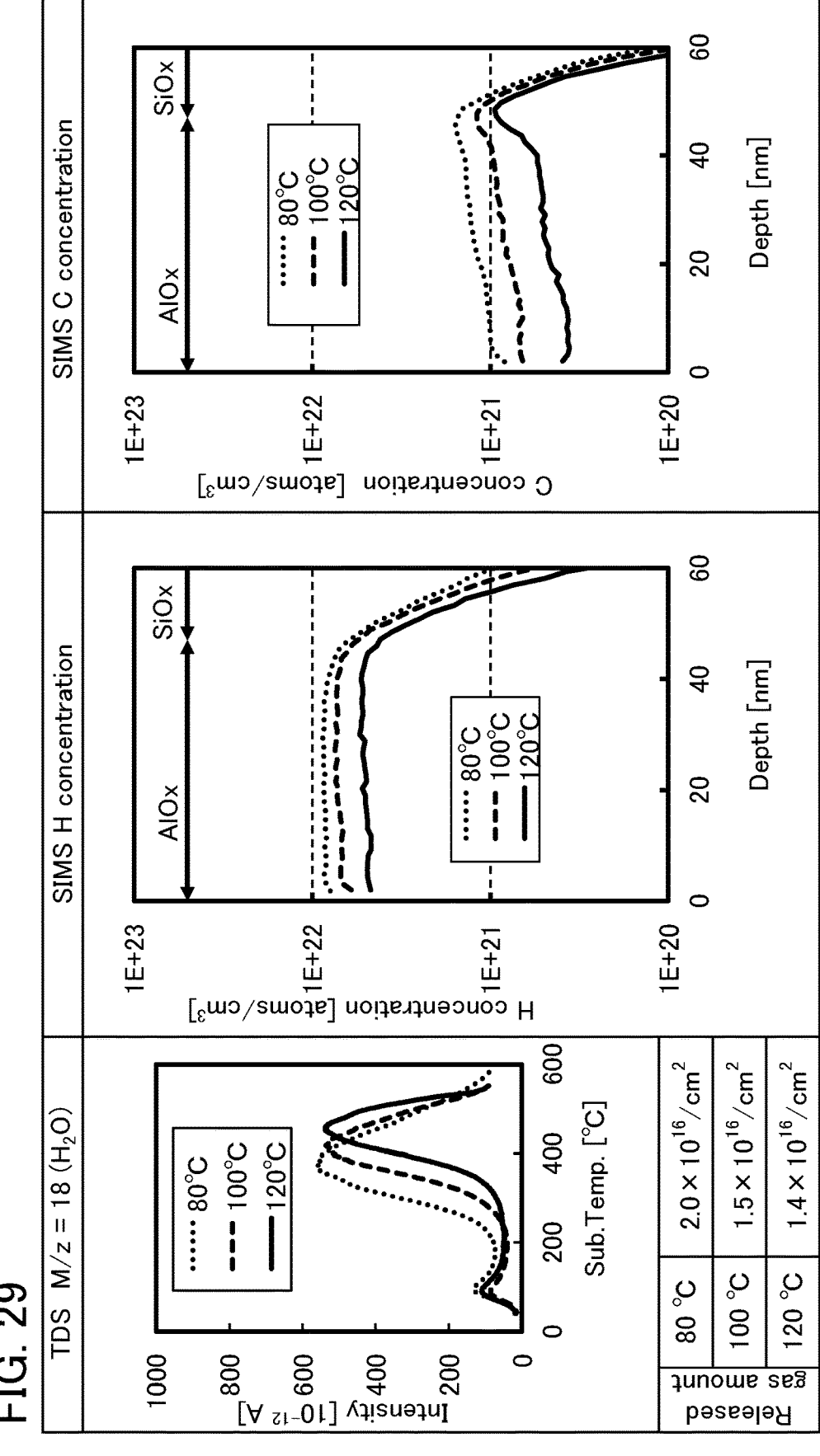
FIG. 29 is a diagram showing evaluation results in an example.

Next, the temperature dependence of the intensity at which the mass-to-charge ratio (M/z) of 18 corresponding to a water molecule ($H_2O$) was detected by thermal desorption spectroscopy (TDS) was examined. For the measurement, EMD-WA1000S/W manufactured by ESCO Ltd. was used. The left graph in FIG. 29 shows the results of the TDS analysis. In the graph of the TDS analysis shown in FIG. 29, the horizontal axis represents substrate temperature (Sub. Temp.) (unit: ° C.) and the vertical axis represents the intensity (Intensity) (unit: $10^{-12}$ A). Below the graph of the TDS analysis, a table of the number of released water molecules (released gas amount) at each deposition temperature is shown.

The TDS analysis results show that the peak temperature at which a water molecule is detected is higher as the deposition temperature is higher. It is also found that the number of released water molecules tends to be smaller as the deposition temperature is higher.

In addition, the hydrogen concentration (H concentration) profile and the carbon concentration (C concentration) profile in the depth direction of the samples were measured by secondary ion mass spectrometry (SIMS). For the measurement, a quadrupole SIMS instrument (D-SIMS) manufactured by ULVAC-PHI, Inc. was used. The center and right graphs in FIG. 29 show the SIMS analysis results. In the graphs of the SIMS analysis shown in FIG. 29, the horizontal axis represents a depth from a surface of the AlOx (unit: nm), and the vertical axis represents element concentration (H concentration or C concentration) (unit: atoms/cm$^3$) in a film. Note that in the SIMS analysis, the back ground level of the hydrogen concentration was $2.3 \times 10^{18}$ atoms/cm$^3$ and that of the carbon concentration was $3.2 \times 10^{17}$ atoms/cm$^3$.

The SIMS analysis results show that the hydrogen concentration and the carbon concentration in the aluminum oxide films are each lower as the deposition temperature is higher. This shows that an aluminum oxide film with a low impurity concentration can be formed when the aluminum oxide film was formed at a high substrate temperature.

[Evaluation 2]

First, samples each having a stacked-layer structure of a silicon oxynitride (SiON) film and an aluminum oxide (AlOx) film was fabricated. Next, a hot water soaking test using deuterated water ($D_2O$) was performed. Then, the diffusion state of the $D_2O$ into the SiON was checked by SIMS and the barrier property of the AlOx against water was evaluated.

Figure 30:
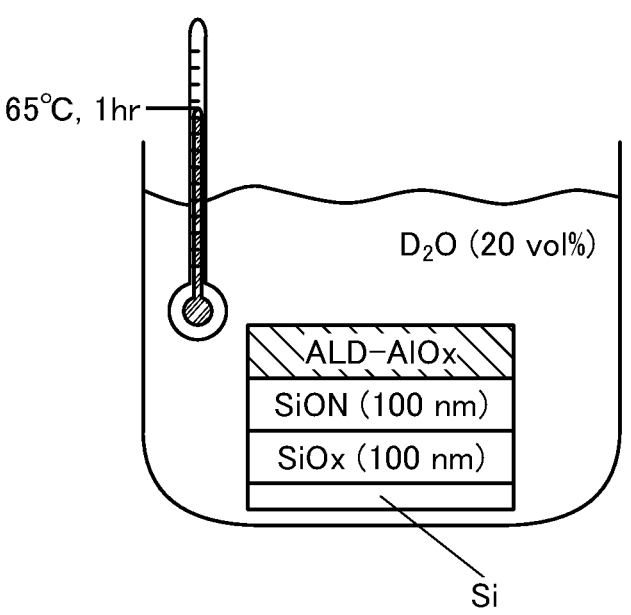
FIG. 30 is a diagram illustrating an evaluation method in an example.

A method for fabricating the sample is described. As shown in FIG. 30, the sample was fabricated in the following manner: a silicon oxide (SiOx) film was formed on a silicon (Si) substrate by thermal oxidation treatment to a thickness of 100 nm, a silicon oxynitride (SiON) film was formed over the silicon oxide film by a PECVD method to a thickness of 100 nm, and then an aluminum oxide (ALD-AlOx) film was formed over the silicon oxynitride film by an ALD method.

For the formation of the aluminum oxide film, TMA (trimethylaluminum) was used as a precursor and an $H_2O$ gas was used as an oxidizing gas.

The target thicknesses of the aluminum oxide films were the following four thicknesses: (A) 5 nm, (B) 10 nm, (C) 15 nm, and (D) 20 nm. The substrate temperatures (Tsub) in the formation of the aluminum oxide films were the following three temperatures: (1) 80° C., (2) 100° C., and (3) 120° C. In the description of the samples in this example, for example, a sample with a target thickness of (A) 5 nm and a substrate temperature in deposition of (1) 80° C. is denoted by Sample A1.

Next, conditions of the hot water soaking test are described. In the test, as shown in FIG. 30, the samples were soaked in 20 vol % of $D_2O$ at 65° C., for one hour.

After that, the deuterium (D, $^2H$) concentration profile in the depth direction of the sample was measured by SIMS. For the measurement, a quadrupole SIMS instrument (D-SIMS) manufactured by ULVAC-PHI, Inc. was used.

Figure 31:
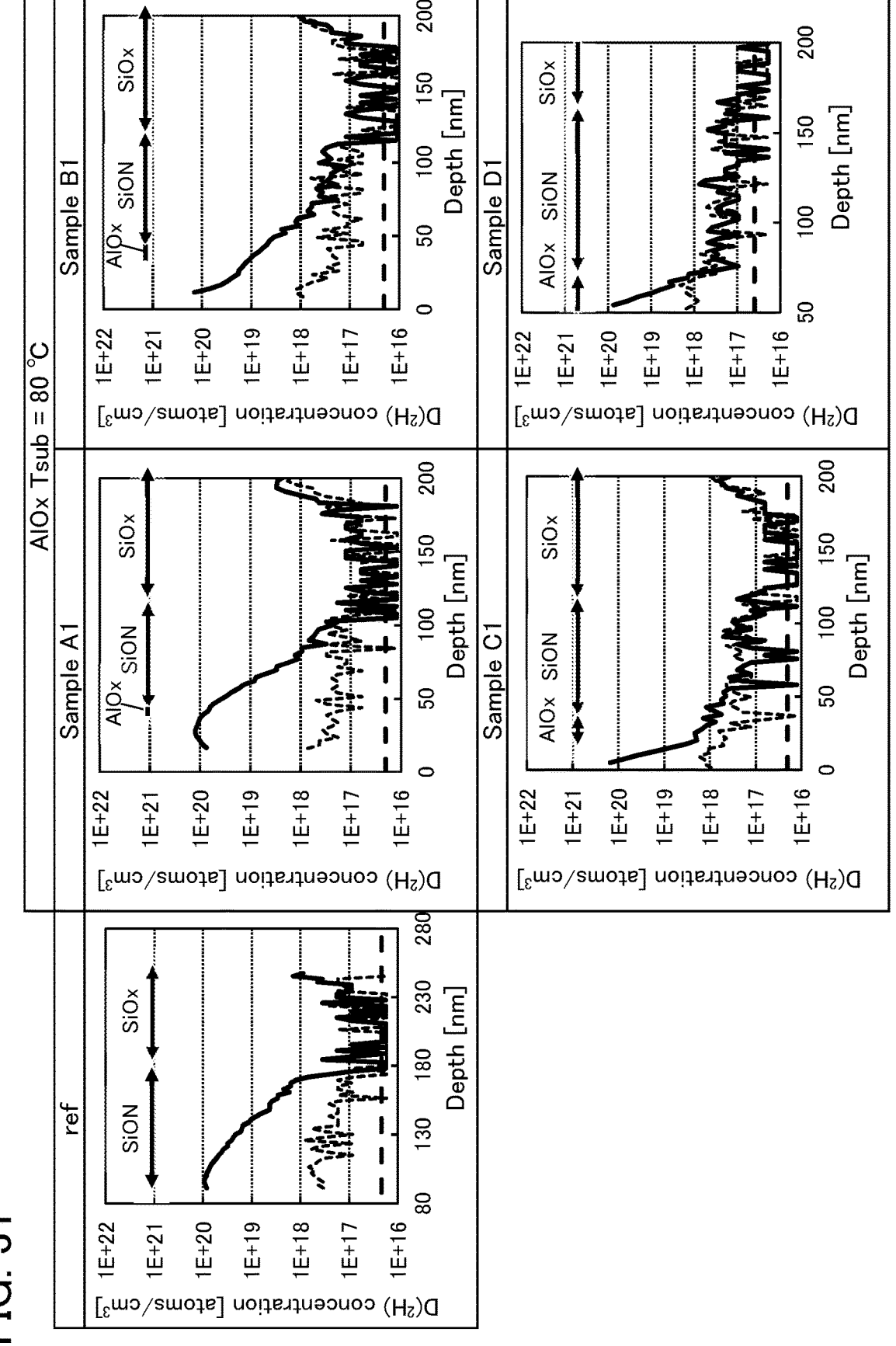
FIG. 31 is a diagram showing evaluation results in an example.
Figure 32:
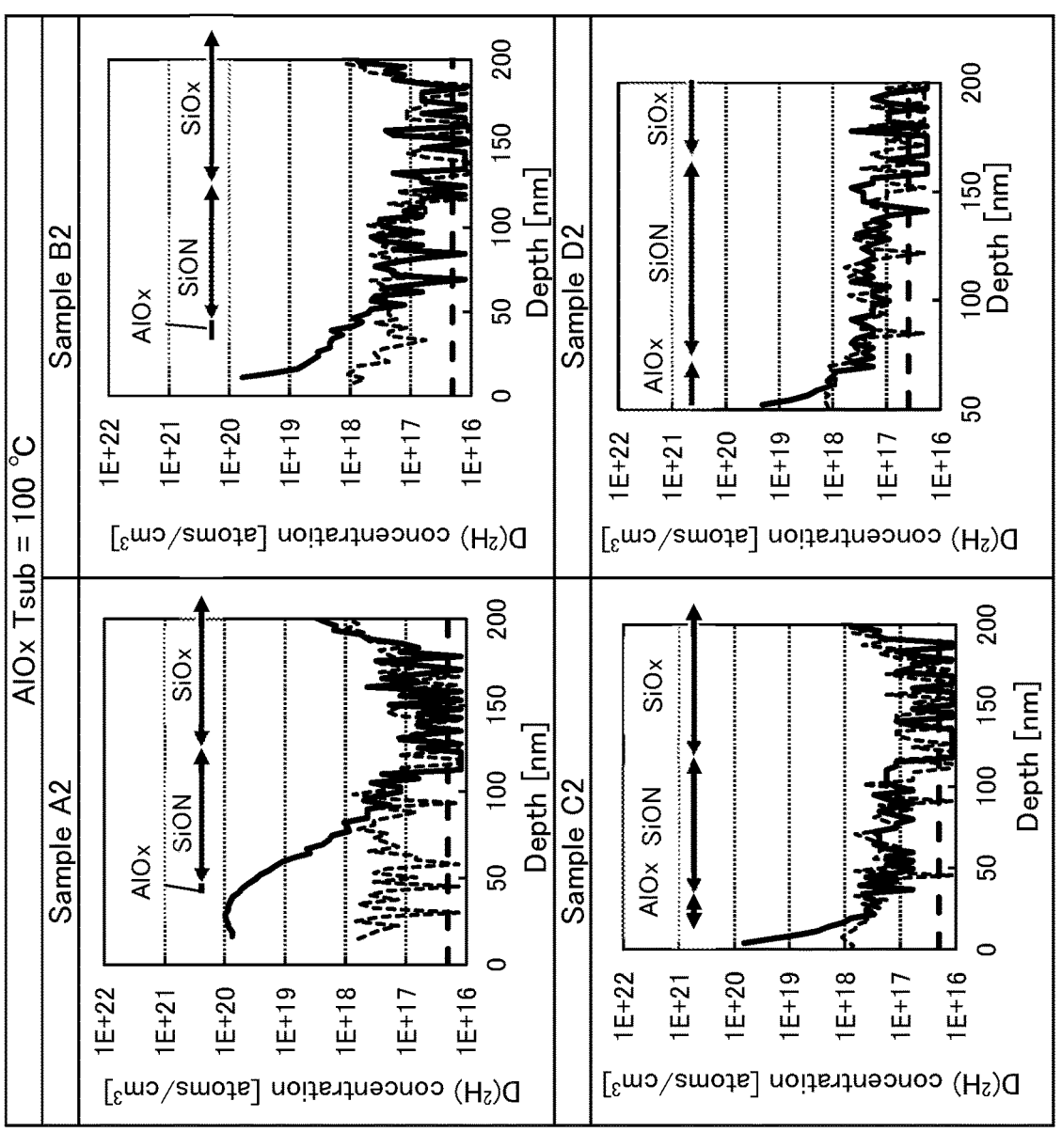
FIG. 32 is a diagram showing evaluation results in an example.
Figure 33:
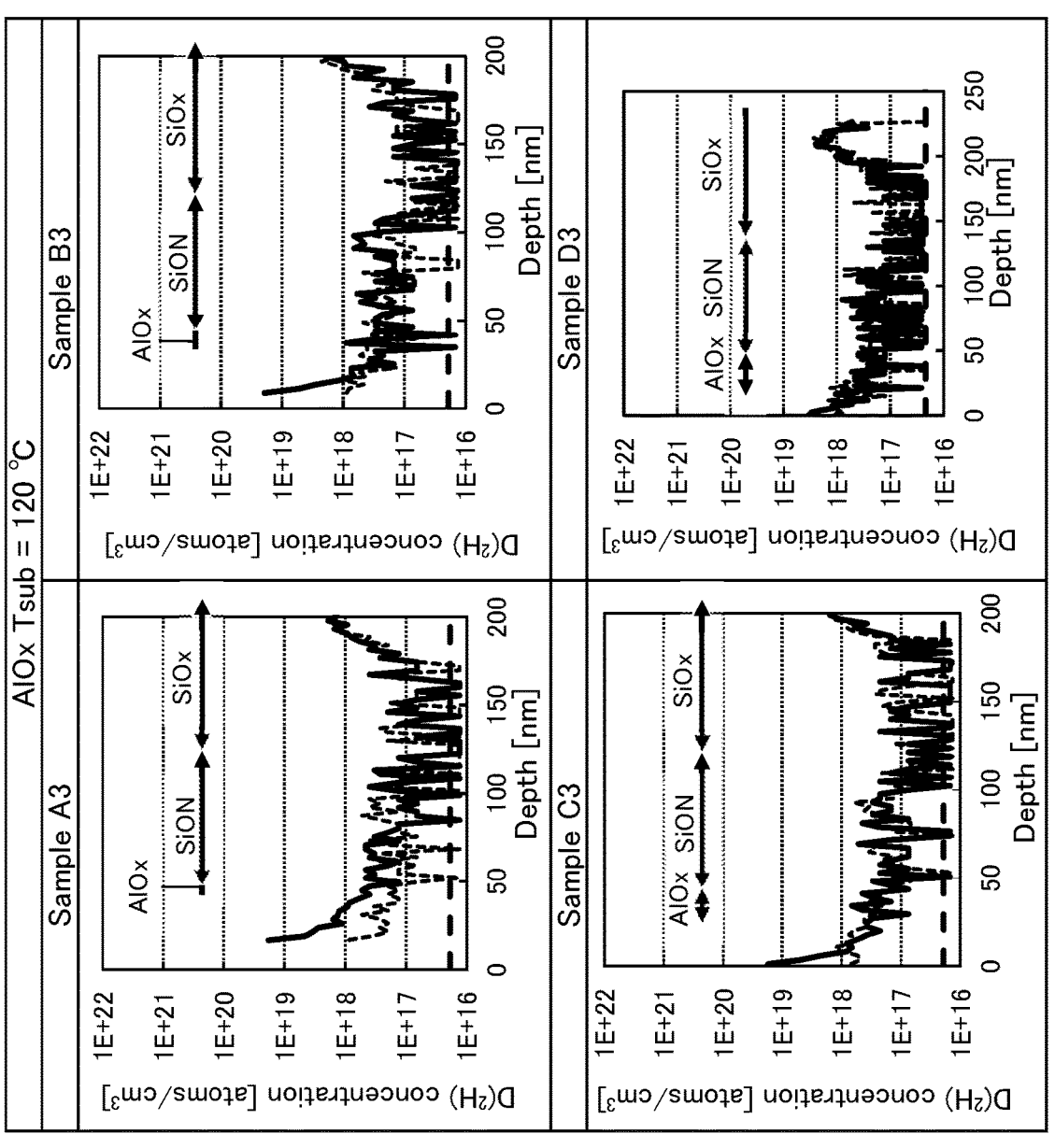
FIG. 33 is a diagram showing evaluation results in an example.

FIG. 31 to FIG. 33 show the deuterium concentration profiles in the depth direction of the samples. In this example, measurement was performed from the AlOx side. The horizontal axis represents a depth (unit: nm) from a surface of the AlOx. The vertical axis represents a deuterium concentration (unit: atoms/cm$^3$) in the film.

FIG. 31 shows the results of the samples where the substrate temperature in formation of the AlOx is 80° C., FIG. 32 shows the results of the samples where the substrate temperature is 100° C., and FIG. 33 shows the results of the samples where the substrate temperature is 120° C.

In FIG. 31, the target thickness of the AlOx is 5 nm in Sample A1, the thickness is 10 nm in Sample B1, the thickness is 15 nm in Sample C1, and the thickness is 20 nm in Sample D1.

Similarly, in FIG. 32, the target thickness of the AlOx is 5 nm in Sample A2, the thickness is 10 nm in Sample B2, the thickness is 15 nm in Sample C2, and the thickness is 20 nm in Sample D2. In FIG. 33, the target thickness of the AlOx is 5 nm in Sample A3, the thickness is 10 nm in Sample B3, the thickness is 15 nm in Sample C3, and the thickness is 20 nm in Sample D3.

FIG. 31 additionally shows the result of a sample where the AlOx film is not formed over the SiON film, which is a reference example (ref).

In FIG. 31 to FIG. 33, a solid line shows the result of the sample subjected to the hot water soaking test, and a thin dashed line shows the result of the sample not subjected to the hot water soaking test. In each graph in FIG. 31 to FIG. 33, a thick dashed line shows the background level of the SIMS analysis.

As shown in FIG. 31, among the samples where the substrate temperature is 80° C., Sample D1 with a target thickness of 20 nm is found to have almost no increase in the D concentration in the SiON film even after the hot water soaking test.

As shown in FIG. 32, among the samples where the substrate temperature is 100° C., Samples C2 and D2 with a target thickness of greater than or equal to 15 nm are found to have almost no increase in the D concentration in the SiON film even after the hot water soaking test.

As shown in FIG. 33, Samples A3, B3, C3, and D3 where the substrate temperature is 120° C., are each found to have almost no increase in the D concentration in the SiON film even after the hot water soaking test.

From the above, it is found that, in the case where the substrate temperature in deposition is 80° C., an AlOx film with a high barrier property against water can be formed by setting the target thickness to 20 nm or greater. It is also found that, in the case where the substrate temperature in deposition is 100° C., an AlOx film with a high barrier property against water can be formed by setting the target thickness to 15 nm or greater. It is found that, in the case where the substrate temperature in deposition is 120° C., an AlOx film with a high barrier property against water can be formed by setting the target thickness to 5 nm or greater.

At a higher substrate temperature in deposition, an AlOx film having a high barrier property against water even with a small thickness can be formed. Thus, a reduction in thickness of the AlOx and improvement in throughput can be achieved.

The aluminum oxide film fabricated in this example can be used as, for example, the insulating layer 125 included in the display apparatus of one embodiment of the present invention.

REFERENCE NUMERALS

PS: subpixel, 100A: display apparatus, 100B: display apparatus, 100C: display apparatus, 100D: display apparatus, 100E: display apparatus, 100F: display apparatus, 100G: display apparatus, 100H: display apparatus, 100J: display apparatus, 100K: display apparatus, 100: display apparatus, 101: layer including transistors, 110a: subpixel, 110b: subpixel, 110c: subpixel, 110d: subpixel, 110: pixel, 111a: pixel electrode, 111b: pixel electrode, 111c: pixel electrode, 112a: conductive layer, 112b: conductive layer, 112c: conductive layer, 112d: conductive layer, 113A: first layer, 113a: first layer, 113B: second layer, 113b: second layer, 113C: third layer, 113c: third layer, 113d: fifth layer, 113: EL layer, 114: fourth layer, 115: common electrode, 117: light-blocking layer, 118a: sacrificial layer, 118A: first sacrificial layer, 118b: sacrificial layer, 118B: first sacrificial layer, 118c: sacrificial layer, 118C: first sacrificial layer, 118d: sacrificial layer, 119a: sacrificial 20) layer, 119A: second sacrificial layer, 119b: sacrificial layer, 119B: second sacrificial layer, 119c: sacrificial layer, 119C: second sacrificial layer, 120: substrate, 122: resin layer, 123: conductive layer, 124a: pixel, 124b: pixel, 125A: insulating film, 125: insulating layer, 126a: conductive layer, 126b: conductive layer, 126c: conductive layer, 126d: conductive layer, 127: insulating layer, 128: layer, 129a: conductive layer, 129b: conductive layer, 129c: conductive layer, 129d: conductive layer, 130B: light-emitting device, 130G: light-emitting device, 130R: light-emitting device, 131: protective layer, 132B: coloring layer, 132G: coloring layer, 132R: coloring layer, 139: region, 140: connection portion, 142: adhesive layer, 150: light-receiving device, 151: substrate, 152: substrate, 153: insulating layer, 162: display portion, 164: circuit, 165: wiring, 166: conductive layer, 172: FPC, 173: IC, 190a: resist mask, 190b: resist mask, 190c: resist mask, 190: resist mask, 201: transistor, 204: connection portion, 205: transistor, 209: transistor, 210: transistor, 211: insulating layer, 213: insulating layer, 214: insulating layer, 215: insulating layer, 218: insulating layer, 221: conductive layer, 222a: conductive layer, 222b: conductive layer, 223: conductive layer, 225: insulating layer, 231i: channel formation region, 231n: low-resistance region, 231: semiconductor layer, 240: capacitor, 241: conductive layer, 242: connection layer, 243: insulating layer, 245: conductive layer, 251: conductive layer, 252: conductive layer, 254: insulating layer, 255a: insulating layer, 255b: insulating layer, 256: plug, 261: insulating layer, 262: insulating layer, 263: insulating layer, 264: insulating layer, 265: insulating layer, 271: plug, 274a: conductive layer, 274b: conductive layer, 274: plug, 280: display module, 281: display portion, 282: circuit portion, 283a: pixel circuit, 283: pixel circuit portion, 284a: pixel, 284: pixel portion, 285: terminal portion, 286: wiring portion, 290:

FPC, 291: substrate, 292: substrate, 301A: substrate, 301B: substrate, 301: substrate, 310A: transistor, 310B: transistor, 310: transistor, 311: conductive layer, 312: low-resistance region, 313: insulating layer, 314: insulating layer, 315: element isolation layer, 320A: transistor, 320B: transistor, 320): transistor, 321: semiconductor layer, 323: insulating layer, 324: conductive layer, 325: conductive layer, 326: insulating layer, 327: conductive layer, 328: insulating layer, 329: insulating layer, 331: substrate, 332: insulating layer, 335: insulating layer, 336: insulating layer, 341: conductive layer, 342: conductive layer, 343: plug, 344: insulating layer, 345: insulating layer, 346: insulating layer, 347: bump, 348: adhesive layer, 351: substrate, 352: finger, 353: layer, 355: functional layer, 357: layer, 359: substrate, 700A: electronic device, 700B: electronic device, 721: housing, 723: mounting portion, 727: earphone portion, 750: earphones, 751: display panel, 753: optical member, 756: display region, 757: frame, 758: nose pad, 772: lower electrode, 785: layer, 786a: EL layer, 786b: EL layer, 786: EL layer, 788: upper electrode, 800A: electronic device, 800B: electronic device, 820: display portion, 821: housing, 822: communication portion, 823: mounting portion, 824: control portion, 825: image capturing portion, 827: earphone portion, 832: lens, 4411: light-emitting layer, 4412: light-emitting layer, 4413: light-emitting layer, 4420: layer, 4421: layer, 4422: layer, 4430: layer, 4431: layer, 4432: layer, 4440: charge-generation layer, 6500: electronic device, 6501: housing, 6502: display portion, 6503: power source button, 6504: button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit board, 6518: battery, 7000: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 9000: housing, 9001: display portion, 9002: camera, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9103: tablet terminal, 9200: portable information terminal, 9201: portable information terminal

The invention claimed is:

1. A display apparatus comprising a first light-emitting device, a second light-emitting device and an inorganic insulating layer, wherein the first light-emitting device comprises a first pixel electrode, a first light-emitting layer over the first pixel electrode, and a common electrode over the first light-emitting layer, wherein the second light-emitting device comprises a second pixel electrode, a second light-emitting layer over the second pixel electrode, and the common electrode over the second light-emitting layer, wherein the inorganic insulating layer covers side surfaces of the first pixel electrode, the second pixel electrode, the first light-emitting layer, and the second light-emitting layer, and wherein a hydrogen concentration in the inorganic insulating layer is lower than or equal to $1.0 \times 10^{22}$ atoms/$cm^3$.

2. The display apparatus according to claim 1, wherein the hydrogen concentration in the inorganic insulating layer is lower than or equal to $9.0 \times 10^{21}$ atoms/$cm^3$.

3. A display apparatus comprising a first light-emitting device, a second light-emitting device, and an inorganic insulating layer, wherein the first light-emitting device comprises a first pixel electrode, a first light-emitting layer over the first pixel electrode, and a common electrode over the first light-emitting layer, wherein the second light-emitting device comprises a second pixel electrode, a second light-emitting layer over the second pixel electrode, and the common electrode over the second light-emitting layer, wherein the inorganic insulating layer covers side surfaces of the first pixel electrode, the second pixel electrode, the first light-emitting layer, and the second light-emitting layer, and wherein a carbon concentration in the inorganic insulating layer is lower than or equal to $2.5 \times 10^{21}$ atoms/$cm^3$.

4. The display apparatus according to claim 3, wherein the carbon concentration in the inorganic insulating layer is lower than or equal to $2.0 \times 10^{21}$ atoms/$cm^3$.

5. The display apparatus according to claim 1, further comprising an organic insulating layer, wherein the organic insulating layer overlaps with the side surfaces of the first pixel electrode, the second pixel electrode, the first light-emitting layer, and the second light-emitting layer with the inorganic insulating layer therebetween, and wherein the common electrode comprises a region positioned over the organic insulating layer.

6. The display apparatus according to claim 1, wherein the first light-emitting device comprises a common layer between the first light-emitting layer and the common electrode, wherein the second light-emitting device comprises the common layer between the second light-emitting layer and the common electrode, and wherein the common layer comprises at least one of a hole-injection layer, a hole-transport layer, a hole-blocking layer, an electron-blocking layer, an electron-transport layer and an electron-injection layer.

7. The display apparatus according to claim 1, wherein the first light-emitting device and the second light-emitting device emit light of different colors.

8. The display apparatus according to claim 1, further comprising a first coloring layer and a second coloring layer transmitting light of different colors, wherein the first light-emitting device and the second light-emitting device emit white light, wherein light emission of the first light-emitting device is extracted to an outside of the display apparatus through the first coloring layer, and wherein light emission of the second light-emitting device is extracted to the outside of the display apparatus through the second coloring layer.

9. A display module comprising:

the display apparatus according to claim 1; and at least one of a connector and an integrated circuit.

10. An electronic device comprising:

the display module according to claim 9; and at least one of a housing, a battery, a camera, a speaker and a microphone.

11. A method for fabricating a display apparatus, comprising the steps of:

forming a conductive film over an insulating surface;

forming a first layer over the conductive film;

forming a first sacrificial layer over the first layer;

processing the first layer and the first sacrificial layer to expose part of the conductive film;

forming a second layer over the first sacrificial layer and the conductive film;

forming a second sacrificial layer over the second layer;

processing the second layer and the second sacrificial layer to expose part of the conductive film;

processing the conductive film to form a first pixel electrode overlapping with the first sacrificial layer and a second pixel electrode overlapping with the second sacrificial layer;

forming an inorganic insulating film covering at least a side surface of the first pixel electrode, a side surface of the second pixel electrode, a side surface of the first layer, a side surface of the second layer, a side surface and a top surface of the first sacrificial layer, and a side surface and a top surface of the second sacrificial layer by an atomic layer deposition method under a condition of a substrate temperature higher than or equal to 60° C. and lower than or equal to 140° C.;

processing the inorganic insulating film to form an inorganic insulating layer covering at least the side surface of the first pixel electrode, the side surface of the second pixel electrode, the side surface of the first layer, and the side surface of the second layer;

removing the first sacrificial layer and the second sacrificial layer; and forming a common electrode over the first layer and the second layer.

12. The method for fabricating a display apparatus, according to claim 11, further comprising the steps of:

forming an organic insulating film over the inorganic insulating film;

processing the inorganic insulating film and the organic insulating film to form the inorganic insulating layer and an organic insulating layer over the inorganic insulating layer, so that the inorganic insulating layer and the organic insulating layer cover at least the side surface of the first pixel electrode, the side surface of the second pixel electrode, the side surface of the first layer, and the side surface of the second layer;

removing the first sacrificial layer and the second sacrificial layer; and forming the common electrode over the first layer, the second layer, and the organic insulating layer.

13. The method for fabricating a display apparatus, according to claim 11, further comprising the steps of:

forming a third layer over the first layer and the second layer after the first sacrificial layer and the second sacrificial layer are removed; and forming the common electrode over the third layer.

* * * * *